(12) United States Patent
Utagawa

(10) Patent No.: US 8,120,690 B2
(45) Date of Patent: Feb. 21, 2012

(54) IMAGING DEVICE

(75) Inventor: Ken Utagawa, Yokohama (JP)

(73) Assignee: Nikon Corporation, Tokyo (JP)

( * ) Notice: Subject to any disclaimer, the term of this patent is extended or adjusted under 35 U.S.C. 154(b) by 1886 days.

(21) Appl. No.: 10/656,726

(22) Filed: Sep. 8, 2003

(65) Prior Publication Data

US 2004/0046881 A1 Mar. 11, 2004

Related U.S. Application Data

(63) Continuation-in-part of application No. PCT/JP02/03655, filed on Apr. 12, 2002.

(30) Foreign Application Priority Data

Apr. 12, 2001 (JP) ................................ 2001-113617
Sep. 10, 2002 (JP) ................................ 2002-264401

(51) Int. Cl.
*H04N 5/335* (2006.01)
(52) U.S. Cl. ........................................ 348/315; 348/294
(58) Field of Classification Search .................. None
See application file for complete search history.

(56) References Cited

U.S. PATENT DOCUMENTS

| | | | |
|---|---|---|---|
| 4,558,365 A | 12/1985 | Ochi | |
| 4,799,109 A * | 1/1989 | Esser et al. .................... | 348/324 |
| 4,972,254 A | 11/1990 | Endo et al. | |
| 6,522,356 B1 | 2/2003 | Watanabe | |
| 6,665,010 B1 * | 12/2003 | Morris et al. .................. | 348/297 |
| 6,686,960 B2 * | 2/2004 | Iizuka ............................ | 348/273 |
| 6,717,190 B2 * | 4/2004 | Shizukuishi .................. | 257/232 |
| 6,765,611 B1 * | 7/2004 | Gallagher et al. ......... | 348/222.1 |
| 6,914,633 B1 * | 7/2005 | Yamada ........................ | 348/315 |
| 6,982,751 B1 * | 1/2006 | Tanaka ....................... | 348/220.1 |
| 7,010,172 B1 | 3/2006 | Ito | |
| 7,110,031 B2 * | 9/2006 | Kondo et al. ................. | 348/315 |
| 7,230,646 B2 * | 6/2007 | Glenn ........................... | 348/315 |

FOREIGN PATENT DOCUMENTS

| | | |
|---|---|---|
| JP | A-60-217761 | 10/1985 |
| JP | A-3-119875 | 5/1991 |
| JP | A 5-64082 | 3/1993 |
| JP | A 9-168158 | 6/1997 |
| JP | A-10-178649 | 6/1998 |

(Continued)

OTHER PUBLICATIONS

Tetsuo Yamada et al. "A Progressive Scan CCD Image Sensor for DSC applications", Aug. 8, 2000, Fuji Film Research & Development, No. 46-2001, pp. 82-91.

*Primary Examiner* — Luong T Nguyen
(74) *Attorney, Agent, or Firm* — Oliff & Berridge, PLC

(57) ABSTRACT

An imaging device of the present invention includes a plurality of photosensors arranged in matrix on a light-receiving surface and a readout section for adding up photo signals on the photosensors for external output in each pixel block set on the light-receiving surface. The pixel blocks each consists of N (N≧2) photosensors assembled in an array direction of the matrix and the pixel blocks in even number arrays and those in odd number arrays in the matrix are shifted from each other by half a phase in the array direction. With or without execution of the adding-up operation, it is able to switch a pattern of readout pixels from the imaging device between a grid pattern and a diagonal grid pattern.

10 Claims, 35 Drawing Sheets

FOREIGN PATENT DOCUMENTS

| | | |
|---|---|---|
| JP | A 2000-23171 | 1/2000 |
| JP | A 2000-23172 | 1/2000 |
| JP | A-2000-197066 | 7/2000 |
| JP | A 2001-85664 | 3/2001 |
| JP | A 2001-111027 | 4/2001 |
| JP | A-2001-128069 | 5/2001 |

* cited by examiner

E : EVEN NUMBER ARRAY
O : ODD NUMBER ARRAY

|  | X1 | X2 | X3 | X4 | X5 | X6 | X7 | X8 |
|---|---|---|---|---|---|---|---|---|
| CFA PATTERN 1 | G | G | G | G | R | R | B | B |
| CFA PATTERN 2 | Y | Y | Y | Y | R | R | B | B |
| CFA PATTERN 3 | Cy | Cy | Mg | Mg | G | G | Ye | Ye |
| CFA PATTERN 4 | a1 | a1 | a2 | a2 | a3 | a3 | a4 | a4 |

FIG. 11

[A PATTERN]　　　　　　　　[B PATTERN]

(A) PIXEL SAMPLING POINTS IN GRID IMAGING MODE (B) PIXEL SAMPLING POINTS IN DIAGONAL GRID IMAGING MODE

COLOR FILTER ARRAY

IMAGE BLURRING DIRECTION OF OLPF

APERTURES BY OLPF IN GRID IMAGING MODE

PIXEL PATTERN
IN DIAGONAL GRID IMAGING MODE

IMAGE BLURRING DIRECTION
OF OLPF

APERTURES BY OLPF
IN DIAGONAL GRID IMAGING MODE

PIXEL PATTERN
IN GRID IMAGING MODE
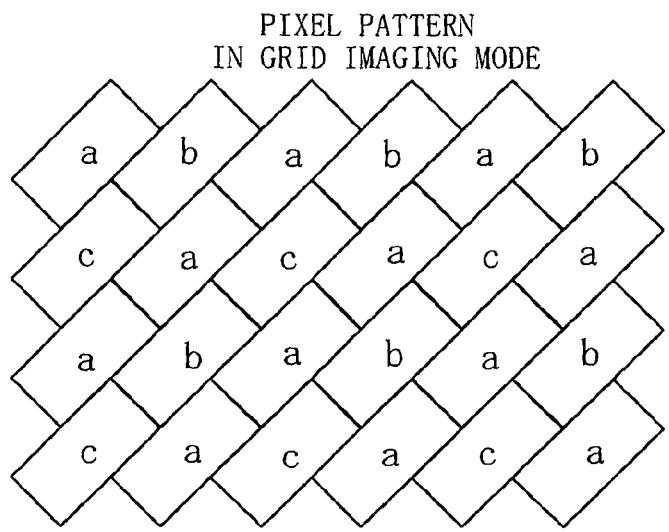
FIG. 31
IMAGE BLURRING DIRECTION OF OLPF
ADDING-UP DIRECTION
APERTURES BY OLPF
IN GRID IMAGING MODE
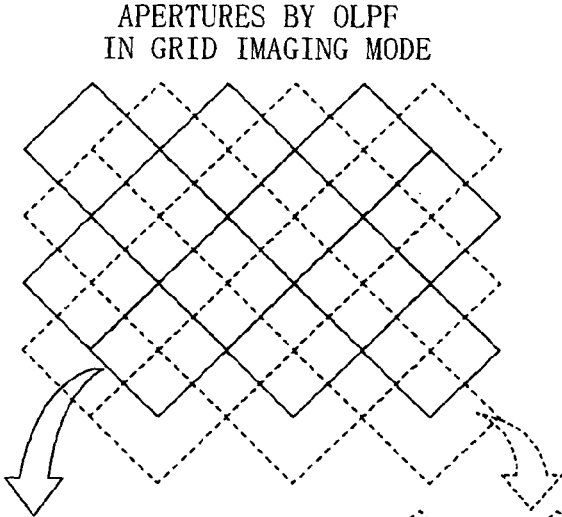
FIG. 32
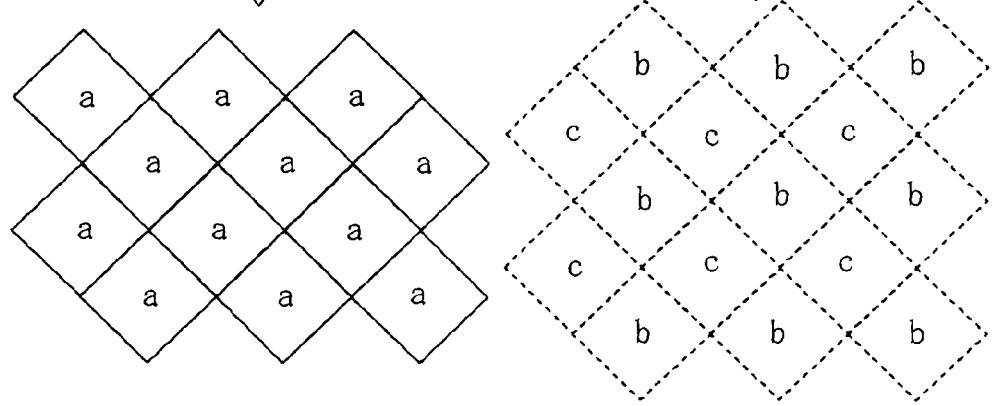

COLOR FILTER ARRAY

IMAGE BLURRING DIRECTION OF OLPF

APERTURES BY OLPF
IN DIAGONAL GRID IMAGING MODE

FOUR COLOR PATTERN 1

(A) GRID IMAGING MODE

| a | d | b | c | a | d | b |
|---|---|---|---|---|---|---|
| a | c | b | d | a | c | b |
| b | c | a | d | b | c | a |
| b | d | a | c | b | d | a |
| a | d | b | c | a | d | b |
| a | c | b | d | a | c | b |

⇐ IMAGE BLURRING DIRECTION OF OLPF (B) DIAGONAL GRID IMAGING MODE

⇕ ADDING-UP DIRECTION

| | d | | c | | d | |
|---|---|---|---|---|---|---|
| a | | b | | a | | b |
| | c | | d | | c | |
| b | | a | | b | | a |
| | d | | c | | d | |
| a | | b | | a | | b |
| | c | | d | | c | |

⇐ IMAGE BLURRING DIRECTION OF OLPF

*FIG. 37*

FOUR COLOR PATTERN 2

(A) GRID IMAGING MODE

| a | d | a | c | a | d | a |
|---|---|---|---|---|---|---|
| a | c | a | d | a | c | a |
| b | c | b | d | b | c | b |
| b | d | b | c | b | d | b |
| a | d | a | c | a | d | a |
| a | c | a | d | a | c | a |

IMAGE BLURRING DIRECTION OF OLPF (B) DIAGONAL GRID IMAGING MODE

ADDING-UP DIRECTION

IMAGE BLURRING DIRECTION OF OLPF

IMAGING DEVICE

CROSS REFERENCE TO RELATED APPLICATION

This application is a continuation-in-part of International Application PCT/JP02/03655, filed Apr. 12, 2002, and designating the U.S, and is based upon and claims the benefit of priority from the prior Japanese Patent Application Nos. 2001-113617, filed Apr. 12, 2001, and 2002-264401, filed Sep. 10, 2002.

BACKGROUND OF THE INVENTION

1. Field of the Invention

The present invention relates to an imaging device having a plurality of photosensors arranged on a light-receiving surface. More particularly, the present invention relates to a technique of changing a pixel pattern of image data read from the light-receiving surface by processing photo signals generated by these photosensors.

2. Description of the Related Art

Recently, image data have been used for diversified purposes in accordance with the wide use of electronic cameras. Appropriate resolution is different depending on each purpose. For example, image data with the highest resolution possible (hereinafter, referred to as "high-resolution data") are required for the purpose of high quality printing, high quality storage, and the like. For general purposes, image data with appropriately low resolution (hereinafter, referred to as "low resolution data") are required in view of the number of frames recordable on a nonvolatile recording medium, and the like.

CONVENTIONAL EXAMPLE A

Electronic cameras having a resolution converting function have been conventionally developed in order to respond to such a demand. FIG. 39 is a block diagram showing an electronic camera of this kind.

In FIG. 39, a lens 92 forms a subject image on a light-receiving surface of an imaging device 93. The imaging device 93 photoelectrically converts this subject image to output analog image data. An A/D converting section 94 digitalizes the image data and thereafter outputs the digitalized image data to a signal processing section 95.

The signal processing section 95 tentatively records the image data in a buffer memory 96 after applying black level correction, tone correction (such as gamma correction), white balance adjustment, and so on to the image data.

An image processing section 97 performs two-dimensional image processing such as color interpolation while fetching the image data in this buffer memory 96. Through these processes, high-resolution data are generated.

Here, when a high-resolution data storage mode is set by a user, a recording section 99 compressedly stores the high-resolution data on a memory card.

When, a low-resolution data storage mode is set by a user, a resolution converting section 98 performs a numerical operation for resolution conversion on this high-resolution data to generate low-resolution data. The recording section 99 compressedly stores the low-resolution data on the memory card.

For generation of the low-resolution data the electronic camera of the conventional example A needs to read from an image sensor photo signals several times as many as the number of pixels ultimately required. This has posed a problem that it takes a long time to transport and read the signals from the image sensor.

In addition, the conventional example A has a problem that the low-resolution conversion has to be conducted outside the image sensor, which accordingly increases the time required for signal processing and the memory capacity used for the signal processing.

CONVENTIONAL EXAMPLE B

As a scanning method of an imaging device, two-line adding interlace scanning has been conventionally well know. The application of this two-line adding interlace scanning also enables the generation of the aforesaid low-resolution data. This operation will be explained below (note that n in the following explanation is a natural number).

① First, photo signals on the $(2n-1)^{th}$ line and photo signals on the $(2n)^{th}$ line are added up in sequence for readout, thereby obtaining an odd number field.

② Next, the photo signals on the $(2n)^{th}$ line and photo signals on the $(2n+1)^{th}$ line are added up in sequence for readout, thereby obtaining an even number field.

③ The odd number field and the even number field are added to obtain photo signals for one screen.

This odd number (or even number) field can be defined as low-resolution data.

Further, it is also possible to generate high-resolution data by synthesizing the odd number field and the even number field.

In the conventional example B, the photo signals corresponding to two adjacent lines are simply synthesized to obtain the photo signals corresponding to one line. In this case, if only the field data are used, the number of vertical pixels is reduced to half uniformly over the entire screen. Therefore, there has been a problem of great deterioration in visual sharpness in such a transport operation.

Moreover, in the conventional example B, the exposure timing is different between the odd number filed and the even number filed. Therefore, there has been a problem of blurring (shifting) of the image of a moving subject when both fields are synthesized to form a high-resolution still image.

[Conventional Art C]

A draft mode has been conventionally well known as a function imparted to an image sensor mounted in an electronic camera. In this draft mode, photo signals are thinned out in a row direction for read out. As a result, the reduction in the time required for image read out is made possible. Such a draft mode is disclosed in detail, for example, in Japanese Unexamined Patent Application Publication No. 2002-125145.

In the draft mode of an electronic camera, images with smooth motion can be easily displayed on the monitor by updating display of images obtained quickly (hereinafter, referred to as "draft images") on the monitor at the back. Further, the electronic camera can realize AF (automatic focus control) and AE (automatic exposure) with enhanced follow-up performance with easiness by determining contrast and brightness of a subject from the draft images obtained at a short time interval.

However, the images generated in the draft mode conspicuously lack in data because of too simple thinning-out pattern in the row direction. Consequently, the generated images therein do not have sufficient sharpness and detailed expression, therefore, are not suitable for an appreciation purpose.

SUMMARY OF THE INVENTION

In view of the problems stated above, an object of the present invention is to provide an imaging device capable of reading out high-quality low-resolution data.

Another object of the present invention relates to a technique of changing a pixel pattern of image data from a grid pattern to a diagonal grid pattern in the process of generating the high-quality low-resolution data.

Still another object of the present invention relates to a technique of changing a pixel pattern of image data from a diagonal grid pattern to a grid pattern in the process of generating this high-quality low-resolution data.

Hereinafter, the present invention will be explained.

(A)

An imaging device of the present invention includes a plurality of photosensors and a readout section. The photosensors are arranged in matrix on a light-receiving surface of the imaging device, and generate photo signals according to an amount of received light. The readout section adds up the generated photo signals in advance for external output in each pixel block set on the light-receiving surface. Note that the pixel blocks here are each constituted of N (N≧2) photosensors assembled in an array direction of the matrix. Further, the pixel blocks in an even number array and those in an odd number array of the matrix are shifted in phase by half a phase in the array direction.

(B)

Preferably, the readout section has transfer gates, vertical paths, and a horizontal path. The transfer gates transfer the photo signals from the photosensors to the vertical paths. The photo signals transferred via the transfer gates are vertically transported in the array direction through the vertical paths. The photo signals transported and outputted from the vertical paths are horizontally transported through the horizontal path. Particularly, these transfer gates transfer the photo signals in the even number arrays and the photo signals in the odd number arrays in staggered directions. Such transfer gates allows the pixel blocks with the half-phase shift to be aligned in the same phase on the vertical paths.

(C)

Further, the readout section preferably has vertical paths and a horizontal path. The photo signals generated by the photosensors are vertically transported in the array direction through the vertical paths, and the photo signals transported and outputted from the vertical paths are horizontally transported through the horizontal path. Particularly, the vertical paths in the even number arrays and those in the odd number arrays have a different number of segments. The difference in the number of the segments allows the pixel blocks in the both arrays with the half-phase shift to be aligned in the same phase on the horizontal path.

(D)

More preferably, the readout section has vertical paths having polyphase transport electrodes, and a horizontal path. Through the vertical paths the photo signals generated by the photosensors are vertically transported in the array direction by transport pulses applied to the polyphase transport electrodes. Through the horizontal path the photo signals transported and outputted from the vertical paths are horizontally transported. Particularly, the transport electrodes in the odd number arrays and those in the even number arrays are shifted in wiring pattern. Shifting the wiring pattern between the odd number arrays and the even number arrays allows the pixel blocks with the half-phase shift to be aligned in the same phase on the vertical paths. Also preferably, the transport electrodes are formed in a wiring pattern to connect the photosensors shifted by half a phase of the pixel block in the odd number arrays and in the even number arrays.

(E)

The readout section preferably adds up the photo signals in each of the pixel blocks on at least either of the vertical paths and the horizontal path.

(F)

The readout section preferably has vertical paths and a horizontal path. Through the vertical paths the photo signals generated by the photosensors are vertically transported. The photo signals transported and outputted from the vertical paths are horizontally transported from the horizontal path. In this case, the half-phase shifting direction (that is the array direction) of the pixel blocks is a direction substantially perpendicular to the transport direction of the vertical paths. It is particularly preferable that the photo signals are added up in each pixel block on the horizontal path or at output of the horizontal path.

(G)

Another imaging device of the present invention includes a plurality of photosensors and a readout section. The photosensors are arranged in matrix diagonally to horizontal and vertical directions on a light-receiving surface. The photosensors generate photo signals according to an amount of received light. The readout section adds up the generated photo signals for external output in each pixel block set on the light-receiving surface. In this case, the pixel blocks each consist of N (N≧2) photosensors assembled in an array direction of the matrix.

(H)

The imaging device preferably further includes a color filter array disposed on the light-receiving surface such that the photosensors in each pixel block have the same color. In this case, it is more preferable that a first color is arranged on every pixel block in either of the even number arrays and the odd number arrays of the matrix, and second and third colors are arranged alternately on the pixel blocks in the other of the even number arrays and the odd number arrays.

(I)

Preferably, the readout section is able to select a high-resolution transport mode in which the photo signals are read out individually from the photosensors without being added up.

(J)

Still another imaging device of the present invention includes a plurality of photosensors and a readout section. The photosensors are two-dimensionally arranged on a light-receiving surface, and generate photo signals according to an amount of received light. The readout section reads out the photo signals generated by the photosensors. Particularly, this readout section selectively has a grid imaging mode and a diagonal grid imaging mode. In this grid imaging mode, the readout section reads out the photo signals generated on the light-receiving surface at each sampling point in a grid pattern. In the diagonal grid imaging mode, the readout section reads out the photo signals generated on the light-receiving surface at each sampling point in a diagonal grid pattern.

(K)

For example, the photosensors are arranged in a grid pattern on the light-receiving surface. In this case, executing the diagonal grid imaging mode, the readout section adds up the generated photo signals for readout in each of areas around crosspoints of the diagonal grid pattern.

(L)

In addition, the photosensors are arranged in a diagonal grid pattern on the light-receiving surface. In this case, executing the grid imaging mode, the readout section adds up the generated photo signals for readout in each of areas around crosspoints of the grid pattern.

(M)

The imaging device preferably further includes an optical low pass filter disposed on the light-receiving surface. The optical low pass filter blurs an optical image in a direction substantially perpendicular to an adding-up direction of the photo signals.

(N)

For example, the imaging device further includes a color filter array disposed on the light-receiving surface such that the photosensors in each unit of the adding-up of the photo signals substantially have the same color.

(O)

Alternatively, the imaging device further includes a color filter array disposed on the light-receiving surface such that the photosensors in each unit of adding-up of the photo signals have different colors from each other.

(P)

The imaging device preferably further includes an image processing section that applies interpolation to outputs read out in the diagonal grid imaging mode to generate image data having a grid pixel pattern.

(Q)

Preferably, the readout section selectively has the grid imaging mode and the diagonal grid imaging mode and includes a plurality of vertical CCDs, first horizontal transport parts, and second horizontal transport parts. The vertical CCDs are provided between arrays of the plurality of photosensors in a vertical direction on the light-receiving surface. The vertical CCDs transport the photo signals on the photosensors in the vertical direction. The first horizontal transport parts are provided at one ends of the vertical CCDs. The second horizontal transport parts are provided at the other (opposite) ends of the vertical CCDs. The first horizontal transport parts horizontally transport the photo signals outputted from the one ends of the vertical CCDs. The second horizontal transport parts horizontally transport the photo signals outputted from the other ends of the vertical CCDs. In this structure, the vertical CCDs have two transport electrodes for each of the photosensors. Further, every two pairs of the transport electrodes for the photosensors adjacent to each other in a horizontal direction electrically have crosswise connection to each other.

(R)

Yet another imaging device of the present invention includes a plurality of photosensors, a plurality of vertical CCDs, first horizontal transport parts, and second horizontal transport parts. The photosensors are two-dimensionally arranged on a light-receiving surface and generate photo signals according to an amount of received light. The vertical CCDs are provided between arrays of the plural photosensors in a vertical direction on the light-receiving surface. The vertical CCDs transport the photo signals outputted from the photosensors in the vertical direction. The first horizontal transport parts are provided at one ends of the vertical CCDs, and horizontally transport the photo signals outputted from the one ends of the vertical CCDs. The second horizontal transport parts are provided at the other (opposite) ends of these vertical CCDs, and horizontally transport the photo signals outputted from the other ends of the vertical CCDs. In this structure, the vertical CCDs have two transport electrodes for each of the photosensors. Further, every two pairs of the transport electrodes for the photosensors adjacent to each other in a horizontal direction electrically have crosswise connection to each other.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 11 is a view showing still another example of preferable arrangement of the color filters X1 to X8;

FIG. 31 is a view showing a color pattern of synthesized signals read out in the grid imaging mode;

FIG. 32 is a view showing apertures in the grid imaging mode;

FIG. 37A and FIG. 37B are views showing examples of a four-color pattern;

DESCRIPTION OF THE PREFERRED EMBODIMENTS

Hereinafter, embodiments of the present invention will be explained in detail with reference to the drawings.

First Embodiment

Figure 1:
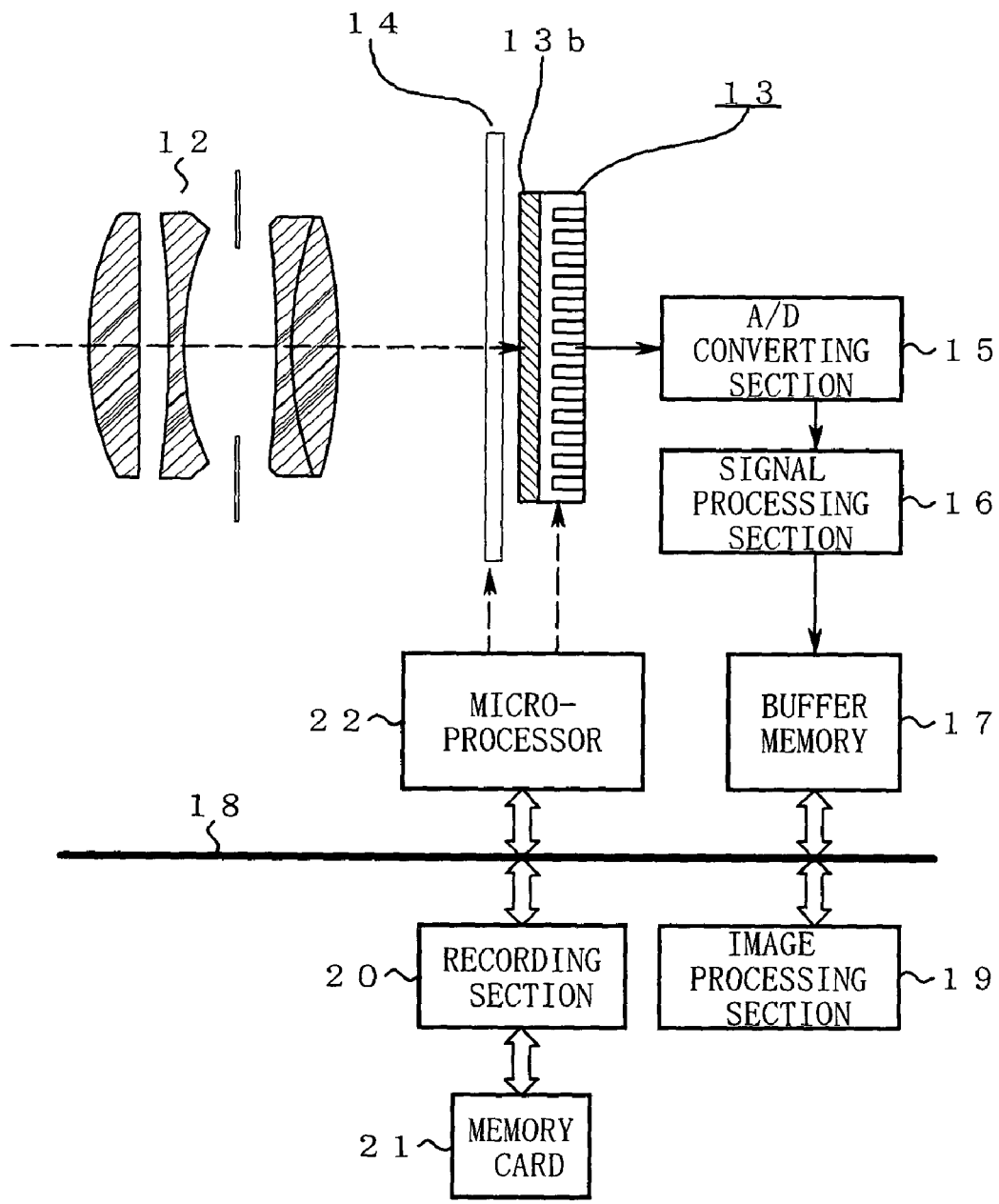
FIG. 1 is a block diagram showing the schematic configuration of an electronic camera 1.

FIG. 1 is a block diagram showing the schematic configuration of an electronic camera 111 according to a first embodiment.

In FIG. 1, a lens 12 is fitted to an electronic camera 11. A mechanical shutter 14 and an imaging device 13 are arranged on an image space side of this lens 12 along an optical axis. An optical low pass filter (OLPF) 13b is disposed on a light-receiving surface of this imaging device 13. An output of this imaging device 13 is connected to a bus 18 via an A/D converting section 15, a signal processing section 16, and a buffer memory 17. An image processing section 19, a recording section 20, a microprocessor 22, and so on are connected to this bus 18. This microprocessor 22 controls the aforesaid mechanical shutter 14, imaging device 13, image processing section 19, recording section 20, and so on.

Figure 2:
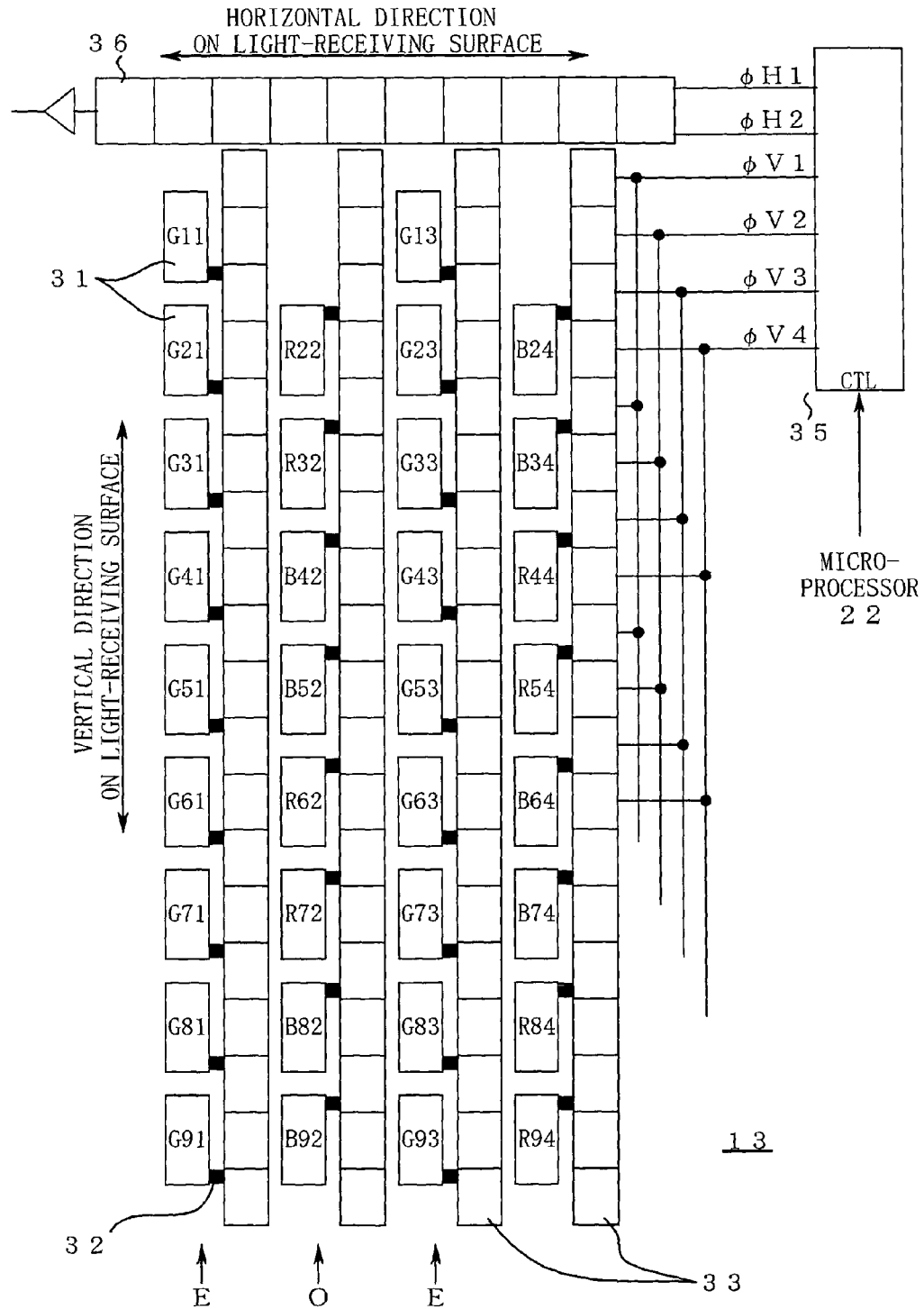
FIG. 2 is a view showing the structure of an imaging device 13.

FIG. 2 is a view showing the imaging device 13 mentioned above. This imaging device 13 is an imaging device utilizing an interline transport method.

In FIG. 2, a plurality of photosensors 31 are arranged in a matrix pattern on the light-receiving surface of the imaging device 13. On-chip micro lenses (not shown) are disposed on the respective photosensors 31.

Further, color filters are interposed between the on-chip microlenses and the photosensors 31. FIG. 2 shows the arrangement of the photosensors and the arrangement of colors (denoted by the reference symbols such as RGB) of the color filters allotted to the respective photosensors. Specifically, the color filters in color G are continuously arranged on the photosensors 31 in even number arrays. In odd number arrays, colors R and colors B are alternately arranged on the photosensors 31 in each pixel block which will be discussed later. As shown in FIG. 2, the colors R and the colors B are preferably counterchanged in position between the odd number arrays adjacent to each other.

The optical LPF 13b to blur an optical image in a horizontal direction (including the case of forming a multiple image) on the light-receiving surface is disposed on the light-receiving surface described above. The optical LPF 13b is so adjusted that the distance by which the optical image is blurred is substantially equal to a horizontal distance between the photosensors 31.

Vertical CCDs 33 are provided between the arrays of such photosensors 31 respectively. Each of the vertical CCDs 33 is constituted of an array of a plurality of segments. Four-phase transport electrodes $\phi V1$ to $\phi V4$ are provided for these segments. A control circuit 35 applies control voltages to these transport electrodes $\phi V1$ to $\phi V4$.

Further, transfer gates 32 are provided between the photosensors 31 and the vertical CCDs 33. The transfer gates 32 are so arranged that their positions in the even number arrays are deviated from those in the odd number arrays. Specifically, in FIG. 2, the transfer gates 32 in the even number arrays are disposed at lower parts on a right side of the photosensors 31. The transfer gates 32 in the odd number arrays are disposed at upper parts on a right side of the photosensors 31. The transport electrodes $\phi V1$ and $\phi V3$ extend to these transfer gates 32. The control circuit 35 applies voltages exceeding a threshold voltage to these transport electrodes $\phi V1$ and $\phi V3$ to transfer photo signals from the photosensors 31 to the vertical CCDs 33.

At ends of the vertical CCDs 33, horizontal CCDs 36 are provided. Two-phase transport electrodes $\phi H1$ and $\phi H2$ are provided for the horizontal CCDs 36. The control circuit 35 applies control voltages to these transport electrodes $\phi H1$ and $\phi H2$.

[Relationship with Claims]

The relationship between matters recited in the claims and this embodiment will be explained below. It should be noted that the correspondence relationship here only presents an example of interpretation for the purpose of reference, and is not to be considered as limiting the present invention more than necessary.

Photosensors recited in the claims correspond to the photosensors 31.

A readout section recited in the claims corresponds to the transfer gates 32, the vertical CCDs 33, the horizontal CCDs 36, and the control circuit 35.

Transfer gates recited in the claims correspond to the transfer gates 32.

Vertical paths recited in the claims correspond to the vertical CCDs 33.

A Horizontal path recited in the claims corresponds to the horizontal CCD 36.

A color pattern of a color filter array recited in the claims is that shown in FIG. 2.

A first color recited in the claims corresponds to color G.

A second color recited in the claims corresponds to color R.

A third color recited in the claims corresponds to color B.

An optical low pass filter recited in the claims corresponds to an optical LPF 13b.

[Explanation on Operation of Low-Resolution Transport Mode]

Hereinafter, the operation of a low-resolution transport mode in the first embodiment will be explained.

First, the microprocessor 22 opens/closes the mechanical shutter 14 so that a subject image is projected on the light-receiving surface of the imaging device 13. Immediately after the mechanical shutter 14 is fully opened, the microprocessor 22 outputs an exposure start signal to the control circuit 35 in the imaging device 13. The control circuit 35 resets (discharges unnecessary charges) on the photosensors 31, according to this exposure start signal. On the photosensors 31 thus reset, the accumulation of photo signals (signal charges and so on) according to the subject image is newly started.

When a predetermined exposure period has passed, the microprocessor 22 outputs a transport control signal of the low-resolution transport mode to the control circuit 35 in the imaging device 13.

Figure 3:
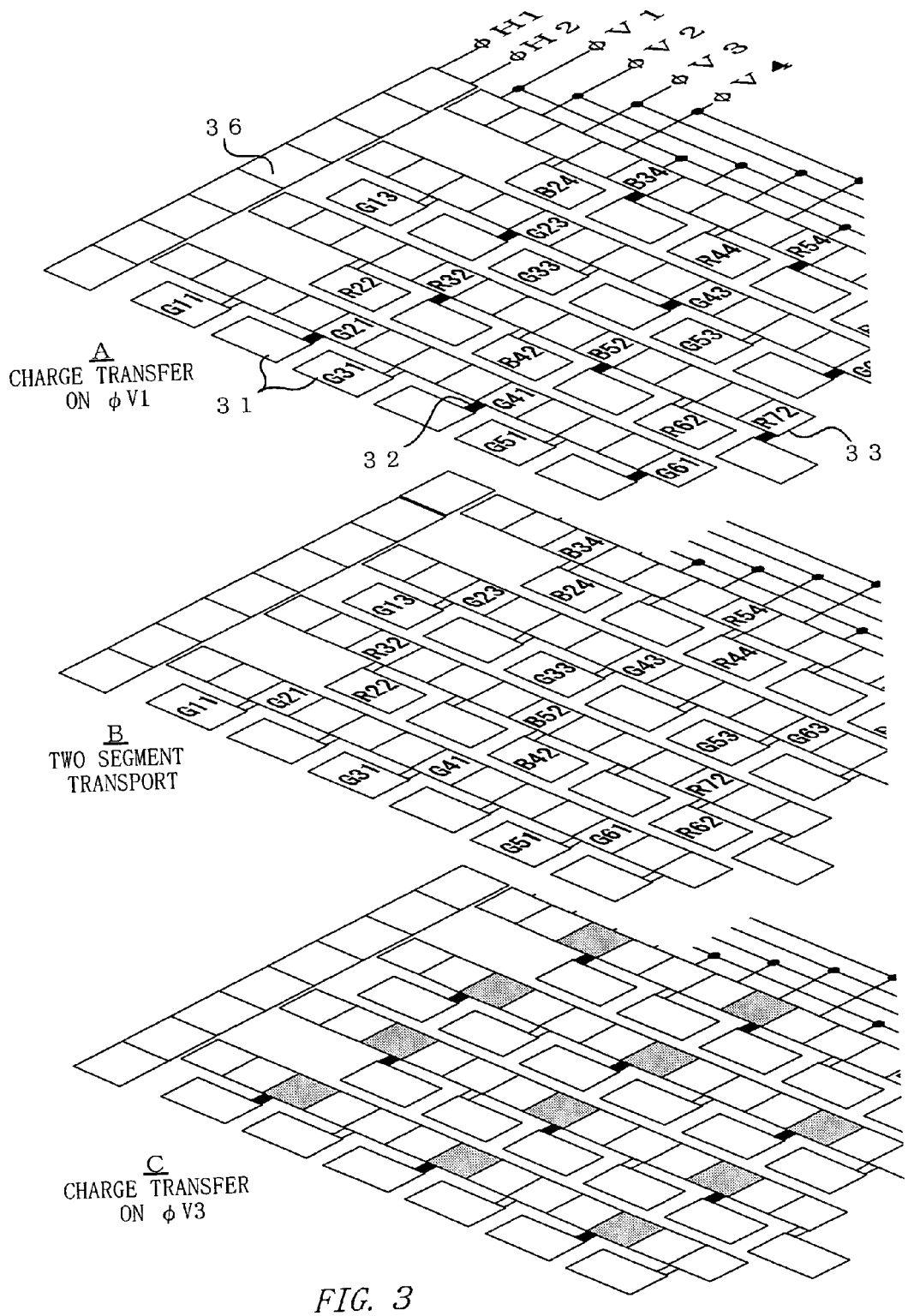
FIG. 3A, FIG. 3B, and FIG. 3C are views explaining the operation of a low-resolution transport mode.

FIG. 3A to FIG. 3C are views showing the operation of the imaging device 13 in this low-resolution transport mode.

First, the control circuit 35 applies voltages exceeding a threshold voltage to the transport electrodes $\phi$V1. Accordingly, the photo signals (G21, R32, G23, B34, G41, B52, G43, R54, and so on shown in FIG. 3A) on the photosensors 31 are transferred to the segments of the transport electrodes $\phi$V1 via the transfer gates 32. The operation up to this step is shown in FIG. 3A.

In this state, the control circuit 35 applies four-phase transport pulses to the transport electrodes $\phi$V1 to $\phi$V4 to transport the photo signals corresponding to two segments on the vertical CCDs 33. The operation up to this step is shown in FIG. 3B.

Next, the control circuit 35 applies voltages exceeding the threshold voltage to the transport electrodes $\phi$V3. Then, the photo signals (G11, R22, G13, B24, G31, B42, G33, R44, and so on shown in FIG. 3B) on the photosensors 31 are transferred to the segments of the transport electrodes $\phi$V3 via the transfer gates 32. Through such operations, (G11+G21), (R22+R32), (G13+G23), (B24+B34), and soon are generated on the segments of the transport electrodes $\phi$V3 as the results of adding the photo signals up. The operation up to this step is shown in FIG. 3C.

In this state, the control circuit 35 applies four-phase transport pulses to the transport electrodes $\phi$V1 to $\phi$V4 in sequence to vertically transport the adding-up results corresponding to one row on the vertical CCDs 33 to the horizontal CCDs 36. The control circuit 35 applies two-phase transport pulses to the transport electrodes $\phi$H1 and $\phi$H2 in sequence to horizontally transport the adding-up results corresponding to one row on the horizontal CCDs 36 to an exterior. Through the alternate repetition of such vertical transport and horizontal transport, the results of adding the photo signals are read out to the exterior as low-resolution data for one screen.

This low-resolution data are gain-adjusted and digitalized in the A/D converting section 15. The low-resolution data thus digitalized are subjected to signal processing such as tone correction and white balance adjustment in the signal processing section 16 substantially in real time when necessary, and thereafter, tentatively recorded in the buffer memory 17.

The image processing section 19, while fetching the low-resolution data in this buffer memory 17 via the bus 18 at each processing, subjects the low-resolution data to two-dimensional image processing such as color interpolation. The processed low-resolution data are compressedly stored on a memory card 21 via the recording section 20.

[Features of Low-Resolution Transport Mode]

Figure 4:
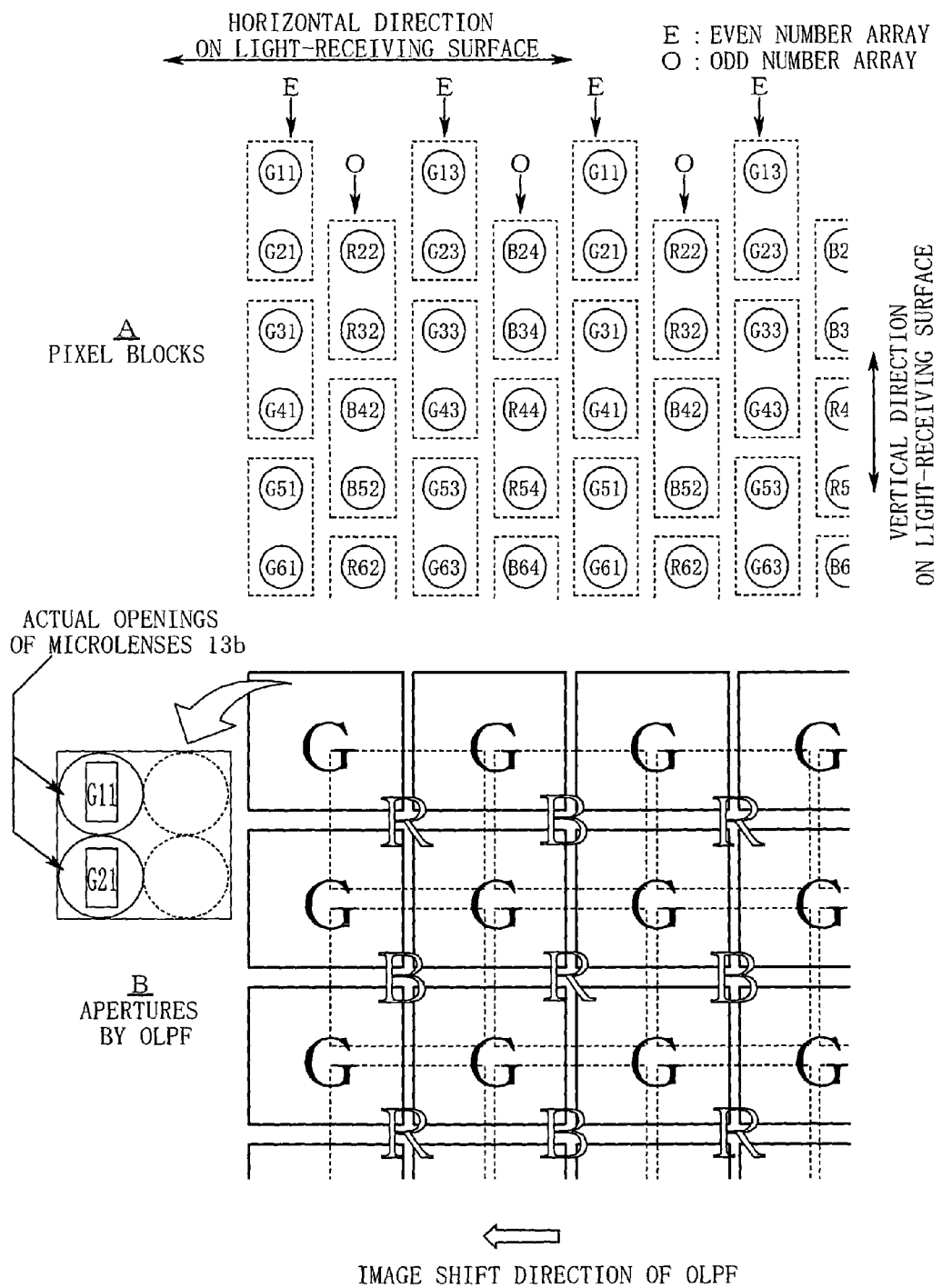
FIG. 4A and FIG. 4B are views showing pixel blocks and apertures in the low-resolution transport mode.

FIG. 4A is a view showing areas in which the photo signals are added up in the above-described operation as pixel blocks (dotted line squares in the drawing) on the light-receiving surface. As shown in this drawing, each pixel block is constituted of two photosensors 31 assembled in an array direction of the matrix pattern. The pixel blocks in the even number arrays and those in the odd number arrays are displaced from each other by half a phase in the arrays direction. In the present invention, the displacement does not have to be numerically half a phase in strict meaning, but may be half a phase within a practical range (for example, a range in which a visual effect such as sharpness improvement is obtainable).

The pixel blocks are thus set, so that a signal charge amount per pixel is increased to a signal charge amount for two photosensors. Consequently, the imaging device 13 in the low-resolution transport mode has less noise as the number of times of readout decreases than in the case of reading signals from the photosensors 31 one by one for adding-up on an external memory, which results in obtaining image data excellent in S/N.

Further, the readout time of the image sensor is reduced to half of that required in the case when the photo signals are added up through an arithmetic operation after all the pixels are read out. This means that this low-resolution transport mode is also a high-speed mode. Therefore, in the low-resolution transport mode, the frame speed of camera photographing can be substantially doubled compared with the frame speed when all the pixels are read out.

Moreover, the pixel blocks are so set that the pixel blocks in the even number arrays and those in the odd number arrays are displaced to each other by half a phase. Such phase displacement enables the compensation for sharpness deterioration in the array direction. Accordingly, the imaging device 13 in the low-resolution transport mode can capture image data with excellent.

This phase displacement of the pixel blocks is eliminated by the displacement of the transfer gates 32 as shown in FIG. 2, so that the pixel blocks are aligned in the same phase on the vertical CCDs 33. Therefore, in transporting the photo signals, there is no need to take the phase displacement of the pixel blocks into consideration, so that the transport sequence of the photo signals can be simplified.

Incidentally, apertures (ranges of incident lights) of the pixel blocks are enlarged by image shift effect caused by the optical LPF 13b. FIG. 4B is a view showing the apertures of the pixel blocks.

In this drawing, a synthesized signal (for example, G11+G21) is generated from incident lights on two microlenses disposed right above the photosensors 31.

The lights subjected to image shift by the optical LPF 13b are incident on these two microlenses. As a result, the superimposed lights from right above (two solid-line circles shown in FIG. 4B) and from a shift direction (two dotted-line circles shown in FIG. 4B) are incident on these two microlenses.

By this operation, an equivalent aperture of each synthesized signal is enlarged to an opening region corresponding to 2×2 microlenses shown in FIG. 4B, resulting in an aperture substantially in a square shape.

At this time, the equivalent apertures of the colors G cover the entire light-receiving surface, leaving almost no space uncovered. Meanwhile, the equivalent apertures of the colors R and the colors B cover the light-receiving surface in a checkered pattern. Further, the equivalent apertures of the colors R and the colors B are displaced from the equivalent apertures of the colors G by half a phase in horizontal and vertical directions.

The color pattern of the equivalent apertures shown in FIG. 4B is substantially equal to a pixel pattern of a two-board type imaging device (in which an image sensor in color G and an imaging device in an RB checkered pattern are arranged with pixel displacement). This color pattern of the equivalent apertures is equal to a diagonally turned bayer pattern (by 45° here), but the equivalent apertures are larger than those of the bayer pattern of a single-board type image sensor as shown in FIG. 4B. Consequently, pseudo signals are sufficiently reduced only with the optical LPF 13b in a single direction.

Generally, the single-board type image sensor having the bayer pattern requires an optical LPF that shifts images in vertical and horizontal directions in order to eliminate pseudo colors. This increases the thickness of the optical LPF, which causes problems such as deterioration of aberration performance of an optical system and necessity for a large space.

In the structure of this embodiment, on the other hand, it is only necessary to use the optical LPF 13b that shifts images only in a single direction. This can reduce the thickness of the optical LPF in this embodiment compared with the case when images are shifted in a plurality of directions in the single-board type image sensor having the bayer pattern. As a result, the problems such as the deterioration of aberration performance of the optical system and the necessity for a large space can be overcome. The simplification of the optical LPF leads to advantages in terms of cost.

The color pattern shown in FIG. 4B is also equal to a color pattern formed by turning the bayer pattern by 45°. Therefore, it is possible to execute the color interpolation for the bayer pattern turned by 45° in the image processing section 19.

[Explanation on Operation of High-Resolution Transport Mode]

Next, the operation of a high-resolution transport mode in the first embodiment will be explained.

In this mode, the photo signals on the photosensors 31 are individually read out without adding-up. In the imaging device 13, four-phase segments are provided for the two adjacent photosensors 31. Therefore, in the high-resolution transport mode of this embodiment, interlace transport (a transport method for reading out the photo signals at twice for a first field and a second field) is executed in order to read out the photo signals individually. In order to synchronize the exposure timing for the first field and that for the second field in this interlace transport, an exposure amount is controlled by the mechanical shutter 14 in the high-resolution transport mode of this embodiment.

The operation of this high-resolution operation mode will be explained in detail below.

First, the microprocessor 22 outputs an accumulation start signal to the control circuit 35 in the imaging device 13. The control circuit 35 resets the photosensors 31 (discharges unnecessary charges), according to this accumulation start signal. This reset operation causes the photosensors 31 to get ready for the accumulation of signal charges according to a subject image.

The microprocessor 22 controls the opening/closing of the mechanical shutter 14 in this state. This opening/closing control of the mechanical shutter 14 substantially determines an exposure period of the imaging device 13 and realizes the aforesaid synchronization of the exposure timing of the first field with that of the second field.

After the mechanical shutter 14 is closed, the microprocessor 22 outputs a transport control signal of the high-resolution transport mode to the control circuit 35 in the imaging device 13. The control circuit 35 applies voltages exceeding a threshold voltage to the transport electrodes φV1, according to this transport control signal. Accordingly, the photo signals (G21, R32, G23, B34, G41, B52, G43, R54, and so on shown in FIG. 2) on the photosensors 31 are transferred to the segments of the transport electrodes φV1 via the transfer gates 32. Here, the control circuit 35 drives the vertical CCDs 33 and the horizontal CCDs 36 to read out the photo signals on the vertical CCDs 33 in sequence. Through such a transport operation, image data of the first field are first transferred. The image data of the first field, after being processed through the A/D converting section 15 and the signal processing section 16, are tentatively recorded in the buffer memory 17.

Next, the control circuit 35 also executes a similar image data (G11, R22, G13, B24, G31, B42, G33, R44, and so on shown in FIG. 2) readout for the second field.

Through such interlace transport, the image data for one screen are accumulated in the buffer memory 17 by two separate transport operations.

The image processing section 19, while fetching the image data in the buffer memory 17 via the bus 18, subjects the image data to two-dimensional image processing such as color interpolation. The processed image data are compressedly stored on the memory card 21 via the recording section 20.

[Features of High-Resolution Transport Mode]

Figure 5:
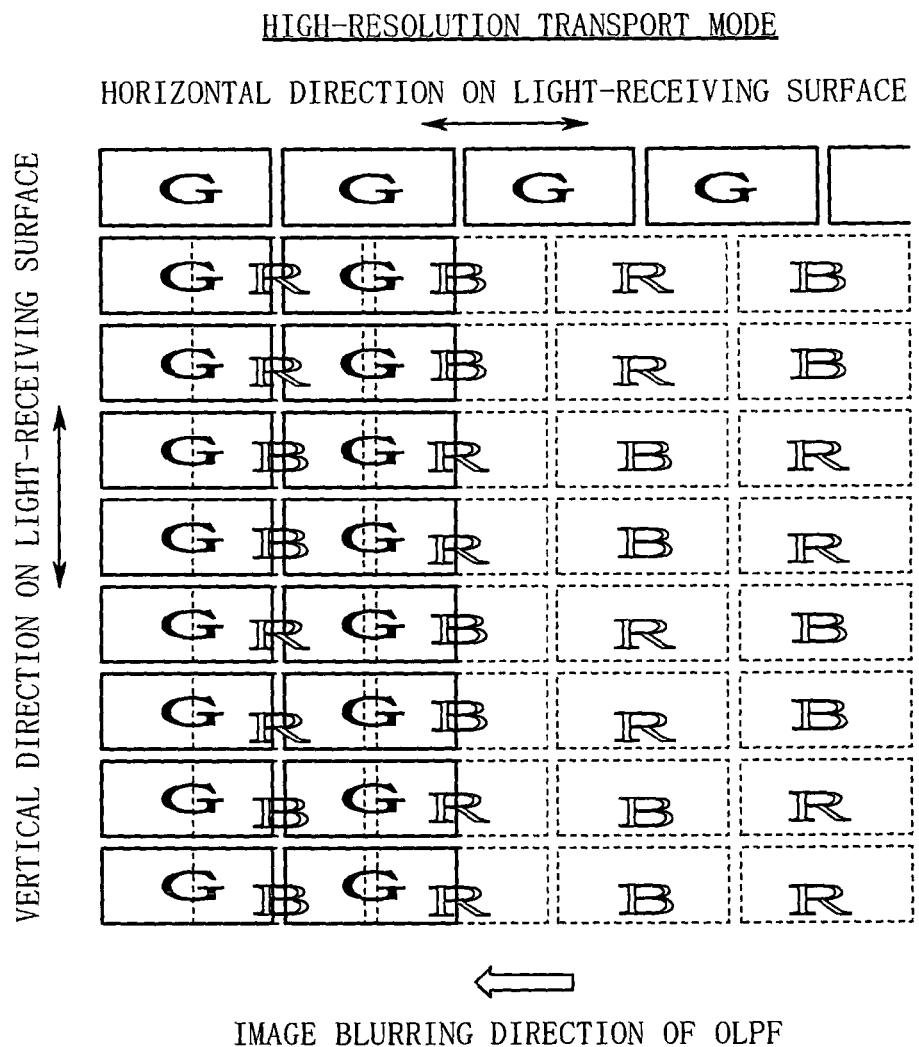
FIG. 5 is a view showing apertures in a high-resolution transport mode.

FIG. 5 is a view showing equivalent apertures of pixels (including the effect of the optical LPF) in the high-resolution transport mode.

As shown in FIG. 5, in the high-resolution transport mode, vertical resolution of single G is doubled compared with that in the low-resolution transport mode. Consequently, minute structures of images can be captured with enhanced definition in the imaging device 13 in the high-resolution transport mode.

Note that in the above-described low-resolution transport mode, substantially progressive transport operation is performed to enable the image capturing operation only with an electronic shutter function, and therefore, the mechanical shutter 14 is not always required. However, it is preferable to use the mechanical shutter 14 as an auxiliary light-shielding means for preventing excessive light from entering the segments. (Needless to say that such a structure may be adopted that the opening/closing operation of the mechanical shutter 14 is inserted between the opening/closing operations of the electronic shutter so that the mechanical shutter 14 controls the exposure).

On the other hand, the interlace transport operation is performed in the above high-resolution transport mode. In this case, the exposure completion time of the images of the two fields can be made coincident by closing the mechanical shutter 14 immediately after the exposure period has passed.

When a focal plane shutter is closed just in front of the light-receiving surface, there arises a problem of variance in exposure amount depending on the position on the screen. In this case, it is preferable that the focal plane shutter is opened after the accumulation is started as described above, thereby eliminating the variance in exposure amount depending on the position on the screen.

Figure 14:
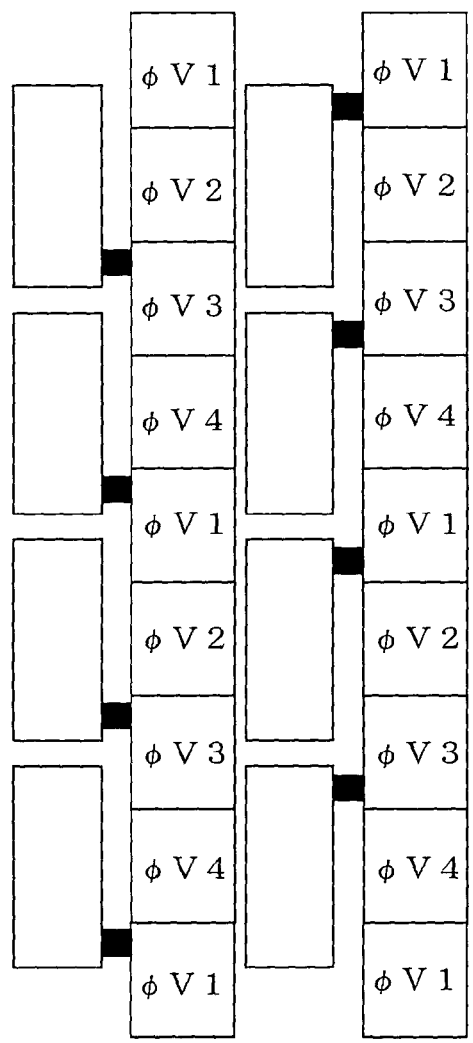
FIG. 14 is a view showing an arrangement example of transfer gates.
Figure 14:
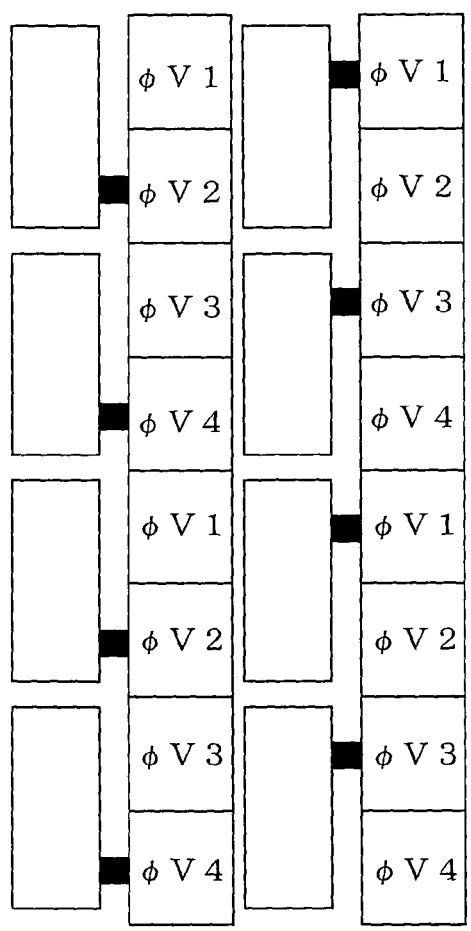

In the above-described first embodiment, the transfer gates 32 are cyclically arranged at the first phases and the third phases of the vertical CCDs 33 with displaced in a unit of array, as shown in A pattern in FIG. 14. However, the present invention is not limited to this arrangement.

For example, as shown in B pattern in FIG. 14, it is possible to cyclically arrange the transfer gates 32 at the second phases and the fourth phases of the vertical CCDs 33 in the even number arrays (or the odd number arrays) and to cyclically arrange the transfer gates 32 at the first phases and the third phases of the vertical CCDs 33 in the odd number arrays (or the even number arrays). In this case, the transport operation in the low-resolution transport mode is preferably executed through the following procedure ① to ④.

① Apply the transfer voltages to the transport electrodes φV1 and φV4 simultaneously, so that the photo signals are transferred to potential wells connecting the first phases and the fourth phases of the vertical CCDs 33.

② Vertically transport two segments of each of the vertical CCDs 33.

③ Apply the transfer voltages to the transport electrodes φV2 and φV3 simultaneously, so that the photo signals are transferred to potential wells connecting the second phases and the third phases of the vertical CCDs 33. At this point, the photo signals are added up and synthesized on the potential wells in a unit of pixel block.

④ Transport the synthesized signals on the vertical CCDs 33 in sequence for external readout.

As described above, in the transfer gate arrangement of the B pattern, it is possible to eliminate the half-phase displacement of the pixel blocks and align the pixel blocks in the same phase on the vertical CCDs 33.

Next, another embodiment will be explained.

Second Embodiment

Figure 6:
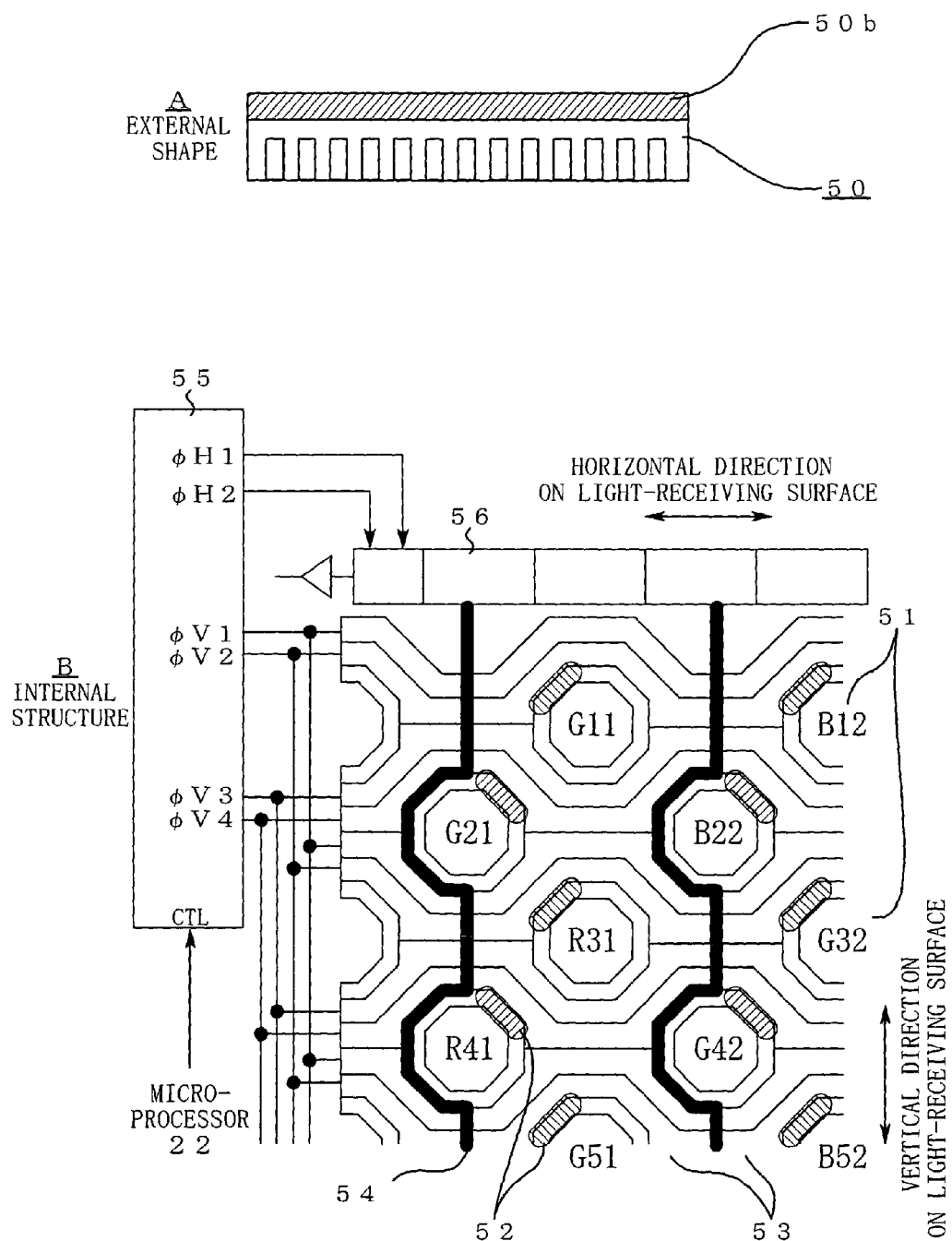
FIG. 6A and FIG. 6B are views showing the structure of an imaging device 50.

The feature of an electronic camera in a second embodiment is that the imaging device 13 shown in FIG. 1 is replaced by an imaging device 50 shown in FIG. 6A and FIG. 6B. The configuration of the electronic camera in other respects is the same as that of the first embodiment, and therefore, the explanation thereof will be omitted here.

FIG. 6A is an external view of the imaging device 50.

FIG. 6B is a view showing the internal structure of this imaging device 50.

Figure 7:
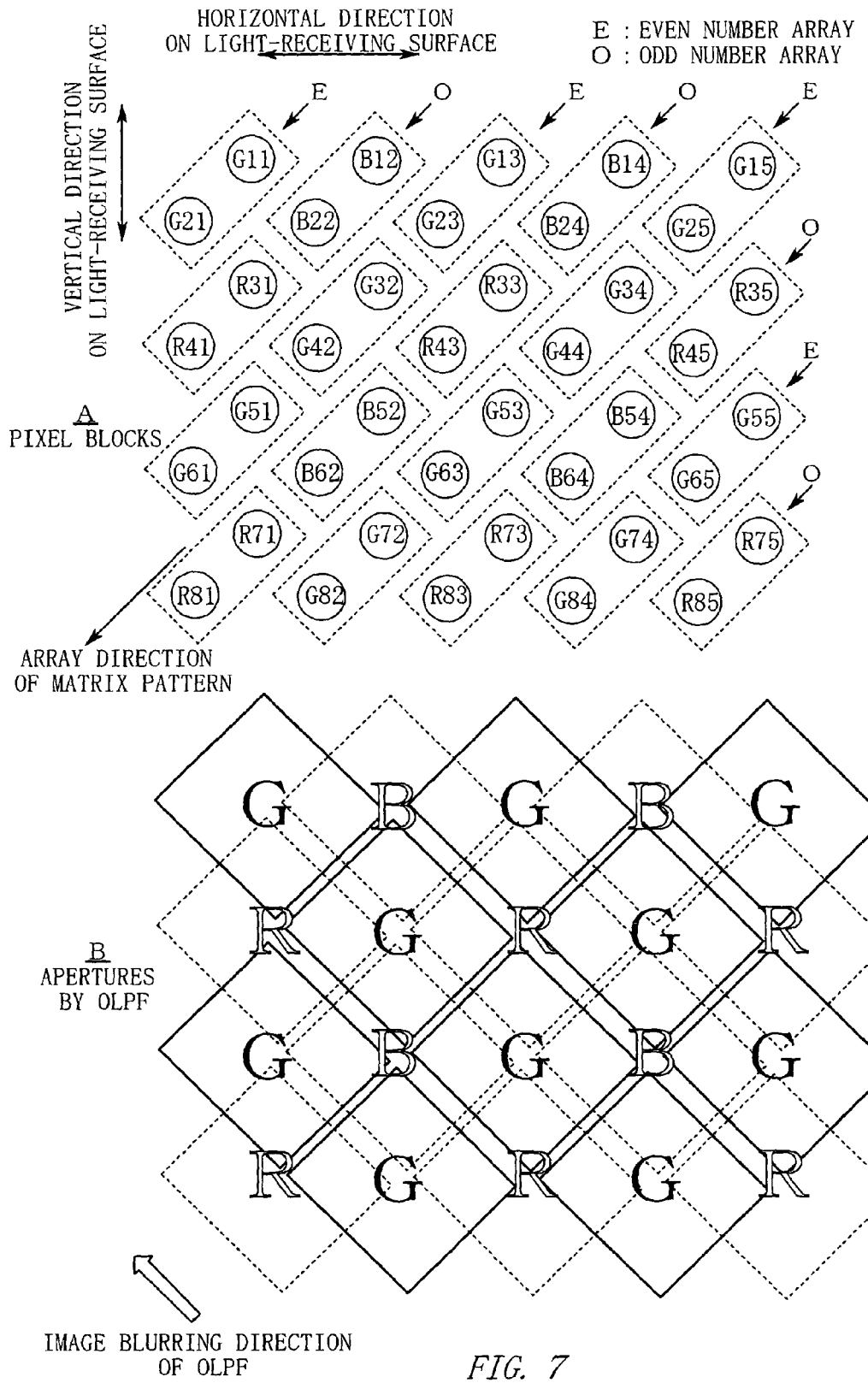
FIG. 7A and FIG. 7B are views showing pixel blocks and apertures in a low-resolution transport mode.

As shown in FIG. 6B, photosensors 51 are disposed on a light-receiving surface of the imaging device 50 in a skewed matrix pattern. On-chip microlenses (not shown) are disposed on the respective photosensors 51. A color filter array in a color pattern shown in FIG. 7A is interposed between the on-chip microlenses and the photosensors 51. (Specifically, color filters in color G are continuously arranged in even number arrays of the matrix pattern. In odd number arrays, colors R and colors B are alternately arranged in a unit of pixel block which will be discussed later. Note that the colors R and the colors B are preferably counterchanged in position between the odd number arrays adjacent to each other.)

An optical LPF 50b to blur optical images in a row direction of the matrix pattern (including the case of forming a multiple image) is disposed on this color filter array. This optical LPF 50b is so adjusted that the distance by which the optical images are shifted is substantially equal to the distance between arrays of the matrix pattern.

As shown in FIG. 6B, photosensor segregating regions (channel stops) 54 section the light-receiving surface into units of zigzag arrays of the photosensors 51. A plurality of vertical CCDs 53 are formed with the plural segregating regions 54 as borders therebetween.

Each of the vertical CCDs 53 is constituted of an array of segments disposed between the photosensors 51. Four-phase transport electrodes φV1 to φV4 are provided for these segments. A control circuit 55 applies control voltages to these transport electrodes φV1 to φV4. Further, transfer gates 52 are provided between the photosensors 51 and the vertical CCDs 53.

Horizontal CCDs 56 are provided at ends of these vertical CCDs 53. Two-phase transport electrodes φH1 and φH2 are provided for the horizontal CCDs 56. The control circuit 55 applies control voltages to these transport electrodes φH1 and φH2.

[Relationship with Claims]

The relationship between matters recited in the claims and this embodiment will be explained. It should be noted that the relationship here only presents an example of interpretation for the purpose of reference, and is not to be considered as limiting the present invention more than necessary.

Photosensors recited in the claims correspond to the photosensors 51.

A readout section recited in the claims corresponds to the transfer gates 52, the vertical CCDs 53, the horizontal CCDs 56, and the control circuit 55.

A color pattern in a color filter array recited in the claims is that shown in FIG. 7A.

A first color recited in the claims corresponds to the color G.

A second color recited in the claims corresponds to the color R.

A third color recited in the claims corresponds to the color B.

An optical low pass filter recited in the claims corresponds to the optical LPF 50b.

Vertical paths recited in the claims correspond to the vertical CCDs 53.

A Horizontal path recited in the claims corresponds to the horizontal CCD 56.

[Explanation on Operation of Low-Resolution Transport Mode]

Hereinafter, the operation of a low-resolution transport mode in the imaging device 50 will be explained, using FIG. 6B. The operation of a mechanical shutter 14 and the operation of an electronic shutter are the same as those in the first embodiment, and therefore, the explanation thereof will be omitted here.

After photo signals are accumulated on the photosensors 51 after a predetermined exposure period has passed, a microprocessor 22 outputs a transport control signal of the low-resolution transport mode to the control circuit 55 in the imaging device 50.

Then, the control circuit 55 applies voltages exceeding a threshold voltage to the transport electrodes φV4. Accordingly, the photo signals (G21, B22, R41, G42, and so on shown in FIG. 6B) on the photosensors 51 are transferred to the segments of the transport electrodes φV4 via the transfer gates 52.

In this state, the control circuit 55 applies four-phase transport pulses to the transport electrodes φV1 to φV4 to transport the photo signals on two segments on each of the vertical CCDs 33.

Next, the control circuit 55 applies voltages exceeding a threshold voltage to the transport electrodes φV2. Accordingly, the photo signals (G11, B12, R31, G32, and so on shown in FIG. 6B) on the photosensors 51 are transferred to the segments of the transport electrodes φV2 via the transfer gates 52. Through such operations, (G11+G21), (R31+R41), (B12+B22), (G32+G41), and so on are generated on the segments of the transport electrodes φV2 as the results of adding up the photo signals.

In this state, the control circuit 55 applies four-phase transport pulses to the transport electrodes φV1 to φV4 in sequence to vertically transport the adding-up results for one row on the vertical CCDs 53 to the horizontal CCDs 56. The control circuit 55 applies two-phase transport pulses to the transport electrodes φH1 and φH2 in sequence to horizontally transport the adding-up results for one row on the horizontal CCDs 56 to an exterior. By alternately repeating such vertical and horizontal transport, the results of adding-up the photo signals are read out to the exterior as low-resolution data for one screen.

This low-resolution data are gain-adjusted and digitalized in an A/D converting section 15. The digitalized low-resolution data are subjected to signal processing such as tone correction (such as gamma correction) and white balance adjustment in a signal processing section 16 substantially in real time as required. The processed low-resolution data are tentatively recorded in the buffer memory 17.

An image processing section 19, while fetching the low-resolution data in this buffer memory 17 via a bus 18 at each processing, performs two-dimensional image processing such as color interpolation on the low-resolution data. The processed low-resolution data are compressedly stored on a memory card 21 via a recording section 20.

[Features of Low-Resolution Transport Mode]

FIG. 7A is a view showing areas in which the photo signals are added up in the above-described operation as pixel blocks (dotted-line squares in the drawing) on the light-receiving surface. As shown in this drawing, each of the pixel blocks is constituted of two photosensors 51 assembled in an array direction of the matrix pattern.

As shown in FIG. 7A, the pixel blocks in odd number arrays and the pixel blocks in even number arrays are displaced in the array direction by half a phase. On the other hand, these pixel blocks are aligned in the same phase in a horizontal direction and a vertical direction on the light-receiving surface.

Equivalent apertures (ranges of incident lights) of the pixel blocks are enlarged due to an image shift effect caused by the optical LPF 50b. FIG. 7B is a view showing the equivalent apertures of the pixel blocks. Each of the equivalent apertures is equivalent to the assembly of four microlenses and the pattern of the equivalent apertures is equal to the pattern shown in FIG. 4B turned by 45°. As shown in this drawing, the equivalent apertures in color G cover the entire light-receiving surface, leaving almost no space left uncovered. The equivalent apertures in color R and color B are arranged in a diagonal checkered pattern. Further, the equivalent apertures in color R and color B are displaced from the equivalent apertures in color G by half a phase in the horizontal and the vertical direction.

As shown in FIG. 7B, the color pattern of these equivalent apertures is equal to the color pattern of the bayer pattern. Therefore, it is possible to execute color interpolation for the bayer pattern in the image processing section 19.

However, though the obtained color pattern is the bayer pattern, the pattern of the equivalent apertures is different from a typical bayer pattern of a single-board imaging device. The feature in connection to the simplification of the optical LPF based on this color pattern is the same as that of the first embodiment.

[Explanation on Operation of High-Resolution Transport Mode]

Next, the operation of a high-resolution transport mode in the second embodiment will be explained.

First, the microprocessor 22 outputs a transport control signal of the high-resolution transport mode to the control circuit 55 in the imaging device 50.

Then, the control circuit 55 applies voltages exceeding a threshold voltage to the transport electrodes φV2. Accordingly, the photo signals (G11, B12, R31, G32, and so on shown in FIG. 6B) on the photosensors 51 are transferred to the segments of the transport electrodes φV2 via the transfer gates 52. In this state, the control circuit 55 drives the vertical CCDs 53 and the horizontal CCDs 56 to read out the photo signals on the vertical CCDs 53 in sequence. Through such a transport operation, image data of the first field are first read out. The image data of the first field, after being processed through the A/D converting section 15 and the signal processing section 16, are tentatively recorded in the buffer memory 17.

Next, the control circuit 55 also executes a similar image data (G21, B22, R41, G42, and so on shown in FIG. 6B) read out for the second field.

Through such interlace transport operation, the image data for one screen are accumulated in the buffer memory 17.

The image processing section 19, while fetching the image data in the buffer memory 17 via the bus 18 at each processing, subjects the image data to two-dimensional image processing such as color interpolation. The processed image data are compressedly stored on the memory card 21 via the recording section 20.

[Features of High-Resolution Transport Mode]

Figure 8:
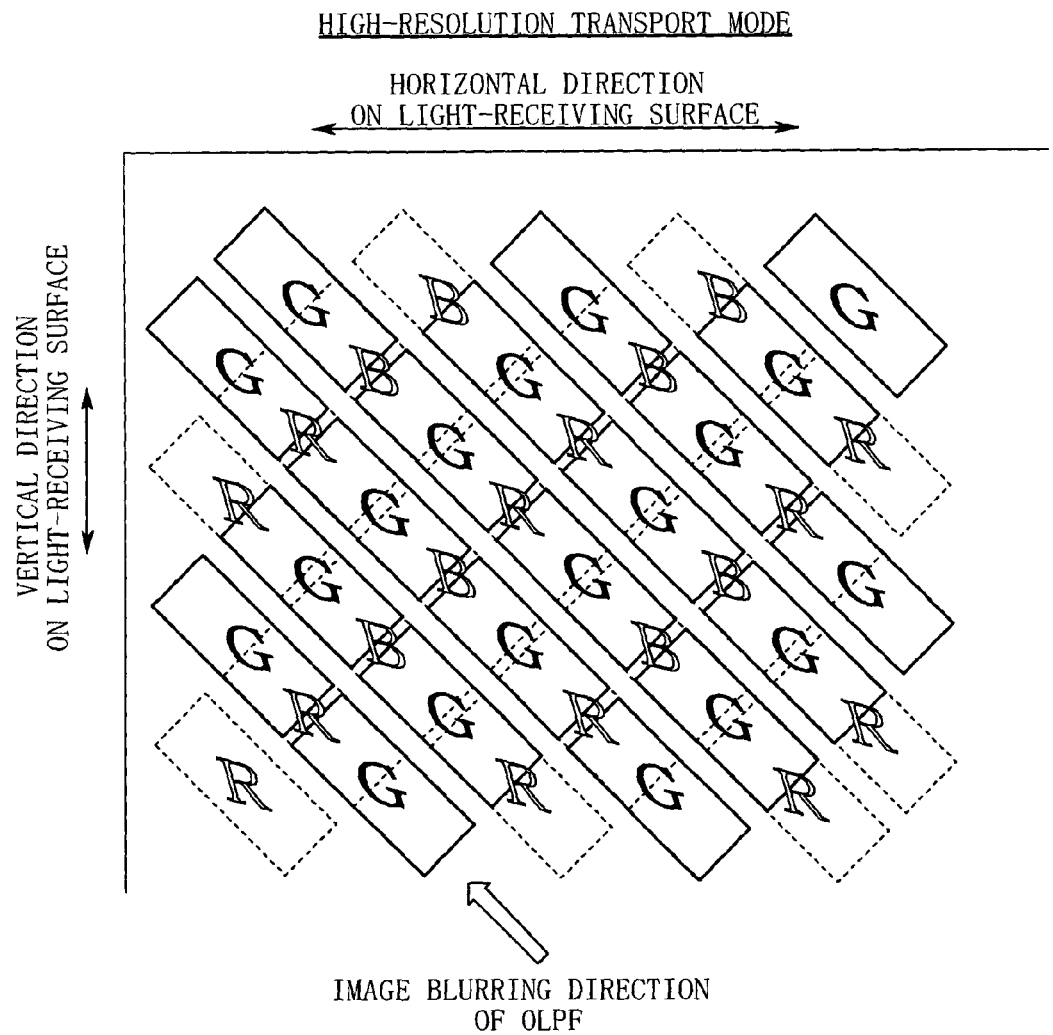
FIG. 8 is a view showing apertures in a high-resolution transport mode.

FIG. 8 is a view showing equivalent apertures of pixels (including the effect of the optical LPF) in the high-resolution transport mode.

As shown in FIG. 8, in the high-resolution transport mode, resolution in a diagonal direction of single G is increased compared with that in the low-resolution transport mode. Consequently, minute structures of images can be captured with enhanced definition in the imaging device 50 in the high-resolution transport mode.

Third Embodiment

The feature of a third embodiment is that specially devised design is applied to the wiring pattern of transport electrodes φV1 to φV4. Other respects are substantially the same as those in the first embodiment, and therefore, the explanation thereof will be omitted here.

Figure 15:
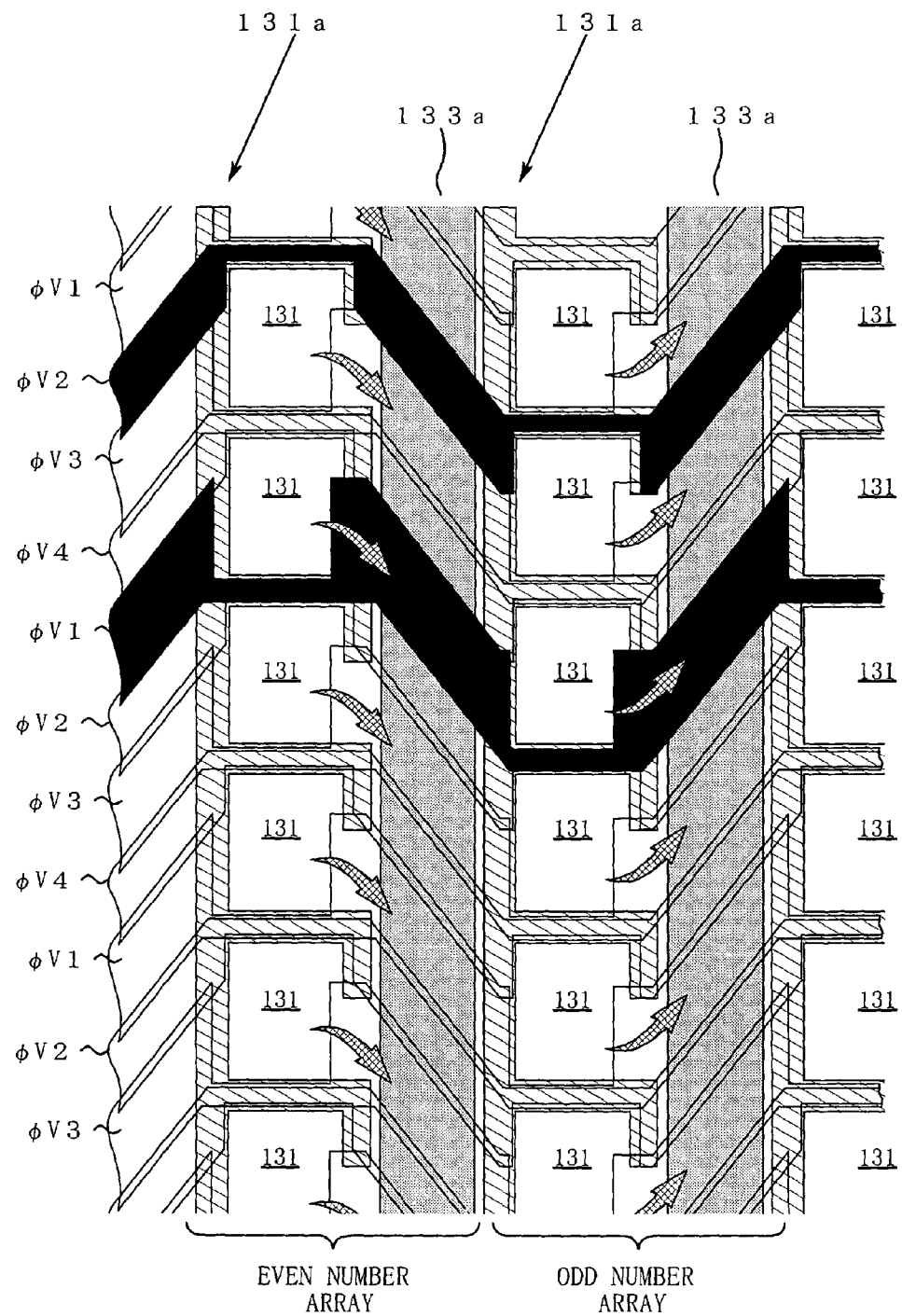
FIG. 15 is a view showing an example of wiring patterns of transport electrodes.
Figure 16:
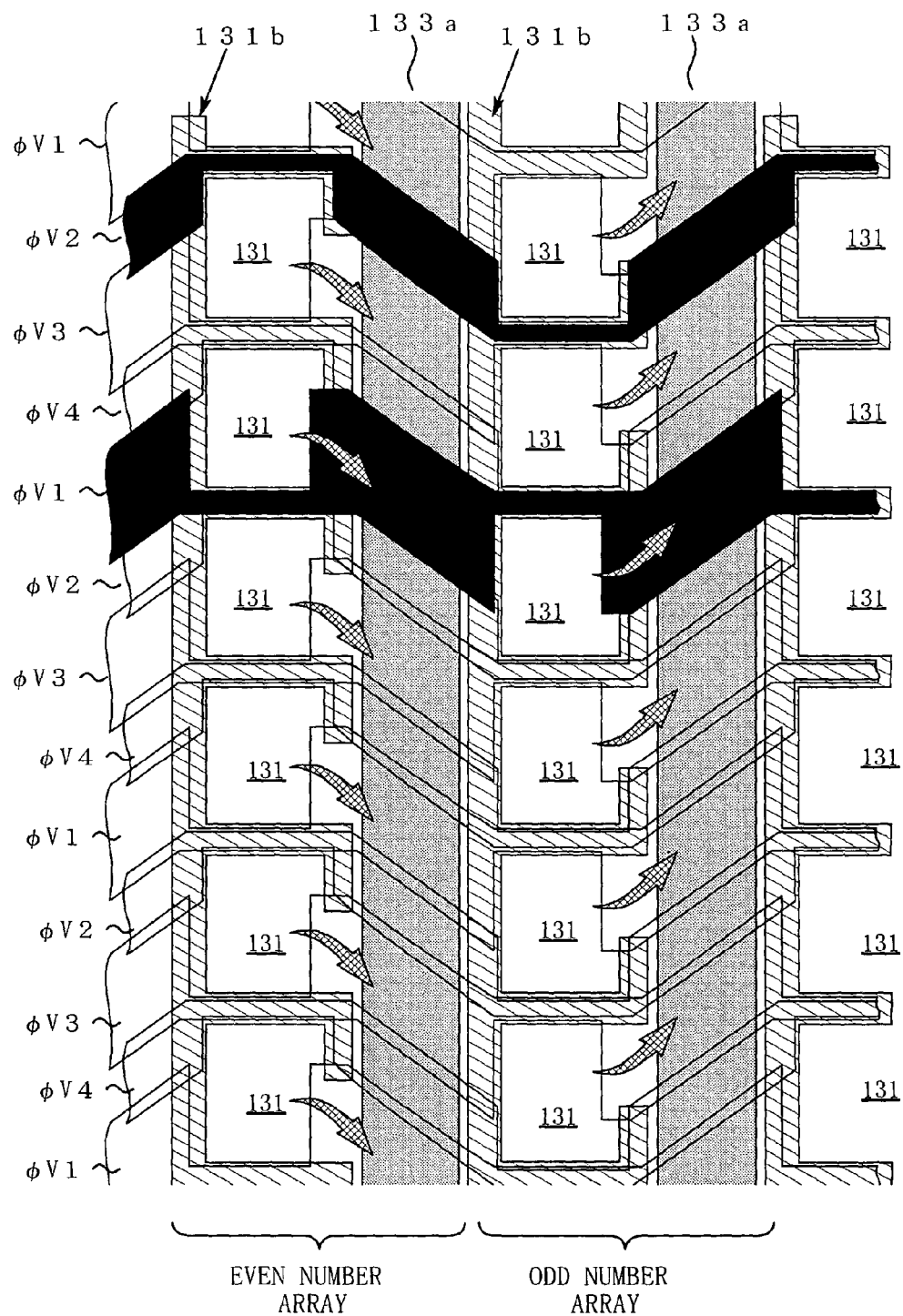
FIG. 16 is a view showing another example of the wiring patterns of the transport electrodes.
Figure 17:
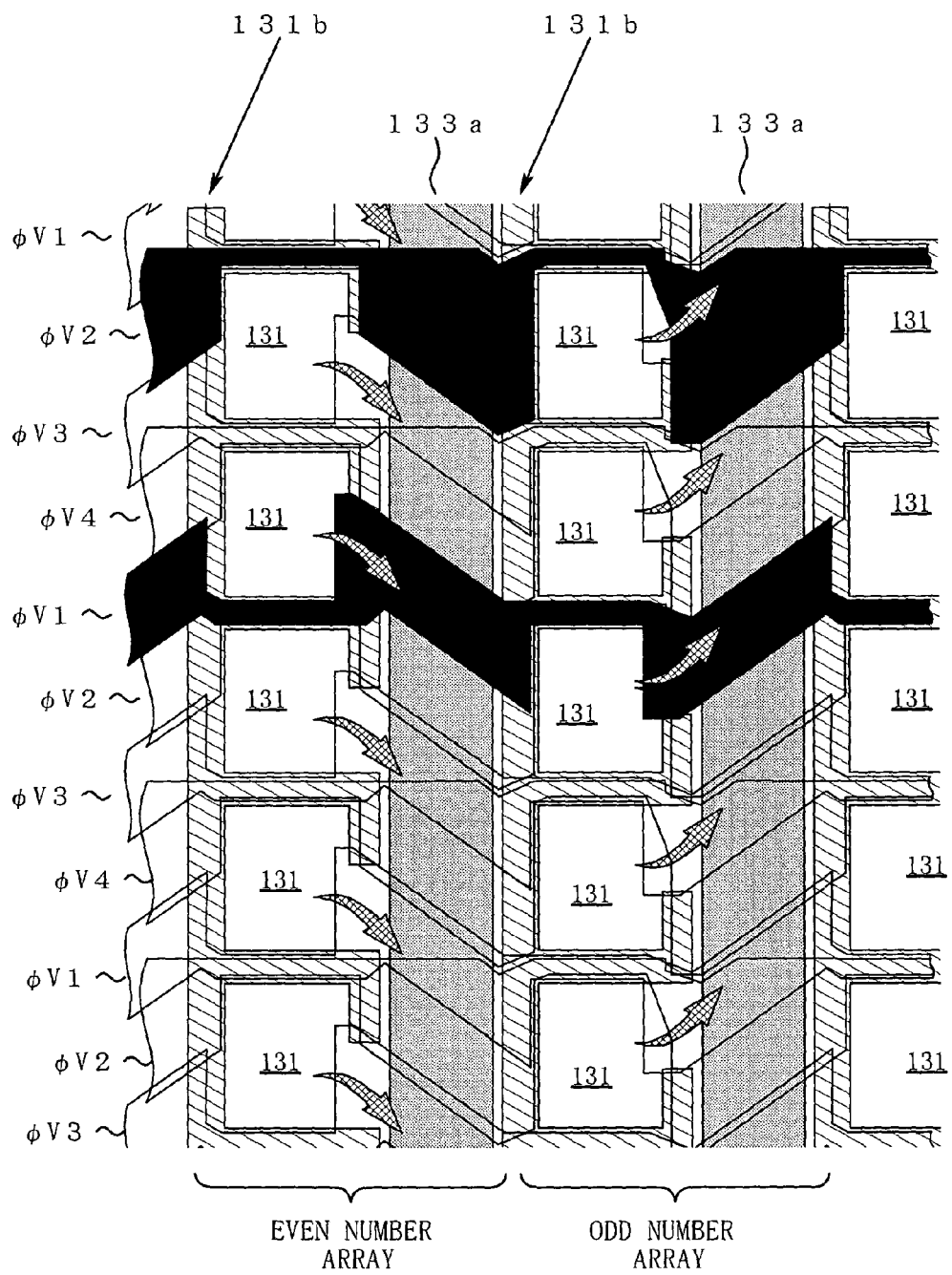
FIG. 17 is a view showing still another example of the wiring patterns of the transport electrodes.

FIG. 15, FIG. 16, and FIG. 17 are views showing examples of the wiring patterns of the transport electrodes φV1 to φV4. In these drawings, the transport electrodes φV1 and the transport electrodes φV2 are colored in black to distinctively show the shape of the transport electrodes.

These drawings will be explained below one by one.

[Wiring Patterns Shown in FIG. 15]

In FIG. 15, photosensors 131 arranged in a matrix pattern, channel stops (which mean segregating regions) 131a electrically segregating these photosensors 131, transport channels 133a interposed between arrays of the photosensors 131, and the transport electrodes φV1 to φV4 are provided on a light-receiving surface.

Here, the transport electrodes φV1 and φV3 and the transport electrodes φV2 and φV4 are so arranged that edges thereof are displaced from each other in a thickness direction of a semiconductor substrate to ensure mutual electrical insulation and they partly overlap each other when seen from the upper direction of the light-receiving surface.

Each pixel block on this light-receiving surface is constituted of two photosensors 131 assembled in an array direction. Further, the pixel blocks in even number arrays and those in odd number arrays are displaced from each other by half a phase (namely, by one photosensor 131) in the array direction.

The transport electrodes φV1 to φV4 are formed in a zigzag stitch shape so as to connect "the photosensors 131 in the odd number arrays" and "the photosensors 131 in the even number arrays" which are displaced by half a phase of a pixel block.

The transport operation in the wiring patterns will be explained in detail below. First, when high-voltage transport pulses are applied to the transport electrodes φV1, transfer gates under the transport electrodes φV1 are put into an ON state. As a result, photo signals are transferred from the photosensors 131 to the transport channels 133a along the wiring patterns of the transport electrodes φV1. Similarly, when high-voltage transport pulses are applied to the transport electrodes φV3, transfer gates under the transport electrodes φV3 are put into an ON state. As a result, photo signals are transferred from the photosensors 131 to the transport channels 133a along the wiring patterns of the transport electrodes φV3.

Through such operations, the photo signals in the odd number arrays and the photo signals in the even number arrays are read out in staggered directions along the wiring patterns of the transport electrodes φV1 and φV3. As a result, the pixel blocks with the phase displacement are aligned in the same phase on potential wells of the transport channels 133a.

[Wiring Patterns shown in FIG. 16]

Also in FIG. 16 similarly to FIG. 15, the transport electrodes φV1 to φV4 are formed in a pattern so as to connect "the photosensors 131 in the odd number arrays" and "the photosensors 131 in the even number arrays" which are displaced by half a phase of a pixel block.

As a result, also in FIG. 16, the pixel blocks having the phase displacement are aligned in the same phase on the transport channels 133a.

Note that, in the wiring patterns shown in FIG. 16, the displacement between the transfer gates in the odd number arrays and those in the even number arrays is smaller than that in FIG. 115. As a result, the bending degree of the transport electrodes φV1 to φV4 is reduced, which results in a success in forming the patterns of the transport electrodes φV1 to φV4 in a smoother shape.

Further, as for the transport electrodes φV1 and the transport electrodes φV3, they pass in a straight line between the rows of the photosensors 131 to realize wiring connection.

[Wiring Patterns shown in FIG. 17]

Also in FIG. 17, similarly to FIG. 15, the transport electrodes φV1 to φV4 are formed in a pattern so as to connect "the photosensors 131 in the odd number arrays" and "the photosensors 131 in the even number arrays" which are displaced by half a phase of a pixel block.

As a result, also in the wiring patterns shown in FIG. 17, the phase displacement of the pixel blocks is eliminated so that the pixel blocks are aligned in the same phase on the transport channels 133a.

Note that, in the wiring patterns shown in FIG. 17, the displacement between the transfer gates in the odd number arrays and those in the even number arrays is still smaller. As a result, the bending degree of the transport electrodes φV1 to φV4 is reduced, which results in a success in forming the patterns of the transport electrodes φV1 to φV4 in a still smoother shape Further, all of the transport electrodes φV1 to φV4 pass between the rows of the photosensors 131 in a straight line to realize wiring connection.

Next, yet another embodiment will be explained.

Fourth Embodiment

The feature of an electronic camera in a fourth embodiment is that the imaging device 13 shown in FIG. 1 is replaced by an imaging device 213. The configuration of the electronic camera in other respects is the same as that in the first embodiment, and therefore, the explanation thereof will be omitted here.

Figure 18:
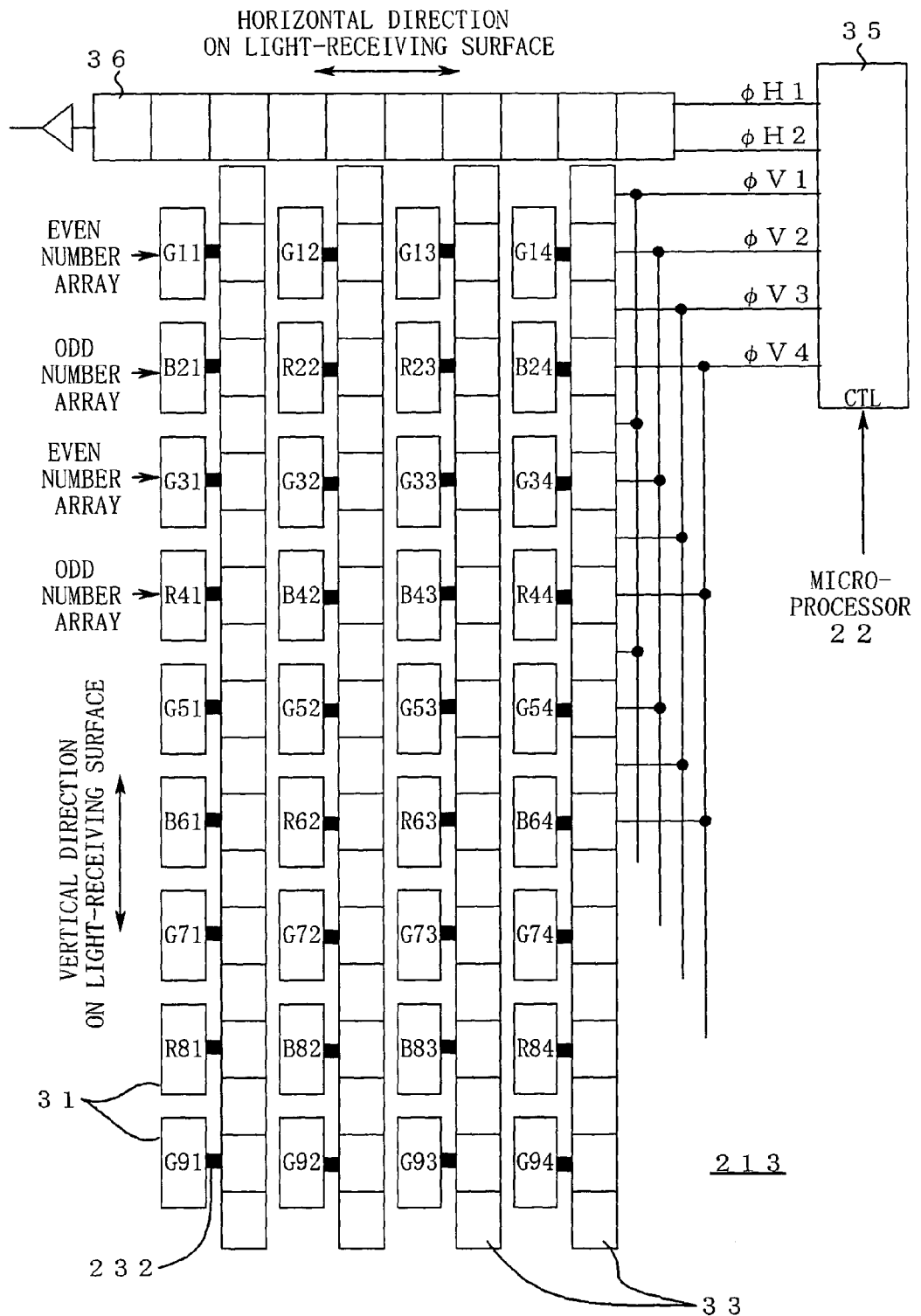
FIG. 18 is a view showing an imaging device 213.
Figure 19:
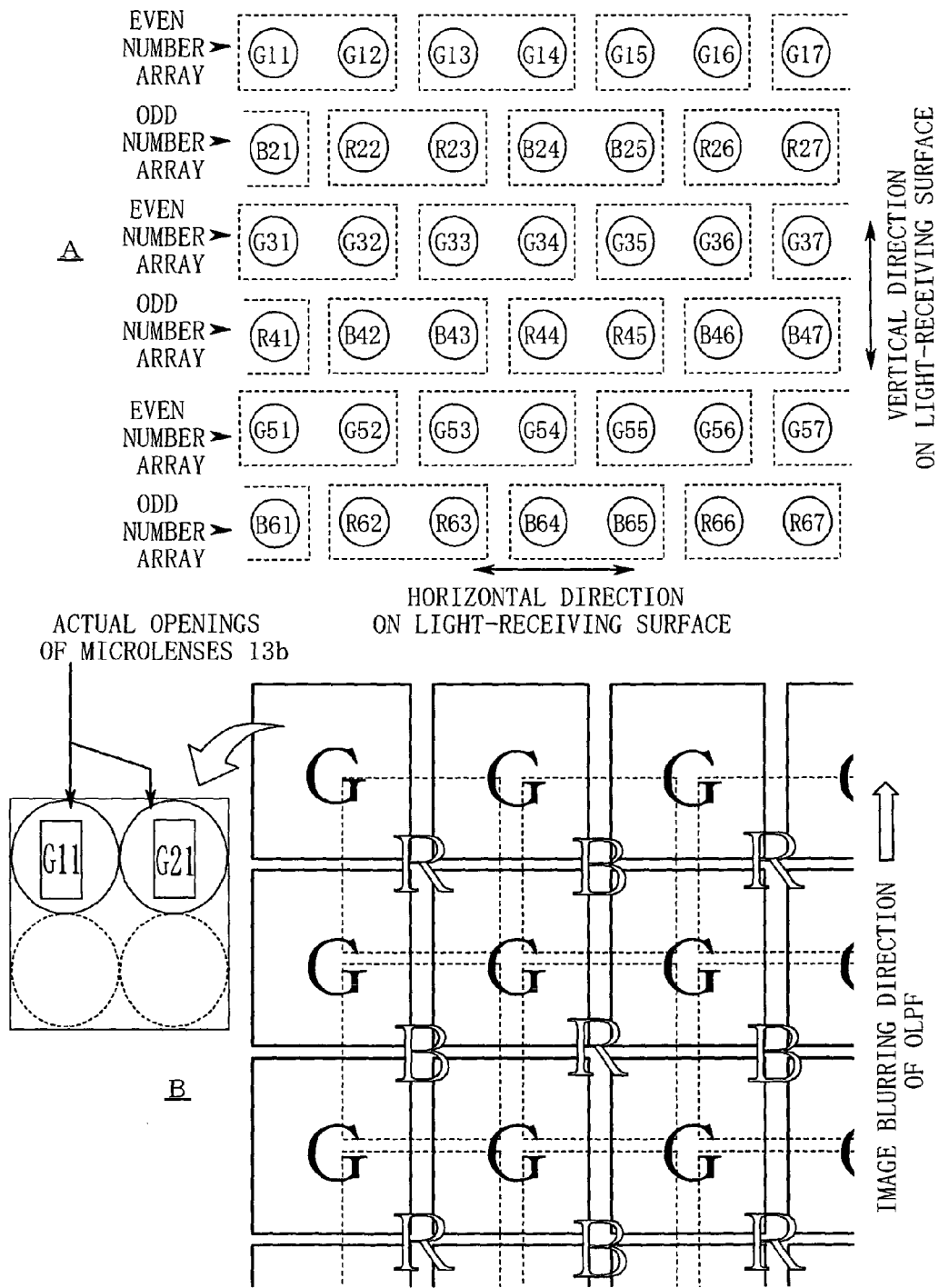
FIG. 19A and FIG. 19B are views showing pixel blocks and apertures in a low-resolution transport mode.

FIG. 18 is a view showing this imaging device 213. FIG. 19A is a view showing pixel blocks (dotted rectangles in the drawing) of the imaging device 213. FIG. 19B is a view showing equivalent apertures for individual signals in a low-resolution transport mode of the imaging device 213.

In the fourth embodiment, a direction substantially perpendicular to a vertical transport direction of photo signals is defined as "an array direction" and the pixel blocks are set based on this array direction. As a result, the pixel blocks shown in FIG. 19A become the same as the pixel blocks in the first embodiment (refer to FIG. 4A) turned by approximately 90°.

Further, in accordance with such turning of the pixel blocks, a color pattern of a color filter array shown in FIG. 19A also becomes the same as the color pattern in the first embodiment (refer to FIG. 4A) turned by approximately 90°. Similarly, the direction of image shift by an optical LPF shown in FIG. 19B also becomes the same as the direction of the image shift in the first embodiment (refer to FIG. 4B) turned by approximately 90°.

Note that, in the fourth embodiment, the pixel blocks are aligned in the same phase in the vertical transport direction. Accordingly, transfer gates 232 are disposed at positions of transport electrodes φV2 and transport electrodes φV4, unlike those in the first embodiment (FIG. 2).

[Explanation on Operation of Low-Resolution Transport Mode]

Hereinafter, the operation of a low-resolution transport mode in the fourth embodiment will be explained, using FIG. 1 and FIG. 18.

A microprocessor 22, after finishing the accumulation of photo signals of photosensors 31 by closing a mechanical shutter 14, outputs a transport control signal of the low-resolution transport mode to a control circuit 35 in the imaging device 213.

In response to this transport control signal, the control circuit 35 drives vertical CCDs 33 and horizontal CCDs 36 to execute interlace transport.

In the interlace transport for a first field, photo signals (G11, G12, G13, G31, G32, G33, and so on shown in FIG. 18) in even number arrays are outputted from the horizontal CCDs 36 in sequence. Outputs (CCD output stages or output circuits) of the horizontal CCDs 36 add up the photo signals in the even number arrays in a horizontal direction in synchronization with the horizontal transport to generate synthesized signals (for example, G11+G12 and so on) in each pixel block.

In the subsequent interlace transport for a second field, photo signals (R22, R23, B24, B25, and so on shown in FIG. 18) in odd number arrays are outputted from the horizontal CCDs 36 in sequence. The outputs of the horizontal CCDs 36 (the CCD output stages or the output circuits) add the photo signals up in the odd number arrays in the horizontal direction in synchronization with the horizontal transport to generate synthesized signals (for example, R22+R23 and so on) in each pixel block. At this time, the outputs of the horizontal CCDs 36 differ the timings of the horizontal adding-up by half a phase to generate the synthesized signals that are displaced from the synthesized signals of the first field in the horizontal direction by half a phase.

Through the interlace transport for the two fields, low-resolution data for one screen are accumulated in a buffer memory 17.

An image processing section 19, while fetching the low-resolution data in the buffer memory 17 via a bus 18, subjects the low-resolution data to two-dimensional image processing such as color interpolation. The processed low-resolution data are compressedly stored on a memory card 21 via a recording section 20.

Through the operations described above, the low-resolution data substantially equal to those in the first embodiment can be obtained.

[Explanation on Operation of High-Resolution Transport Mode]

Next, the operation of a high-resolution transport mode in the fourth embodiment will be explained, using FIG. 1 and FIG. 18.

The microprocessor 22, after finishing the accumulation of the photo signals on the photosensors 31 by closing the mechanical shutter 14, outputs a transport control signal of the high-resolution transport mode to the control circuit 35 in the imaging device 213.

In response to this transport control signal, the control circuit 35 drives the vertical CCDs 33 and the horizontal CCDs 36 to execute interlace transport.

At this time, the outputs of the horizontal CCDs 36 stops the operation of the horizontal adding-up of the photo signals and outputs the photo signals of the respective pixels individually.

Through such interlace transport for the two fields, high-resolution data for one screen are accumulated in the buffer memory 17.

The image processing section 19, while fetching the high-resolution data in this buffer memory 17 via the bus 18, subjects the high-resolution data to two dimensional image processing such as color interpolation. The processed high-resolution data are compressedly stored on the memory card 21 via the recording section 20.

Through these operations, the high-resolution data substantially equal to those in the first embodiment can be obtained.

Supplementary Matters in First to Fourth Embodiments

In the embodiments described above, the case when each pixel block is constituted of two photosensors is explained. The present invention, however, is not limited to this structure. Generally, each pixel block can be constituted of N (N≧2) pieces of photosensors. In this case, the number of phases of the transport electrodes may be changed in accordance with the number of N.

Figure 9:
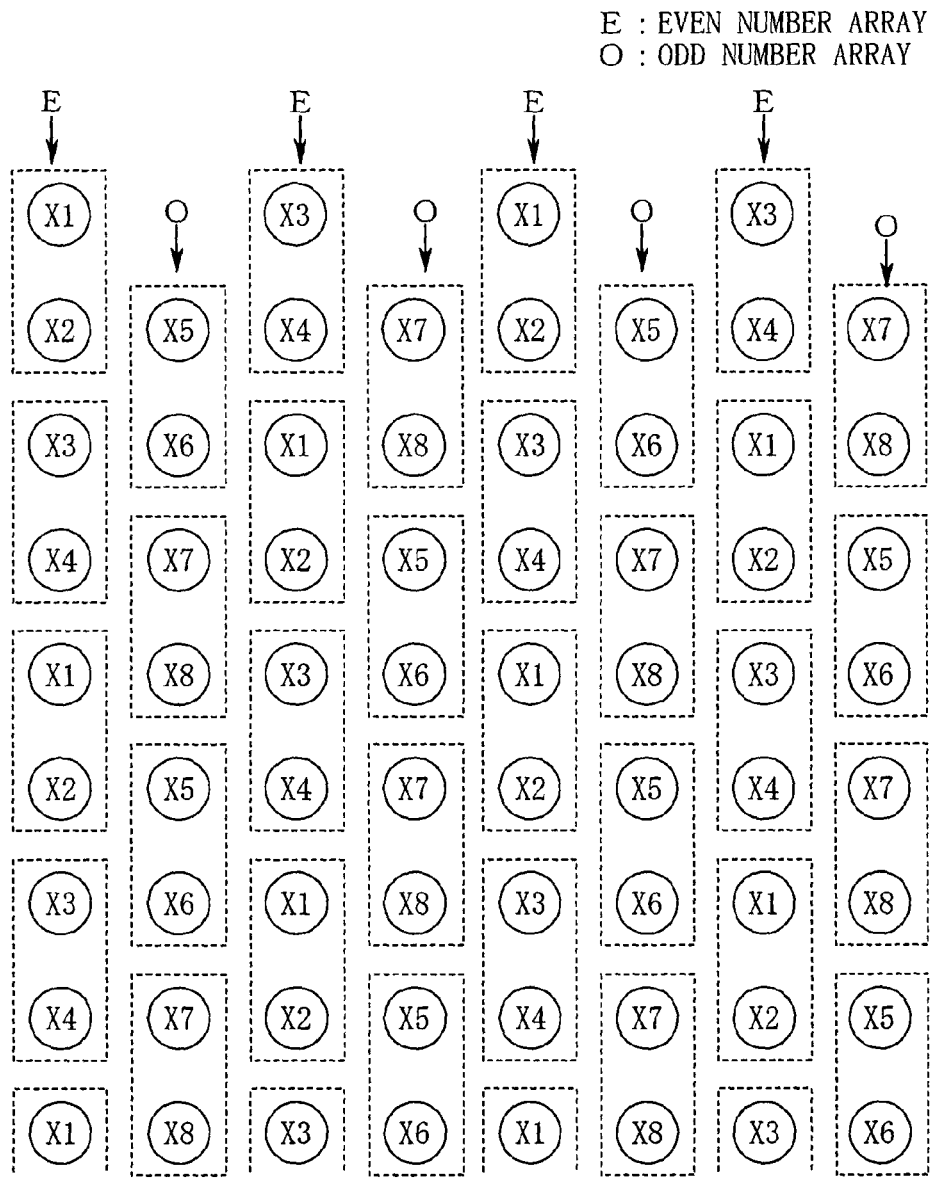
FIG. 9 is a view showing an example of preferable arrangement of color filters X1 to X8.
Figure 10:
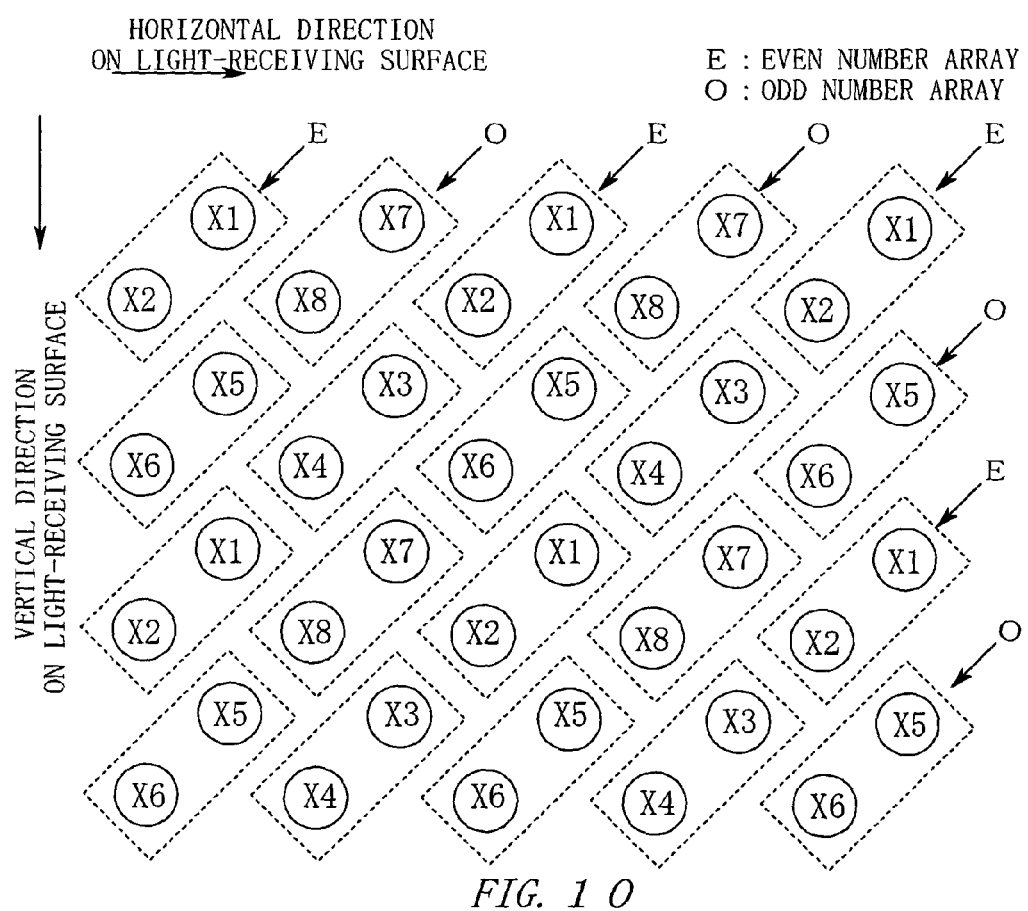
FIG. 10 is a view showing another example of preferable arrangement of the color filters X1 to X8.

Further, in the embodiments described above, the case when the primary color filter array is used is explained. The present invention, however, is not limited to a specific color filter array. For example, arbitrary color filters X1 to X8 may be disposed, based on the arrangement patterns shown in FIG. 9 to FIG. 11.

In this case, the adoption of a CFA pattern 1 in FIG. 11 makes it possible to obtain the aforesaid primary color filter array.

Alternatively, the adoption of a CFA pattern 2 in FIG. 111 makes it possible to obtain a primary color filter array in which the colors G are replaced by brightnesses Y.

The adoption of a CFA pattern 3 in FIG. 11 makes it possible to obtain a color filter array of complementary colors in which the G colors are interlaced.

Further, the adoption of a CFA pattern 4 in FIG. 11 makes it possible to obtain a color filter array consisting of arbitrary colors a1 to a4.

Note that the color filters belonging to the same pixel block have the same color in the above-described embodiments. The present invention, however, is not limited to this pattern. For example, a plurality of color filters belonging to the same pixel block may be set to different colors. In this case, in the high-resolution transport mode, detailed color information can be obtained for each photosensor. In the low-resolution transport mode, color information relating to a synthesized color of the color filters in the pixel block can be obtained.

In the embodiments described above, two segments of the vertical CCD 33, 53 are allotted to one photosensor 31, 51. The present invention, however, is not limited to this allotment. For example, three to four segments of the vertical CCD 33, 53 may be allotted to one photosensor 31, 51. This enables progressive transport by three- to four-phase driving in the high-resolution transport mode.

In the embodiments described above, the photo signals are added up on the vertical CCDs 33, 53. The present invention, however, is not limited to this structure. For example, such a structure may be adopted that the photo signals are vertically transported in a progressive manner via the vertical paths (vertical CCDs) and they are added up in each pixel block on the horizontal paths (horizontal CCDs).

Also in this case, it is preferable that the pixel blocks which are displaced by half a phase are aligned in the same phase on the vertical paths by displacing the transfer gates in the odd number arrays and those in the even number arrays. Alternatively, as will be described later, the pixel blocks having the phase displacement are aligned on the horizontal paths by differing the number of vertical segments between the even number arrays and the odd number arrays. With thus devised design, the adding-up in each pixel block on the horizontal paths can be made simple and accurate.

In the embodiments described above, the control circuits 35, 55 are formed on the same semiconductor substrates on which the photosensors 31, 51 and so on are formed. The present invention, however, is not limited to this structure. For example, the control circuits 35, 55 may be formed as separate structures from the semiconductor substrates on which the photosensors 31, 51 and so on are formed. In this case, it is also possible to impart the microprocessor 22 or the like in the electronic camera 11 with the function of the control circuits 35, 55.

In the embodiments described above, the imaging devices of a CCD type are explained. However, the present invention is not limited to this type. For example, the present invention may be applied to an imaging device of an XY address type (CMOS type and so on).

Figure 12:
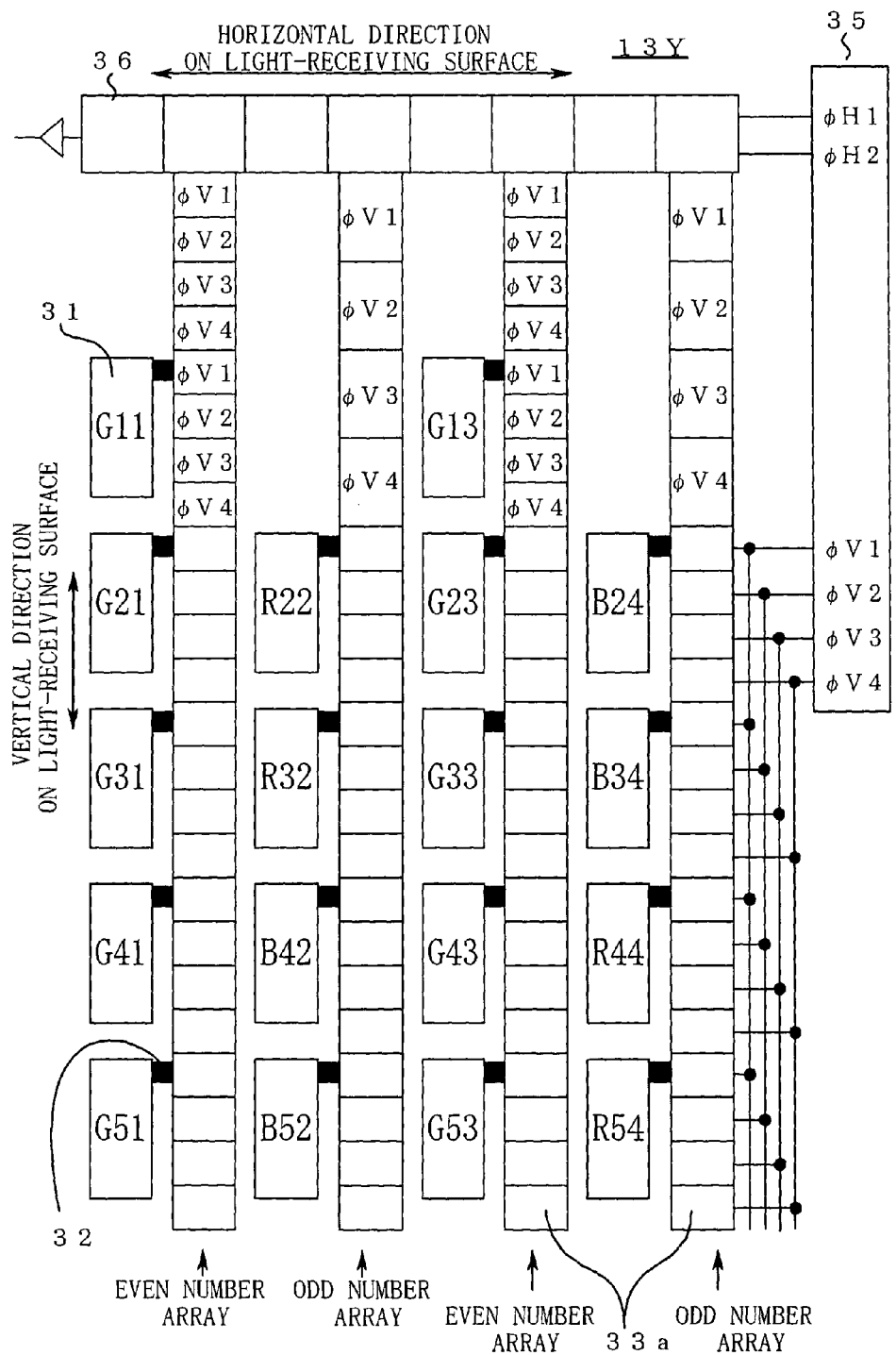
FIG. 12 is a view showing the structure of an imaging device 13Y.

In the first embodiment, the pixel blocks having the phase displacement are aligned in the same phase on the vertical CCDs 33 by the displaced arrangement of the transfer gates 32. However, the present invention is not limited to this structure. For example, as in an imaging device 13Y shown in FIG. 12, the pixel blocks having the phase displacement may be aligned in the same phase on horizontal CCDs 36 by differing the number of vertical segments of vertical CCDs 33a (for example, the number of transport electrodes) between even number arrays and odd number arrays (this structure corresponds to claim 3). In this example, since the transport electrode have four-phase segments per photosensor, the progressive vertical transport is performed to add up the photo signals at the time of transferring from vertical paths to horizontal paths. In the horizontal path, the results of adding up the photo signals (G11+G21, R22+R32, and so on) are horizontally transported.

Figure 13:
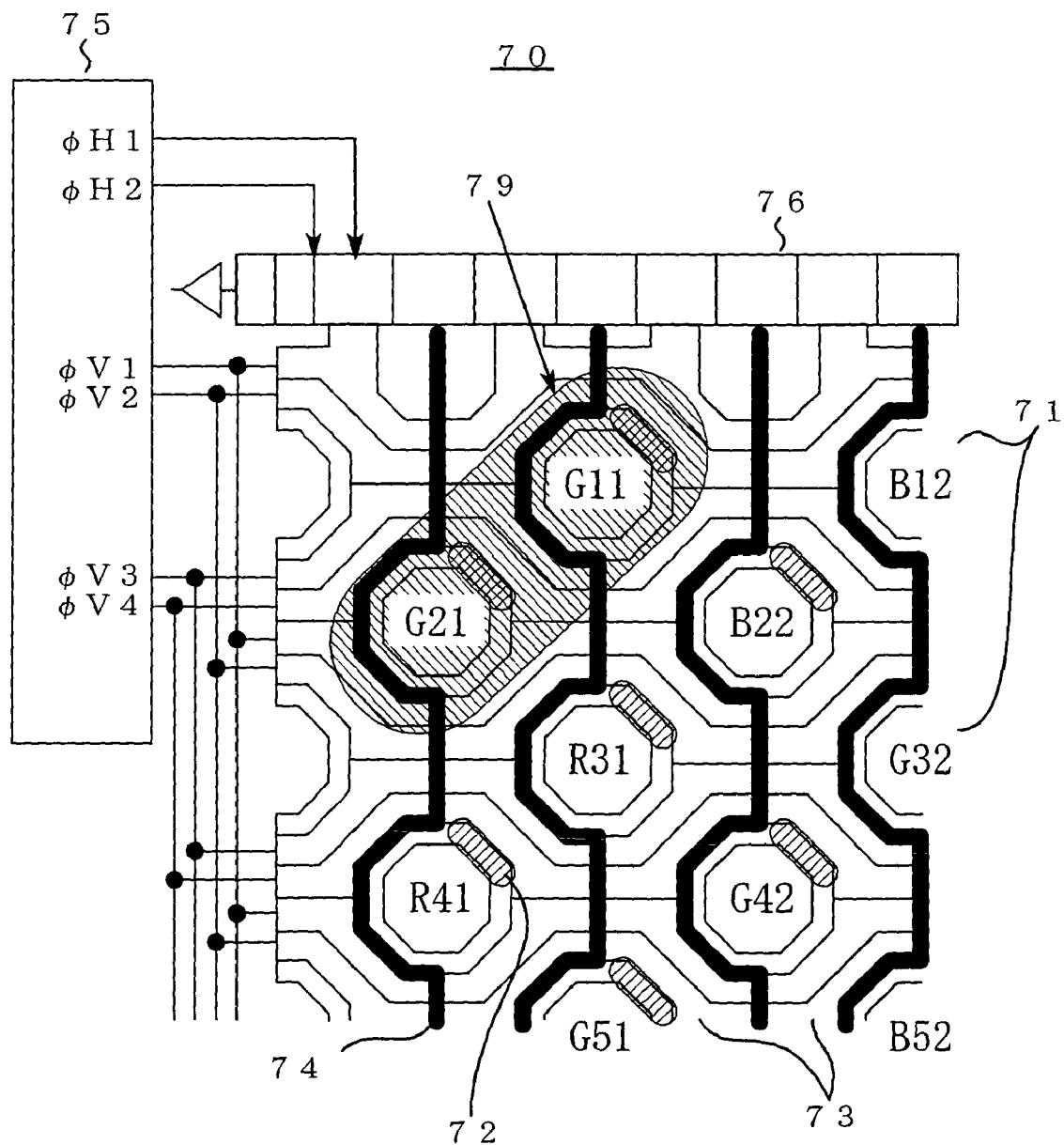
FIG. 13 is a view showing the structure of an imaging device 70.

In the second embodiment, the vertical CCDs 53 are provided for the respective zigzag arrays of the photosensors 51. However, the present invention is not limited to this arrangement. For example, as in an imaging device 70 shown in FIG. 13, such arrangement may be adopted that segregating regions 74 or the like are provided and vertical CCDs 73 are provided for respective vertical lines of photosensors 71.

In this case, it is preferable that the adding-up and readout are performed in a unit of block 79 by the operations ①to ⑥ in the low-resolution transport mode as described below.

①A control circuit 75 transfers photo signals of all the pixels to vertical CCDs 73.

②The control circuit 75 transports the photo signals (G11, B12, and so on) on the vertical CCDs 73 to horizontal CCDs 76.

③The control circuit 75 transports two segments of each of potential wells on horizontal CCDs 76.

④ The control circuit 75 transports two segments of each of the vertical CCDs 73 to transport the photo signals (G21, B22, and so on) to the horizontal CCDs 76. At this time, synthesized signals such as (G11+G2) and (B12+B21) are generated on the potential wells of the horizontal CCDs 76.

⑤ The synthesized signals on the horizontal CCDs 76, after being synthesized, are horizontally transported at a high speed for external readout.

⑥ By repeating the above-described operations ② to ④ are repeated the synthesized signals for one screen are read out to exterior.

The aforesaid adding-up operation is omitted and the operation of transporting all the pixels is performed progressively in the high-resolution transport mode.

Figure 20:
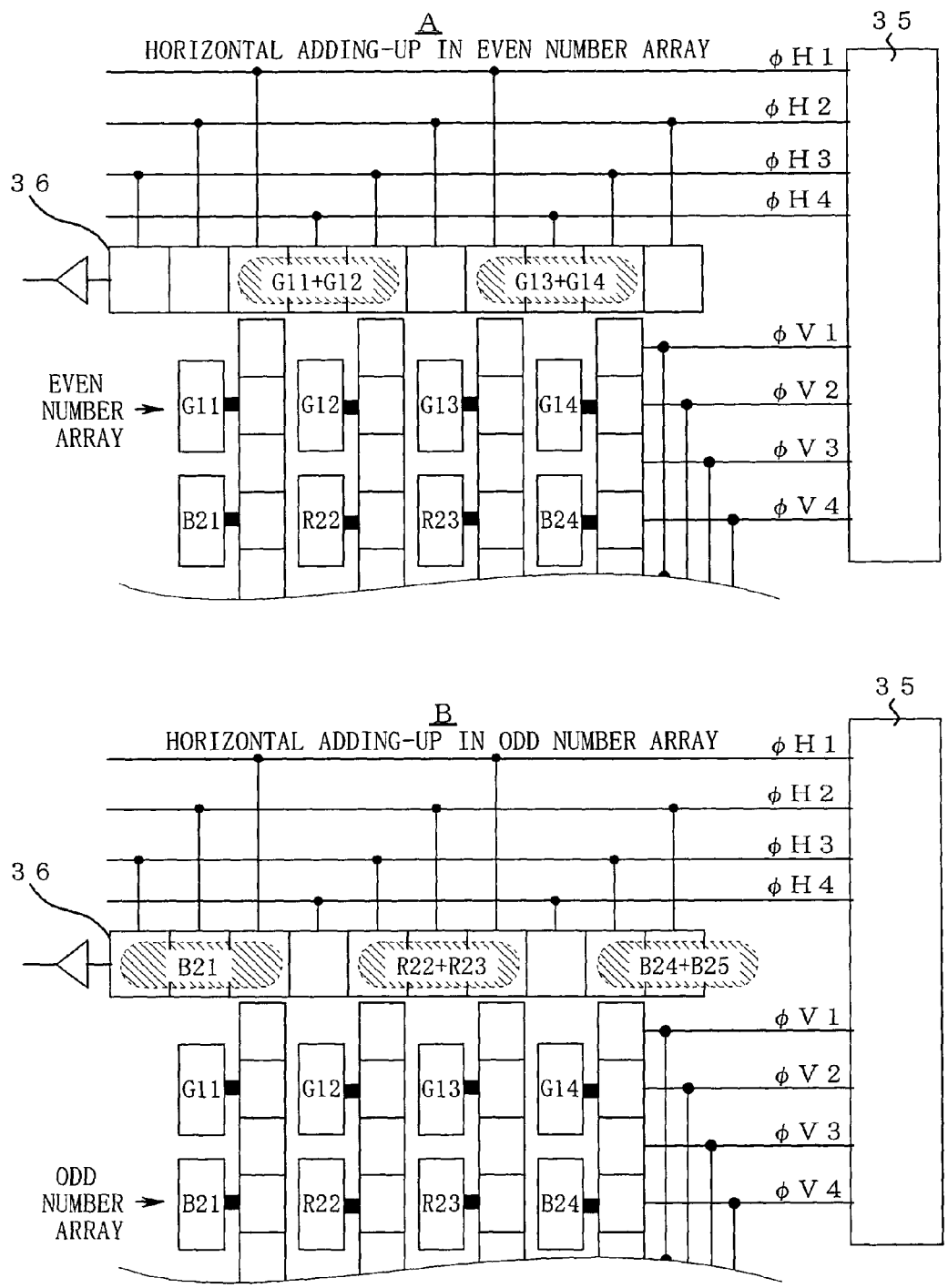
FIG. 20A and FIG. 20B are views showing the operation of adding up photo signals on horizontal paths.

In the fourth embodiment, the photo signals are added up in each pixel block at the output of the horizontal CCDs 36. However, the present invention is not limited to this structure. For example, as shown in FIG. 20A and FIG. 20B, the photo signals may be added up on the horizontal CCDs by a method such as connecting the potential wells of the horizontal CCDs.

《Supplementary Notes》

Hereinafter, the first to fourth embodiments will be explained more generally.

[1] The above embodiments describe the low-resolution transport mode in which the photo signals are added up for readout in each pixel block consisting of N pieces of the photosensors. In this low-resolution transport mode, the low resolution corresponding to the number of the transported photo signals reduced to 1/N can be realized inside the imaging device. As a result, the number of the transported photo signals is reduced, so that it is made possible to shorten the transfer and readout time in the imaging device with easiness.

In the embodiments described above, the pixel blocks in the even number arrays and those in the odd number arrays are displaced by half a phase. It is able to compensate deterioration in sharpness in the array direction by displacing the pixel blocks. Therefore, low-resolution data excellent in sharpness can be more easily obtained than in the conventional example B.

[2] The above embodiments describe the structure in which the readout directions of the photo signals from the photosensors are made alternately different between the odd number arrays and the even number arrays. Such structure makes it possible to align the pixel blocks having the phase displacement in the same phase on the vertical paths. As a result, it is not necessary to take the phase displacement of the pixel blocks into consideration in transporting the photo signals in the vertical direction and the horizontal direction, which facilitates the simplification of the transport sequence of the photo signals.

[3] The above embodiments describe the structure in which the number of the vertical segments of the vertical paths is made different between the even number arrays and the odd number arrays, thereby eliminating the half-phase displacement of the pixel blocks so that the pixel blocks are aligned in the same phase on the horizontal paths. With such structure, it is not necessary to take the phase displacement of the pixel blocks into consideration in transporting the photo signals in the horizontal direction, which facilitates the simplification of the transport sequence of the photo signals.

[4] The above embodiments describe the structure in which the wiring patterns of the transport electrodes in the even number arrays and those in the odd number arrays are displaced to thereby eliminate the half-phase displacement of the pixel blocks, so that the pixel blocks are aligned in the same phase on the horizontal paths. With such structure, it is not necessary to take the phase displacement of the pixel blocks into consideration in transporting the photo signals in the vertical direction and the horizontal direction, which facilitates the simplification of the transport sequence of the photo signals.

[5] Further, The above embodiments describe the case when at least one of the transport electrodes is formed in a pattern so as to connect "the photosensors in the odd number arrays" and "the photosensors in the even number arrays" which are displaced by half a phase of a pixel block.

The photo signals are read out simultaneously from the plural photosensors connected by this transport electrode. Further, the read photo signals are accumulated on the plural potential wells that are simultaneously generated by this transport electrode.

Thus, the pixel blocks displaced by half a phase can be aligned in the same phase on the vertical paths along the pattern of the transport electrode. As a result, it is not necessary to take the phase displacement of the pixel blocks into consideration in transporting the photo signals, which facilitates the simplification of the transport sequence of the photosensors.

[6] The above embodiments describe the adding-up processing of the photo signals while transported in each block on at least one of the vertical paths and the horizontal paths. This adding-up processing facilitates the simplification of the structure of an electronic camera or the like since it is unnecessary to separately provide an adding circuitry in exterior.

[7] The above embodiments describe the case when the displacement direction of the pixel blocks (namely, the array direction) is set to the direction substantially perpendicular to the transport direction of the vertical paths. Under such setting, almost no displacement in the direction of the vertical paths is made among the pixel blocks. Consequently, it is not necessary to contrive a method such as eliminating the phase displacement to align the pixel blocks in the same phase on the vertical paths, which facilitates the simplification of the structure and operation with respect to the vertical transport.

[8] The above embodiments describe the case when the photo signals are added up for readout in each pixel block consisting of the photosensors arranged in a line in the diagonal direction. The diagonally arranged pixel blocks are easily aligned in phase in the horizontal and vertical directions on the light-receiving surface. This makes it possible to easily obtain the low-resolution data having pixels aligned in the horizontal and vertical directions.

[9] The above embodiments describe the case where the photosensors in the same pixel block have the same color. Such a color pattern makes it possible to directly generate signals of each color in a unit of pixel block.

[10] The above embodiments describe the case when the first colors are arranged on every pixel block of the even number arrays (odd number arrays) of the matrix pattern and the second and third colors are alternately arranged in a unit of pixel block in the odd number arrays (even number arrays).

In the first embodiment, such a color pattern makes it possible to obtain the low-resolution data in the bayer pattern turned by 45°.

In the second embodiment, such a color pattern also makes it possible to obtain the low-resolution data in the bayer pattern.

[11] In the embodiments described above, the explanation is given on the structure in which provided is the optical LPF that blurs the optical image projected on the light-receiving surface in the direction substantially perpendicular to the array direction of the matrix pattern. The pixel blocks in the embodiments have the shape elongated in the array direction of the matrix pattern. Therefore, the shape of the equivalent apertures of the pixel blocks can approximate a square shape when the optical LPF blurs the optical image in the direction substantially perpendicular to the array direction. As a result, the low-resolution data low in anisotropy can be obtained.

Generally, in the bayer pattern, an optical LPF that blurs an optical image in two directions is used in order to prevent pseudo colors while maintaining isotropy of image quality. Therefore, practically two sheets of optical LPFs and a ¼ wavelength plate are required to be inserted therebetween, which has posed a problem of increasing the total thickness of the optical LPF.

In this embodiment, on the other hand, it is possible to suppress moiré and pseudo colors efficiently while maintaining the isotropy of image quality through the use of the optical LPF in a single direction. As a result, the thickness of the optical LPF is reduced to enable the improvement in imaging performance of an overall optical system. Further, the reduction in the total thickness of the optical LPF creates free space in immediate front of the light-receiving surface of the imaging device. This greatly enhances the degree of designing freedom such as disposing the mechanical shutter in the free space. Moreover, the reduction in the number of optical LPFs results in realizing cost reduction with easiness.

[12] In the embodiments described above, the explanation is given on the case when the high-resolution transport mode is selectively provided. The selectivity of the high-resolution transport mode makes it possible to selectively obtain the low-resolution data or the high-resolution data, which can expand the range of uses of the imaging device.

Fifth Embodiment

A fifth embodiment describes an example in which draft images with a diagonal grid pixel pattern are read from photosensors arranged in a grid pattern.

The feature of an electronic camera in the fifth embodiment is that the imaging device 13 shown in FIG. 1 is replaced by an imaging device 313. The configuration of the electronic camera in other respects is the same as that in the first embodiment, and therefore, the explanation thereof will be omitted here.

Figure 21:
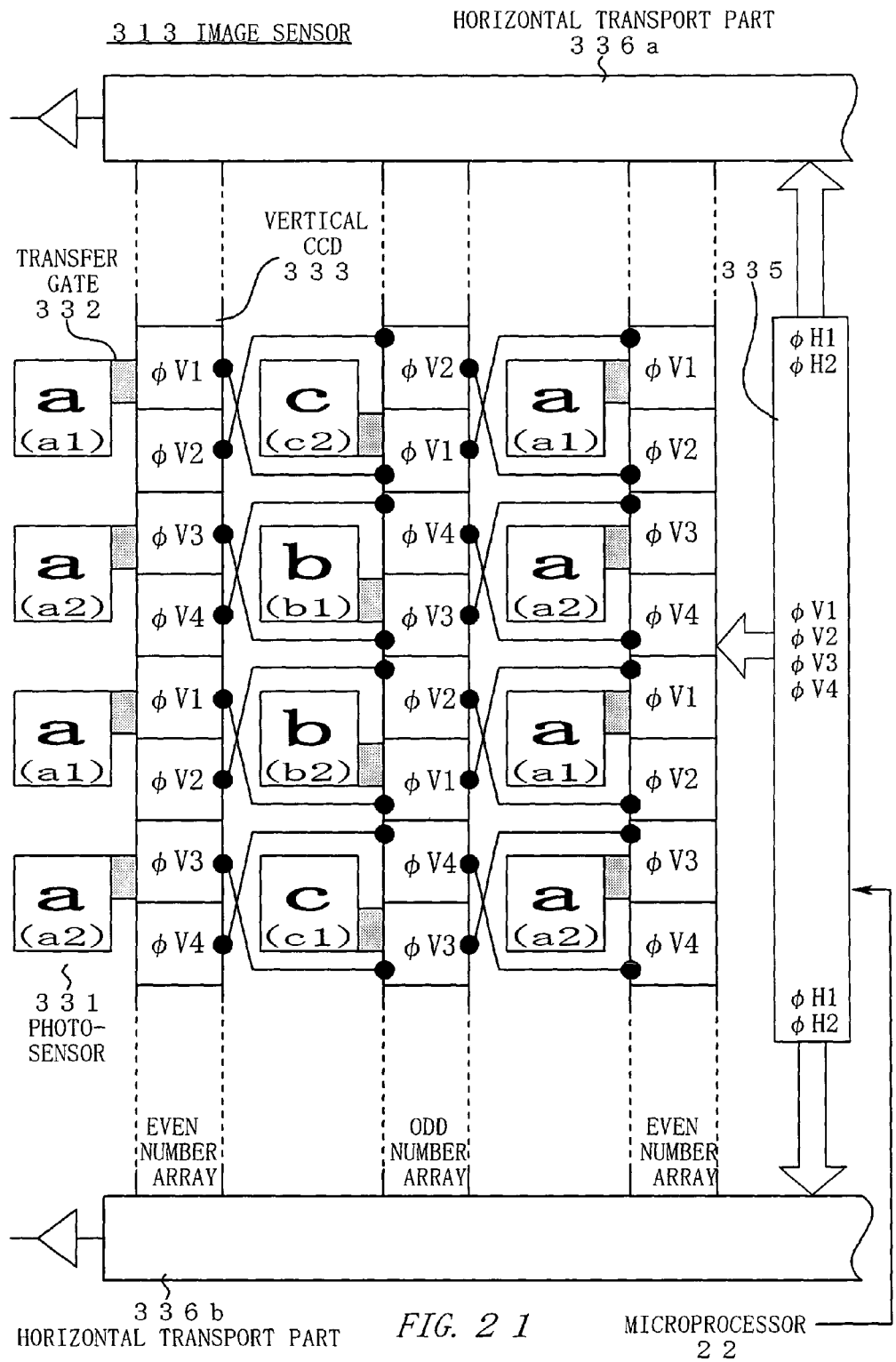
FIG. 21 is a view showing an image sensor 313.

FIG. 21 is a view showing the internal structure of the above-mentioned image sensor 313.

A plurality of photosensors 331 are arranged in a grid pattern on a light-receiving surface of this image sensor 313. On-chip microlenses (not shown) and a color filter array are provided on the photosensors 331.

This color filter array is constituted of color filters in three colors (color a, color b, and color c) arranged as shown in FIG. 21. Specifically, the color filters in color "a" (for example color G) are disposed on the photosensors 331 in even number arrays. In odd number arrays, the colors b (for example, the colors B) and the colors c (for example, the colors R) are alternately arranged on the photosensors 331 of each block consisting of two adjacent pixels in a vertical direction. Note that the colors b and the colors c are preferably counter-changed in position between adjacent odd number rows.

An optical LPF 13b to blur an optical image in a horizontal direction (including the formation of a multiple image) on the light-receiving surface is disposed on such a light-receiving surface. This optical LPF 13b is so adjusted that the distance by which the optical image is shifted is substantially equal to the horizontal distance between the photosensors 331.

Vertical CCDs 333 having four-phase transport electrodes ϕV1 to ϕV4 are provided between arrays of the photosensors 331 described above. Transfer gates 332 are provided between the vertical CCDs 333 and the photosensors 331. Electrodes of the transfer gates 332 are formed of the transport electrodes ϕV1 and ϕV3 extended thereto. Further, horizontal transport parts 336a, 336b are provided at both ends of the vertical CCDs 333 respectively.

Control pulses from a control circuit 335 are supplied to the aforesaid transfer gates 332, vertical CCDs 333, and horizontal transport parts 336a, 336b. The control circuit 335 changes an imaging mode (a grid imaging mode/a diagonal grid imaging mode) by changing the output sequence of the control pulses.

Figure 22:
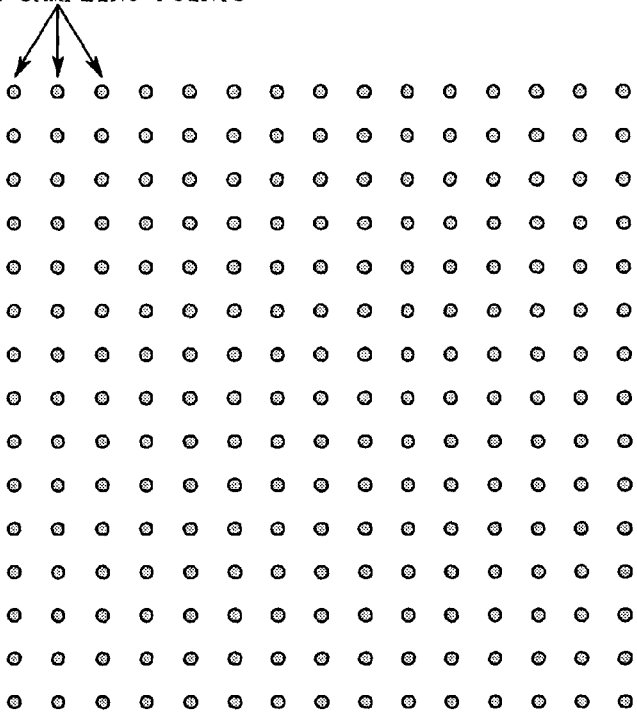
FIG. 22A and FIG. 22B are views showing pixel sampling points in a grid imaging mode and a diagonal imaging mode.
Figure 22:
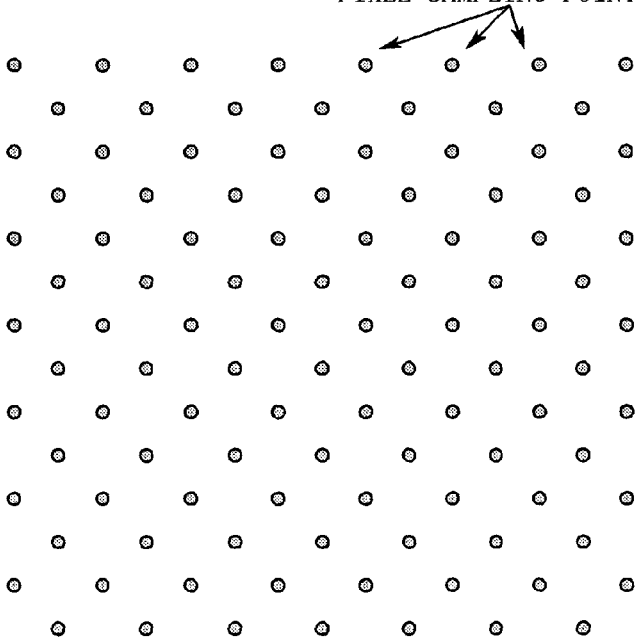

FIG. 22A is a view showing pixel sampling points in this grid imaging mode. In the grid imaging mode, photo signals generated by the respective photosensors 331 are sampled for readout in a grid pattern as shown in this drawing.

FIG. 22B is a view showing pixel sampling points in the diagonal grid imaging mode.

In the diagonal grid imaging mode, the photo signals generated by the respective photosensors 331 are sampled for readout in a diagonal grid pattern as shown in this drawing.

[Wiring of Transport electrodes ϕV1 to ϕV4]

The wiring structure of the transport electrodes ϕV1 to ϕV4 that is an important feature of this embodiment will be explained in detail.

The transport electrodes, two for each one of the photosensors 331, are provided on the vertical CCDs 333 in the image sensor 313. The two transport electrodes thus allotted on the vertical CCD 333 electrically have crosswise connection to those on the vertical CCD 333 adjacent in a horizontal direction as schematically shown in FIG. 21. (Here, ϕV1 and ϕV2 have the crosswise connection and ϕV3 and ϕV4 have crosswise connection.)

As a result, the transport electrodes are arranged in the order of ϕV1, ϕV2, ϕV3, and ϕV4 in the even number arrays. In the odd number arrays, the transport electrodes are arranged in the order of ϕV2, ϕV1, ϕV4, and ϕV3.

The wiring structure of the transport electrodes ϕV1 to ϕV4 as described above imparts the vertical CCDs 333 with the following features.

① The arrangement order of the transport electrodes ϕV1 to ϕV4 in the even number arrays and that in the odd number arrays are made reverse to each other. (Accordingly, the transport direction of signal charges in the odd number arrays is made reverse to that in the even number arrays.)

② Further, the four-phase segments of the vertical CCDs 333 in the even number arrays and the corresponding four-phase segments in the odd number arrays are displaced from each other in the array direction. Accordingly, units of adding-up of the photo signals described later are arranged in a diagonal grid pattern.

Note that in FIG. 21, the transfer gates 332 in the odd number arrays and those in the even number arrays are displaced. However, the positions of the transfer gates 332 can be aligned in the horizontal direction by shifting the transport electrodes in the odd number arrays upward in FIG. 21. Also in this state, the two transport electrodes allotted for each one of the photosensors 331 ϕV1 and ϕV2, ϕV3 and ϕV4) on the vertical CCD 333 have the crosswise connection to those on the vertical CCD 333 adjacent in the horizontal direction (in other words, the requirements of claims 8, 9 are satisfied).

Correspondence Relationship with Embodiment

Hereinafter, the correspondence relationship between matters recited in the claims and this embodiment will be explained.

It should be noted that the correspondence relationship here only presents an example of interpretation for the purpose of reference and is not to be considered as limiting the present invention more than necessary.

Photosensors recited in the claims correspond to the photosensors 331.

A readout section recited in the claims corresponds to the transfer gates 332, the vertical CCDs 333, the horizontal transport parts 336a, the horizontal transport parts 336b, and a control circuit 335.

An optical low pass filter recited in the claims corresponds to the optical LPF 13b.

A color filter array recited in the claims corresponds to the color filter array (refer to FIG. 21) disposed on the light-receiving surface of the image sensor 313.

An image processing section recited in the claims corresponds to an image processing section 19.

Vertical CCDs recited in the claims correspond to the vertical CCDs 333.

First horizontal paths recited in the claims correspond to the horizontal transport parts 336a.

Second horizontal paths recited in the claims correspond to the horizontal transport parts 336b.

[Explanation on Operation of Grid Imaging Mode]

Hereinafter, the operation of the grid imaging mode in the fifth embodiment will be explained.

First, a microprocessor 22, after resetting the photosensors 331 (discharging unnecessary charges), opens a mechanical shutter 14.

After a predetermined exposure period has passed in this state, the microprocessor 22 controls the mechanical shutter 14 to be closed, thereby bringing the light-receiving surface of the image sensor 313 into a light-shielded state. In this light-shielded state, the microprocessor 22 outputs a command signal of the grid imaging mode to the control circuit 335 in the image sensor 313.

According to this command signal of the grid imaging mode, the control circuit 335 applies voltages exceeding a threshold voltage to the transport electrodes φV1.

Figure 23:
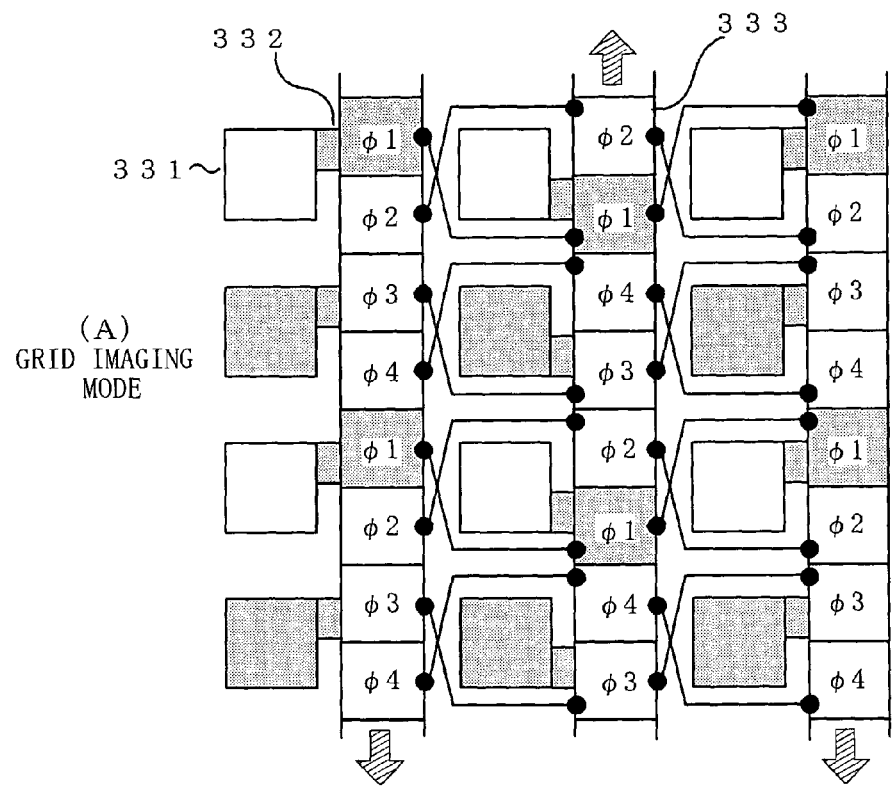
FIG. 23A and FIG. 23B are views explaining a transport operation of the image sensor 313.
Figure 23:
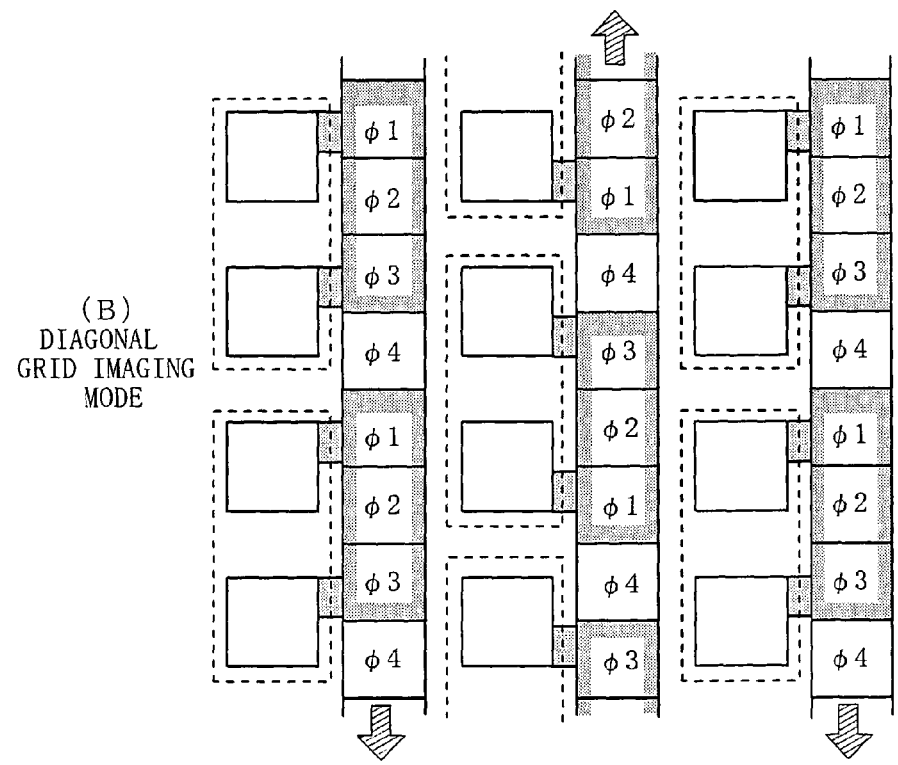

Accordingly, the photo signals are transferred to the segments of the transport electrodes φV1 from the photosensor 331 in every other row (refer to FIG. 23A).

In this state, the control circuit 335 supplies four-phase-driving control pulses to the transport electrodes φV1 to φV4. As a result, on the vertical CCDs 333 in the odd number arrays, the photo signals on every other row are vertically transported in sequence toward the horizontal transport parts 336a. The horizontal transport parts 336a fetch the photo signals corresponding to one row outputted from the vertical CCDs 333 in the odd number arrays. In this state, the control circuit 335 supplies control pulses for horizontal transport to the horizontal transport parts 336a to horizontally transport the photo signals in sequence. Through the repetition of such operations, image signals corresponding to the photo signals in the odd number arrays are outputted from the horizontal transport parts 336a.

Meanwhile, on the vertical CCDs 333 in the even number arrays, the photo signals are vertically transported in sequence toward the horizontal transport parts 336b. The horizontal transport parts 336b fetch the photo signals outputted from the vertical CCDs 333 in the even number arrays in a unit of a row. In this state, the control circuit 335 supplies control pulses for horizontal transport to the horizontal transport parts 336b to horizontally transport the photo signals in sequence. Through such operations, image signals corresponding to the photo signals in the even number arrays are outputted from the horizontal transport parts 336b.

Through such transport operations, the image signals of a first field (the image signals on every other row) in the even number arrays and those in the odd number arrays are separately read out in parallel.

The readout image signals in parallel are tentatively recorded in a buffer memory 17 after being processed in parallel through an A/D converting section 15 and a signal processing section 16.

Next, the control circuit 335 performs a similar readout for image signals of a second field (image signals in every other row being the rest).

Through the two interlace transport operations, image data having pixels arranged in a grid pattern are accumulated in the buffer memory 17.

The image processing section 19, while exchanging the image data in the buffer memory 17 via a bus 18, subjects the image data to two-dimensional image processing such as color interpolation and pixel interpolation. The processed image data are compressedly stored on a memory card 21 via a recording section 20.

[Features of Grid Imaging Mode]

Figure 24:
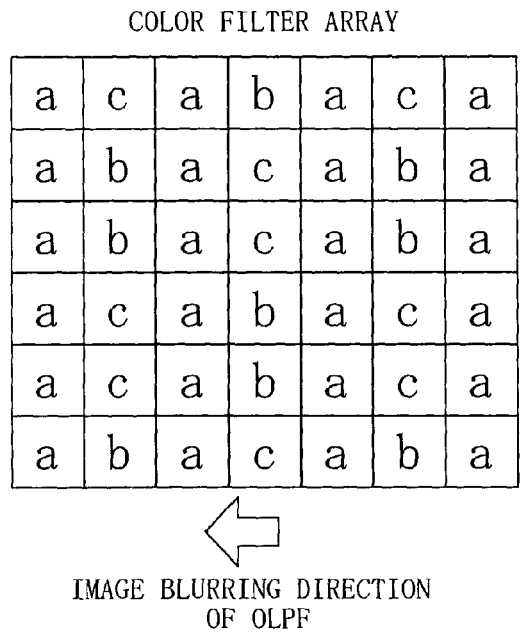
FIG. 24 is a view showing a color pattern of image data read out in the grid imaging mode.
Figure 25:
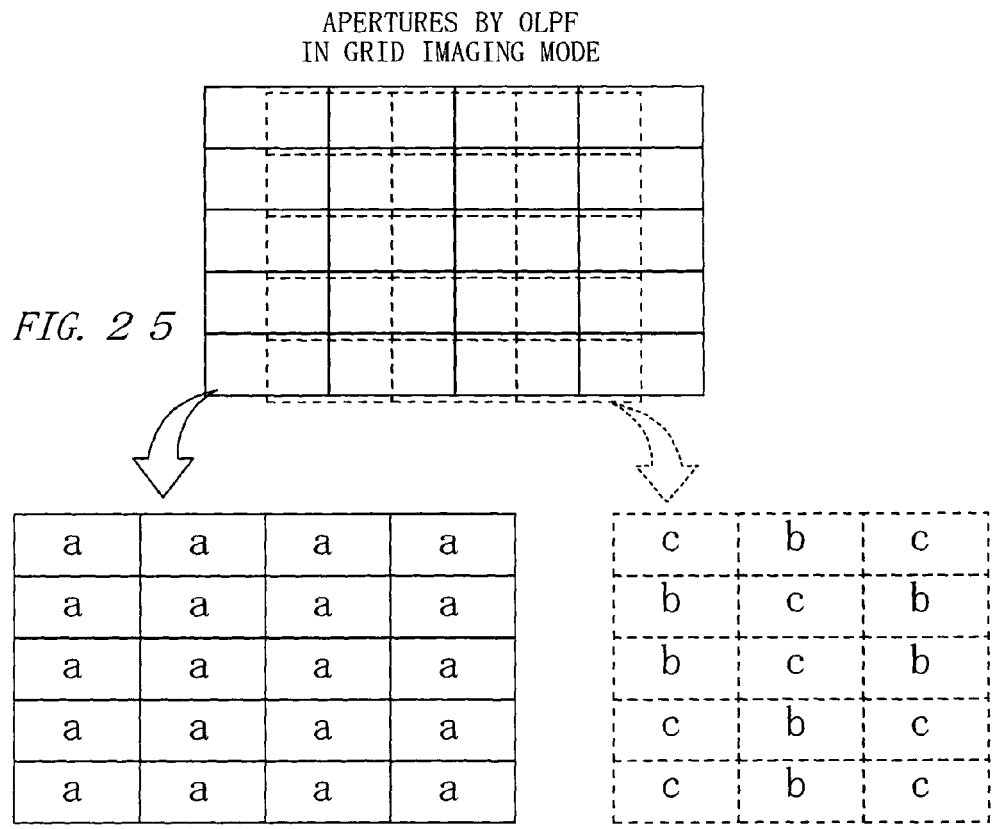
FIG. 25 is a view showing apertures in the grid imaging mode.

Here, features of the above-described grid imaging mode will be explained. FIG. 24 shows a color pattern of the image data read out in the grid imaging mode. FIG. 25 shows apertures in the grid imaging mode.

The image blurring effect by the optical LPF 13b causes the apertures in the grid imaging mode to be in the shape corresponding to two apertures of the on-chip microlenses connected in a horizontal direction.

As a result, the apertures of components in color a cover the light-receiving surface, leaving almost no space uncovered as shown in FIG. 25. The apertures of colors b and colors c similarly cover the light-receiving surface.

Since the apertures thus cover the light-receiving surface efficiently, it is possible to sufficiently reduce pseudo signals (such as pseudo colors) only with the optical LPF 13b in a single direction. Accordingly, the optical LPF 13b can be made thin, which makes it possible to greatly enhance optical performance of the electronic camera 11.

In this embodiment, the photo signals are read out in parallel in the even number arrays and in the odd number arrays. This results in achieving good effects as decrease in image readout time and in horizontal transport frequency of the image sensor 313.

[Explanation on Operation of Diagonal Grid Imaging Mode]

Next, the operation of a diagonal grid imaging mode in the fifth embodiment will be explained.

The microprocessor 22 outputs a command signal of the diagonal grid imaging mode to the control circuit 335 in the image sensor 313. According to this command signal, the control circuit 335 controls an electronic shutter of the image sensor 313. (At this time, the microprocessor 22 may control the exposure period through the parallel use of the mechanical shutter 14.)

When a predetermined exposure period has passed, the control circuit 335 applies voltages exceeding a threshold voltage to the transport electrodes φV1 and φV3. Accordingly, the photo signals on the photosensors 331 are transferred to the segments of φV1 and φV3 via the transfer gates 332. In this state, the control circuit 335 applies voltages to the transport electrodes φV2 to connect potential wells immediately under the transport electrodes φV1 to φV3. As a result, on the connected potential wells, the photo signals are added up in each block of the diagonal grid pattern shown by the dotted line in FIG. 23B. A signal resulting from the adding-up of the photo signals will be hereinafter referred to as "a synthesized signal".

Subsequently, the control circuit 335 supplies four-phase-driving control pulses to the transport electrodes φV1 to φV4. At this time, on the vertical CCDs 333 in the odd number arrays, the synthesized signals are vertically transported toward the horizontal transport parts 336a. The horizontal transport parts 336a fetch the synthesized signals outputted from the vertical CCDs 333 in the odd number arrays in a unit of a row. In this state, the control circuit 335 supplies control pulses for horizontal transport to the horizontal transport parts 336a to horizontally transport the synthesized signals in sequence. Through such operations, image signals corresponding to the synthesized signals in the odd number arrays are outputted from the horizontal transport parts 336a.

On the vertical CCDs 333 in the even number arrays, the synthesized signals are vertically transported in the reverse direction toward the horizontal transport parts 336b. The horizontal transport parts 336b fetch the synthesized signals outputted from the vertical CCDs 333 in the even number arrays in a unit of a row. In this state, the control circuit 335 supplies control pulses for horizontal transport to the horizontal transport parts 336b to horizontally transport the synthesized signals in sequence. Through such operations, image signals corresponding to the synthesized signals in the even number arrays are outputted from the horizontal transport parts 336b.

Through a series of such transport operations, the image signals (namely, draft images) having pixels arranged in a diagonal grid pattern are separately read out in parallel in the even number arrays and in the odd number arrays. These image signals, after being processed in parallel through the A/D converting section 15 and the signal processing section 16, are tentatively recorded in the buffer memory 17.

The image processing section 19 performs two dimensional image processing such as color interpolation and pixel interpolation on the draft images in the buffer memory 17. The draft images subjected to the image processing are compressedly stored on the memory card 21 via the recording section 20.

Incidentally, the draft images are also used for purposes such as monitor display and a control operation, besides being used as the aforesaid images for storage.

[Features of Diagonal Grid Imaging Mode]

Here, the features of the diagonal grid imaging mode described above will be explained.

Figure 26:
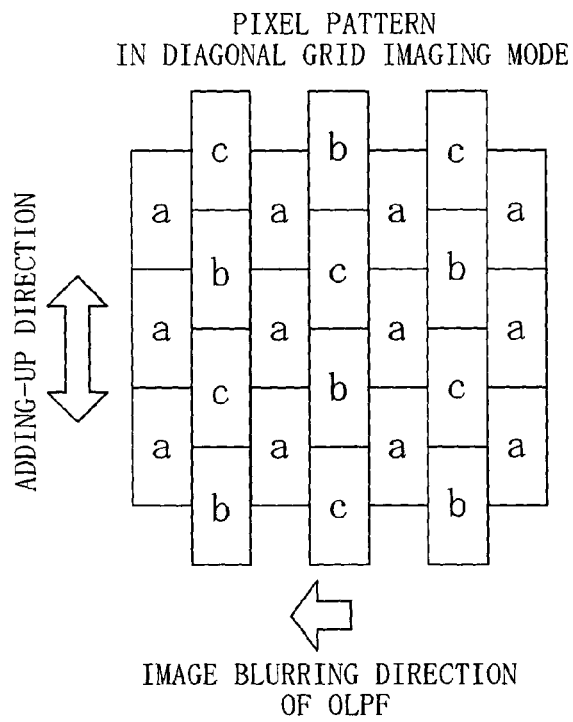
FIG. 26 is a view showing a color pattern of synthesized signals read out in the diagonal grid imaging mode.
Figure 27:
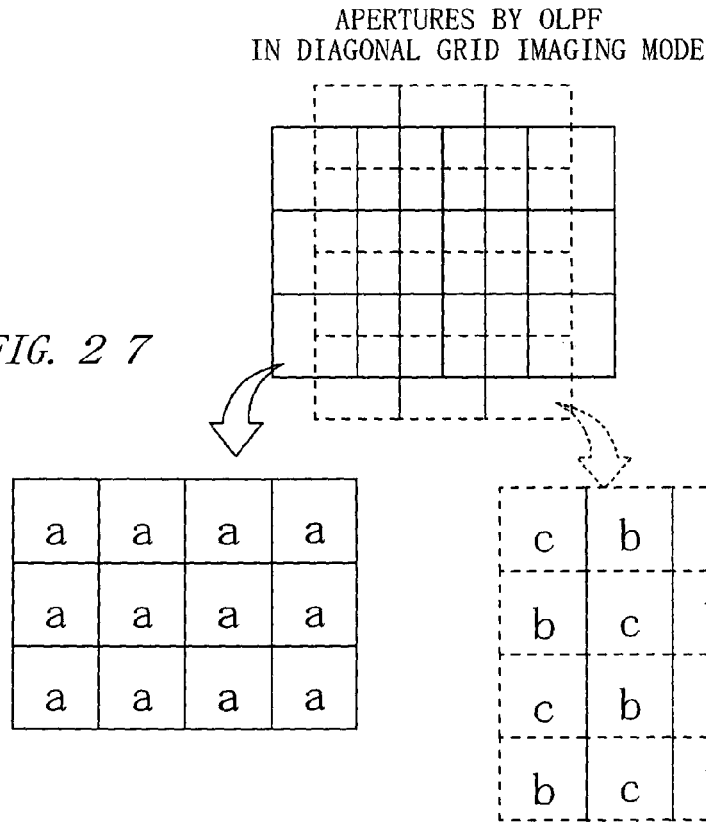
FIG. 27 is a view showing apertures in the diagonal grid imaging mode.

FIG. 26 shows a color pattern of the synthesized signals read out in the diagonal grid imaging mode. FIG. 27 shows apertures of the diagonal imaging mode.

Owing to "the adding-up of the photo signals" and "the image blurring effect by the optical LPF 13b", each of the apertures in the diagonal grid imaging mode is enlarged to a range corresponding to 2×2 apertures of the on-chip microlenses. At this time, the apertures in color a cover the entire light-receiving surface, leaving almost no space uncovered. The apertures in color b and color c cover the light-receiving surface in a checkered pattern.

Since the apertures thus cover the light-receiving surface efficiently, it is possible to sufficiently reduce pseudo signals (such as pseudo colors) only with the optical LPF 13b in a single direction, similarly to the grid imaging mode described above.

Particularly, because the apertures here are in a substantially square shape as shown in FIG. 27, isotropy is very high. Therefore, image data uniform in sharpness in vertical and horizontal directions are obtainable.

Further, since the apertures are arranged in a diagonal grid pattern, the shortest distance between the centers of the apertures in the vertical and horizontal directions becomes substantially equal to the horizontal distance and the vertical distance between the photosensors 331. Consequently, even though the number of the total pixels is reduced to half compared with that in the grid imaging mode described above, an information amount in the horizontal and vertical directions is large, so that the draft images excellent in sharpness are obtainable.

Moreover, the color pattern of the apertures shown in FIG. 27 is equivalent to a pixel pattern of a two-board imaging device (in which an imaging device in color G and an imaging device in an RB checkered pattern are disposed with pixel displacement. The color pattern of the apertures shown in FIG. 27 is also equivalent to a color pattern obtained by diagonally turning a bayer pattern by 45°. Therefore, as color interpolation in the grid imaging mode, the interpolation of the crosspoints of the diagonal grid pattern is performed in the bayer pattern by well known color interpolation, and thereafter crosspoints left uninterpolated due to the change into the diagonal grid pattern are interpolated, so that images with a grid pattern can be obtained. Needless to say, the crosspoints left uninterpolated due to the change into the diagonal grid pattern may be directly interpolated.

Moreover, in this embodiment, the synthesized signals in the even number arrays and those in the odd number arrays are separately read out in parallel. Besides, in the diagonal grid imaging mode, the number of the total pixels is reduced to half compared with that in the grid imaging mode. Consequently, in the diagonal grid imaging mode, it is possible to reduce the time required for image readout to half.

In this embodiment, the draft images with the diagonal grid pattern are obtainable. In order to use the draft images for monitor display, pixels corresponding to the crosspoints are picked up from the pixels in the diagonal grid pattern to generate monitor display images.

Through such a process, grid-pattern data for monitor display can be quickly generated from the draft images with the diagonal grid pattern.

Next, yet another embodiment will be explained.

Sixth Embodiment

A sixth embodiment is an embodiment relating to a monochrome electronic camera. The hardware configuration of this electronic camera is the same as that in the fifth embodiment except that the color filter array is omitted therefrom. Incidentally, the optical LPF 13b may be provided or omitted depending on the intended purpose such as moiré removal. Therefore, the same reference symbols and numerals are used to designate the same constituent elements as those in the fifth embodiment, and repeated explanation on the configuration thereof will be omitted.

[Explanation on Grid Imaging Mode]

Hereinafter, a monochrome grid imaging mode will be explained.

In the grid imaging mode, monochrome image signals having pixels arranged in a square grid pattern are read out through two interlace transport operations. Also in the transport operation, photo signals in even number arrays and those in odd number arrays are separately read out in parallel, similarly to the fifth embodiment (FIG. 23A). This results in obtaining effects as the reduction in the image readout time and in the horizontal transport frequency of an image sensor 313 also in the grid imaging mode of the sixth embodiment.

The monochrome image signals thus read out are converted to monochrome image data through an A/D converting section 15 and a signal processing sections 16. The monochrome image data are compressedly stored on a memory card 21 by a recording section 20.

[Explanation on Diagonal Grid Imaging Mode]

Hereinafter, the readout operation of monochrome draft images using a diagonal grid imaging mode will be explained.

Figure 28:
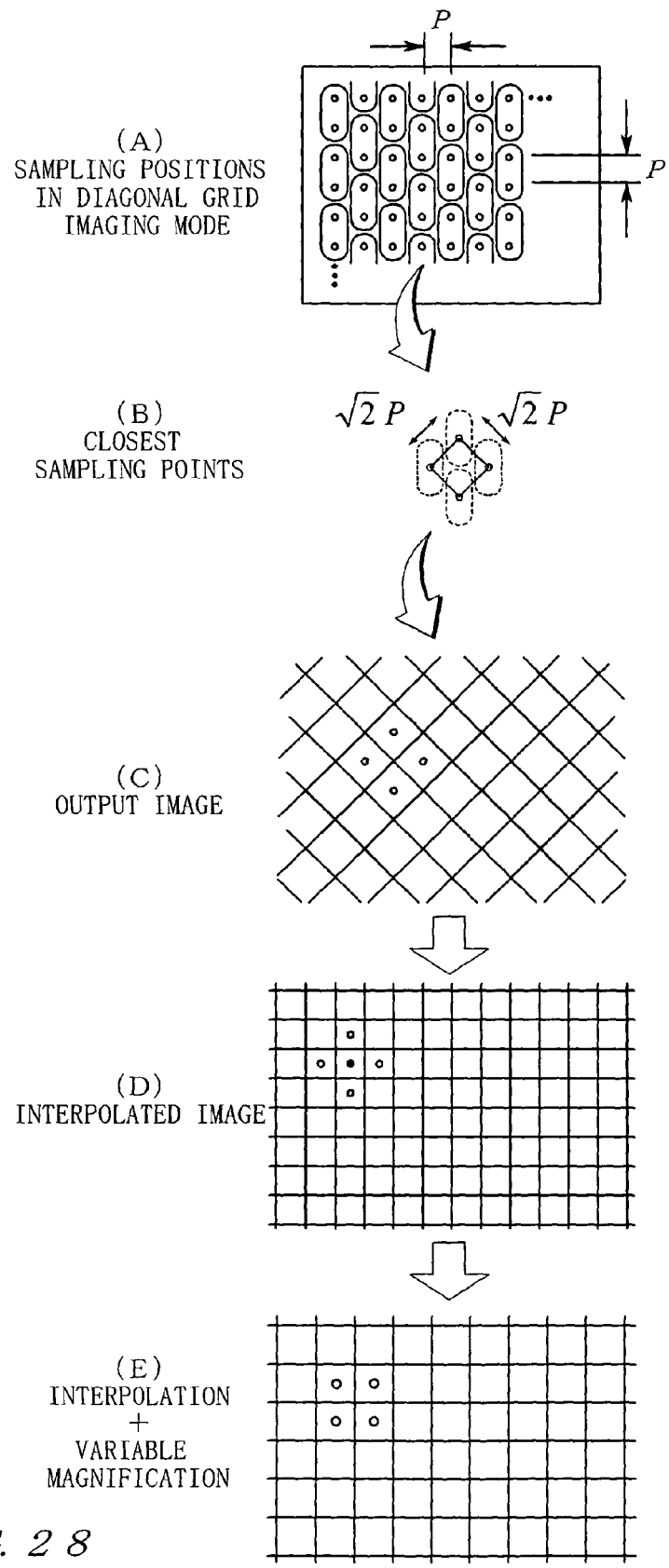
FIG. 28A, FIG. 28B, FIG. 28C, FIG. 28D, and FIG. 28E are views explaining the operation of a sixth embodiment.

In the diagonal grid imaging mode, photo signals are first added up in each unit of a diagonal grid pattern shown in FIG. 28A on a light-receiving surface. The draft images generated by the adding-up operation are read out from an image sensor 313 by progressive transport.

In this transport operation, synthesized signals, the number of which is reduced in advance, in the even number arrays and those in the odd number arrays are separately read out in parallel, similarly to the fifth embodiment (FIG. 23B). As a result, it is able to attain great effects such as substantial reduction in the image readout time of the draft images also in the diagonal grid imaging mode of the sixth embodiment.

FIG. 28B is a view showing closest sampling points of the draft images. Assuming that the pixel pitch of photosensors 331 is P, the diagonal pitch of the closest sampling points is $\sqrt{2} \cdot P$.

Here, the shortest distance between the closest sampling points in vertical and horizontal directions is equal to the pitch P of the photosensors 331. Accordingly, even though the total number of the pixels is reduced to half compared with that in the grid imaging mode described above, an information amount in the vertical and horizontal directions is large, so that image data excellent in sharpness can be obtained. Sharpness equivalent to that in the grid imaging mode can be achieved in, for example, images with vertical stripes or horizontal stripes.

FIG. 28C is a view showing a pixel pattern of image signals outputted in the diagonal grid imaging mode. An image processing section 19 fetches this diagonal grid pixel pattern and interpolates pixels positioned at the centers of the crosspoints of the diagonal grid pattern.

FIG. 28D is a view showing a pixel pattern after this interpolation. As an interpolation method in this case, an interpolation method of simply leveling off upper, lower, left, and right pixels may be used. Alternatively, an interpolation method of judging local similarity of images and increasing weighting in a similarity direction may be used.

The interpolated image shown in FIG. 28D has such a drawback that the image size (the number of vertical and horizontal pixels) is large since the original number of pixels are doubled, so that the image is heavy in terms of image processing, though excellent in sharpness, which results in large memory consumption. Therefore, efficiency is realized when the image processing section 19 has a mode for general purposes in which the number of pixels of this interpolated image is variably magnified (here ¾ multiple in the vertical and horizontal direction) to the number of pixels appropriate for an information amount (for example, approximately the number of sampled pixels).

FIG. 28E is a view showing a pixel pattern after such variable magnification. As such variable magnification, an interpolation method such as a bi-cubic method, a bi-linear method, a nearest neighbor method, or the like is usable. Further, the image in FIG. 28E may be directly generated without going through the state in FIG. 28D, by the direct use of any of these interpolation methods for the diagonal grid pattern shown in FIG. 28C.

The draft images thus subjected to the variable magnification process are compressedly stored on the memory card 21 by the recording section 20.

The draft images here are also usable for monitor display, control operation, and so on, besides being used as the images for storage described above.

Next, yet another embodiment will be explained.

Seventh Embodiment

A seventh embodiment describes a case in which draft images with a grid pixel pattern are read out from photosensors arranged in a diagonal grid pattern.

Figure 29:
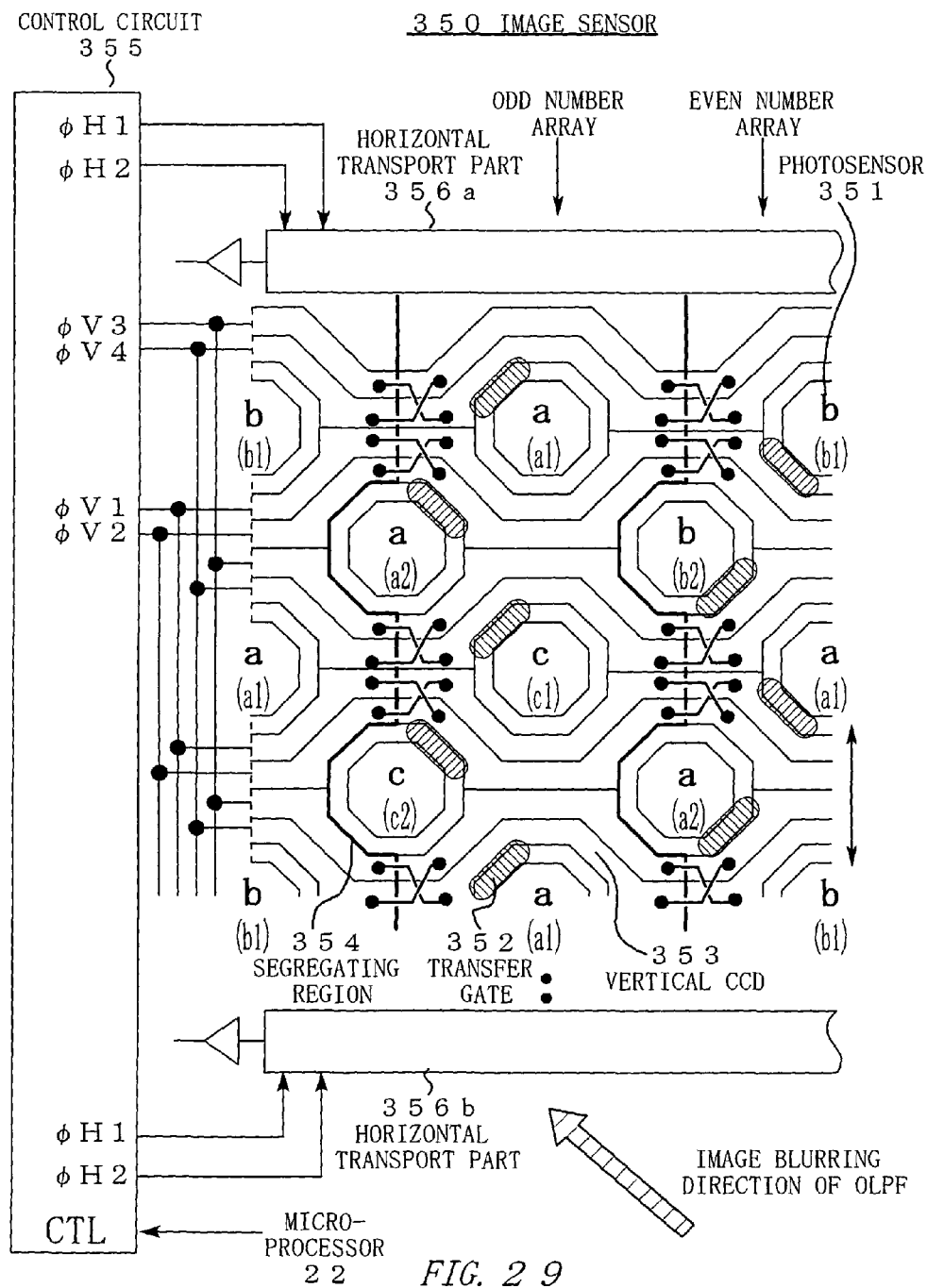
FIG. 29 is a view showing an image sensor 350.

The feature of an electronic camera in the seventh embodiment is that the image sensor 13 shown in FIG. 1 is replaced by an image sensor 350 shown in FIG. 29. The hardware configuration in other respects is the same as that in the fifth embodiment, and therefore, the explanation thereof will be omitted here.

The structure of the image sensor 350 will be explained below, using FIG. 29.

Photosensors 351 are arranged in a diagonal grid pattern on a light-receiving surface of the image sensor 350. On-chip microlenses (not shown) and a color filter array are disposed on the photosensors 351. A color pattern of this color filter array is the same as the color pattern of the color filter array in the fifth embodiment (FIG. 24) diagonally turned by 45°.

An optical LPF is disposed on this color filter array. An image blurring direction by this optical LPF is substantially perpendicular to an adding-up direction which will be described later. Further, the distance by which the optical image is shifted by this optical LPF is substantially equal to a diagonal pitch of the photosensors 351.

Moreover, a plurality of segregating regions (channel stops) 354 are provided on the light-receiving surface. These segregating regions 354 segregate the photosensors 351 into zigzag array units.

Vertical CCDs 353 having four-phase transport electrodes φV1 to φV4 are provided to be sandwiched between the segregating regions 354 adjacent to each other. Each of the vertical CCDs 353 is constituted of an array of segments provided between the photosensors 351 that are arranged in a zigzagging manner.

Further, transfer gates 352 are provided between the photosensors 351 and the vertical CCDs 353. These transfer gates 352 are constituted of the transport electrodes φV1 and the transport electrodes φV3 extended to the photosensors 351. Horizontal transport parts 356a, 356b are provided at both ends of the vertical CCDs 353 respectively.

The aforesaid transfer gates 352, vertical CCDs 353, and horizontal transport parts 356a, 356b are supplied with control pulses from a control circuit 355. The control circuit 355 changes the output sequence of the control pulses to change an imaging mode (a diagonal imaging mode/a grid imaging mode).

Figure 30:
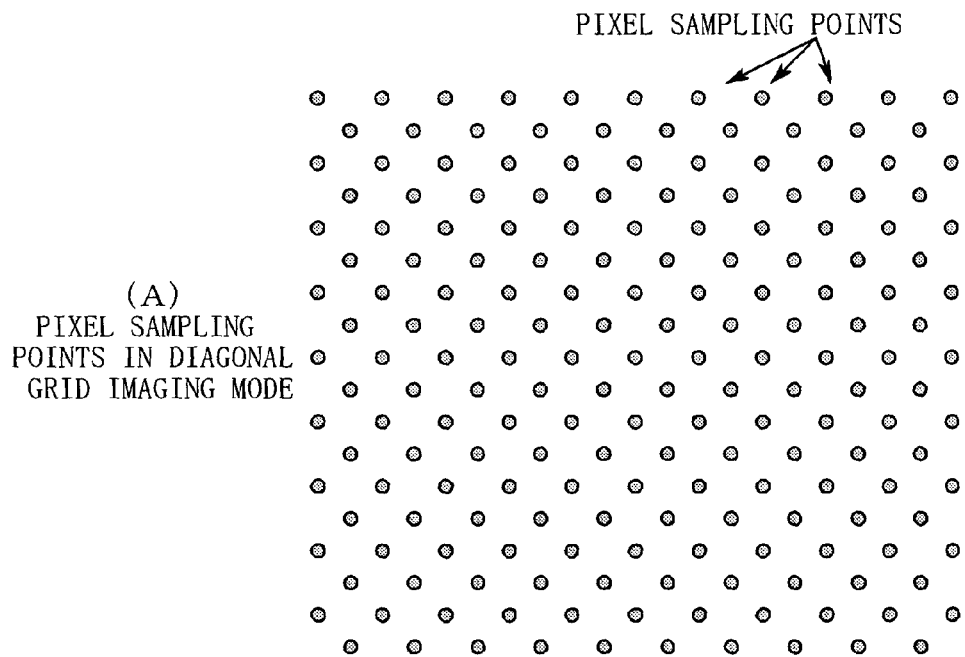
FIG. 30A and FIG. 30B are views showing pixel sampling points in a diagonal grid imaging mode and a grid imaging mode.
Figure 30:
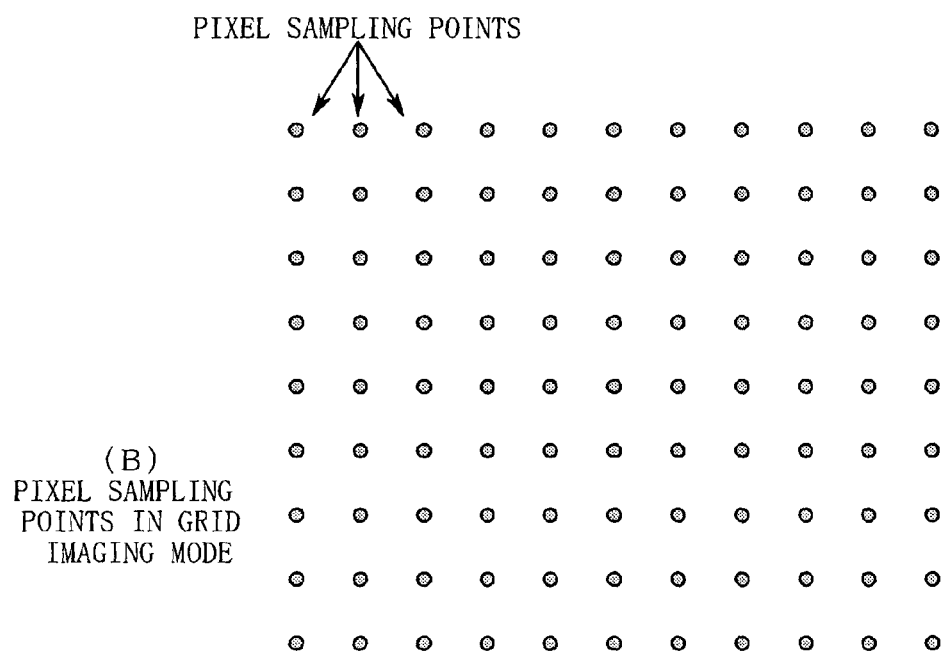

FIG. 30A shows pixel sampling points in this diagonal grid imaging mode. In the diagonal grid imaging mode, photo signals generated by the respective photosensors 351 are sampled for readout in a diagonal grid pattern, as shown in this drawing.

FIG. 30B shows pixel sampling points in the grid imaging mode. In the grid imaging mode, as shown in this drawing, the photo signals generated by the respective photosensors 351 are sampled in a grid pattern for readout. [Wiring of Transport electrodes φV1 to φV4]

Hereinafter, the wiring structure of the transport electrodes φV1 to φV4 that is an important feature of this embodiment will be explained in detail.

Two transport electrodes per one photosensor 351 are provided on the vertical CCDs 353 in the image sensor 313. The two transport electrodes allotted for each one of the photosensors 351 on the vertical CCD 353 and those on the vertical CCD 353 adjacent in a horizontal direction electrically have crosswise connection to each other, as schematically shown in FIG. 29. (Here, φV1 and φV2 have the crosswise connection and φV3 and φV4 has the crosswise connection. In FIG. 29, the intersection state is schematically shown for easy understanding. However, the intersection is preferably made within the width of the segregating regions 354 (channel stops). Such structure enables effective prevention of the disturbance of potential wells caused by the intersection.)

As a result, the transport electrodes are arranged in the order of φV1, φV2, φV3, and φV4 in even number arrays. In odd number arrays, the transport electrodes are arranged in the order of φV2, φV1, φV4, and φV3.

As a result, the arrangement order of the transport electrodes φV1 to φV4 in the even number arrays is reverse to that in the odd number arrays. (Accordingly, the transport direction of signal charges in the odd number arrays is reverse to that in the even number arrays.

[Relationship with Claims]

The relationship between matters recited in the claims and this embodiment will be explained below. It should be noted that the relationship here only presents an example of interpretation for the purpose of reference and is not to be considered as limiting the present invention more than necessary.

Photosensors recited in the claims correspond to the photosensors 351.

A readout section recited in the claims corresponds to the transfer gates 352, the vertical CCDs 353, the horizontal transport parts 356a, 356b, and the control circuit 355.

A color pattern of a color filter array recited in the claims is that shown in FIG. 29.

An optical low pass filter recited in the claims corresponds to an optical LPF disposed on the light-receiving surface of the image sensor 350.

The color filter array recited in the claims corresponds to the color filter array (refer to FIG. 29) disposed on the light-receiving surface of the image sensor 350.

An image processing section recited in the claims corresponds to an image processing section 19.

Vertical CCDs recited in the claims correspond to the vertical CCDs 353.

First horizontal transport parts recited in the claims correspond to the horizontal transport parts 356a.

Second horizontal transport parts recited in the claims correspond to the horizontal transport parts 356b.

[Explanation on Operation in Grid Imaging Mode]

Hereinafter, the operation in a grid imaging mode in the image sensor 350 will be explained, using FIG. 29.

A microprocessor 22 outputs a command signal of the grid imaging mode to the control circuit 355 in the image sensor 350. According to this command signal, the control circuit 355 controls an electronic shutter of the image sensor 350. (Incidentally, at this time, the microprocessor 22 may control the exposure period through the parallel use of a mechanical shutter 14.)

When photo signals are accumulated on the photosensors 351 after a predetermined exposure period has passed, the control circuit 355 applies voltages exceeding a threshold voltage to the transport electrodes φV1 and φV3. Accordingly, the photo signals on the photosensors 351 are transferred to the segments of φV1 and φV3 via the transfer gates 352. In this state, the control circuit 355 applies voltages to φV2 to connect potential wells right under the transport electrodes φV1 to φV3. As a result, on the connected potential wells, the photo signals are added up in each block of a grid pattern, so that synthesized signals as shown in FIG. 31 are generated.

Subsequently, the control circuit 355 supplies four-phase-driving control pulses to the transport electrodes φV1 to φV4. At this time, on the vertical CCDs 353 in odd number arrays, the synthesized signals are vertically transported toward the horizontal transport parts 356a. The horizontal transport parts 356a fetch only one row of the synthesized signals outputted from the vertical CCDs 353 in the odd number arrays. In this state, the control circuit 355 supplies control pulses for horizontal transport to the horizontal transport parts 356a to horizontally transport the synthesized signals in sequence. Through the repetition of such operations, image signals corresponding to the synthesized signals in the odd number arrays are outputted from the horizontal transport parts 356a.

Meanwhile, on the vertical CCDs 353 in even number arrays, the synthesized signals are vertically transported toward the horizontal transport parts 356b in sequence. The horizontal transport parts 356b fetch the synthesized signals outputted from the vertical CCD 353 in the even number arrays in a unit of a row. In this state, the control circuit 355 supplies control pulses for horizontal transport to the horizontal transport parts 356b to horizontally transport the synthesized signals in sequence. Through such operations, image signals corresponding to the synthesized signals in the even number arrays are outputted from the horizontal transport parts 356b.

Through such transport operations, the image signals (namely, draft images) having pixels arranged in a grid pattern in the even number arrays and those in the odd number arrays are separately read out in parallel. These image signals are processed in parallel through an A/D converting section 15 and a signal processing section 16, and thereafter, tentatively recorded in a buffer memory 17. The image processing section 19 performs two-dimensional image processing such as color interpolation on the draft images in this buffer memory 17. The processed image data are compressedly stored on a memory card 21 via a recording section 20.

The draft images here are usable for monitor display, control operation, and so on, besides being used as the images for storage as described above.

[Features of Grid Imaging Mode]

FIG. 32 is a view showing apertures of the grid imaging mode.

Each of the apertures in the grid imaging mode is enlarged to a range corresponding to four apertures of the on-chip microlenses due to "the adding-up of the photo signals" and "the image blurring effect by the optical LPF". Here, the apertures in color a cover the entire light-receiving surface, leaving almost no space uncovered. The apertures in color b and color c cover the light-receiving surface in a checkered pattern.

Since the apertures thus cover the light-receiving surface efficiently, it is possible to sufficiently reduce pseudo signals (such as pseudo colors) only with the optical LPF in a single direction.

Further, as shown in FIG. 32, the apertures are substantially in a rhombus shape and are thus very high in isotropy. This makes it possible to obtain draft images uniform in sharpness in vertical and horizontal directions.

The color pattern of the apertures shown in FIG. 31 is equivalent to a pixel pattern of a two-board imaging device (in which an imaging device in color G and an imaging device in an RB checkered pattern are disposed with the pixel displacement. The color pattern of the apertures shown in FIG. 31 is also equivalent to a color pattern of a bayer pattern. Therefore, it is possible to adopt, as color interpolation in the grid imaging mode, detailed color interpolation executed in the two-board imaging device and the bayer pattern.

Moreover, in this embodiment, the draft images in the even number arrays and those in the odd number arrays are separately read out in parallel. Further, in this grid imaging mode, the number of total pixels is reduced to half by the adding-up on the light-receiving surface. This makes it possible to greatly reduce the time required for reading the draft images out in the grid imaging mode of the seventh embodiment.

Moreover, in this embodiment, the draft images with the grid pattern are obtainable. Therefore, the draft images can be stored as they are without being subjected to pixel pattern conversion. When necessary, images for monitor display can be generated by a simple variable magnification process of the draft images.

[Explanation on Operation of Diagonal Grid Imaging Mode]

Next, the operation of a diagonal grid imaging mode in the seventh embodiment will be explained.

First, after the mechanical shutter 14 is closed, the microprocessor 22 outputs a command signal of the diagonal grid imaging mode to the control circuit 355 in the image sensor 350.

According to the command signal of the diagonal grid imaging mode, the control circuit 355 applies voltages exceeding a threshold voltage to the transport electrodes φV1. Then, the photo signals on the photosensors 351 adjacent to the transport electrodes φV1 are transferred to the segments of the transport electrodes φV1 via the transfer gates 352. In this state, the control circuit 355 drives the vertical CCDs 353 and the horizontal transport parts 356a, 356b to read out the photo signals in the odd number arrays and those in the even number arrays on the vertical CCDs 353 separately in parallel.

Through such transport operations, image data of a first field are first read out. The image data of the first field are processed through the A/D converting section 15 and the signal processing section 16 and thereafter, tentatively recorded in the buffer memory 17. Subsequently, the control circuit 355 performs similar image data readout operations of a remaining second field.

Figure 33:
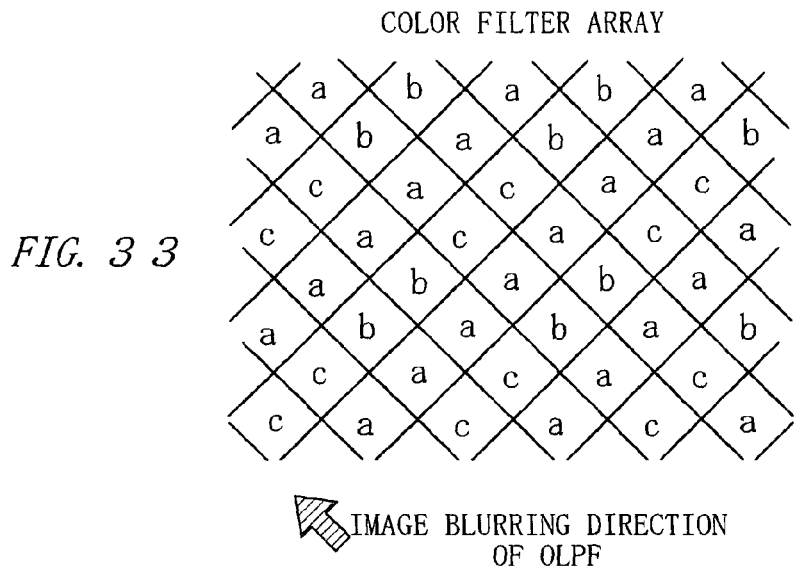
FIG. 33 is a view showing a color pattern of image data read out in the diagonal grid imaging mode.

Through the two interlace transport operations, the image data shown in FIG. 33 are accumulated in the buffer memory 17.

The image processing section 19 performs two-dimensional image processing such as color interpolation and pixel interpolation on the image data in this buffer memory 17. The processed image data are compressedly stored on the memory card 21 via the recording section 20.

[Features of Diagonal Grid Imaging Mode]

Figure 34:
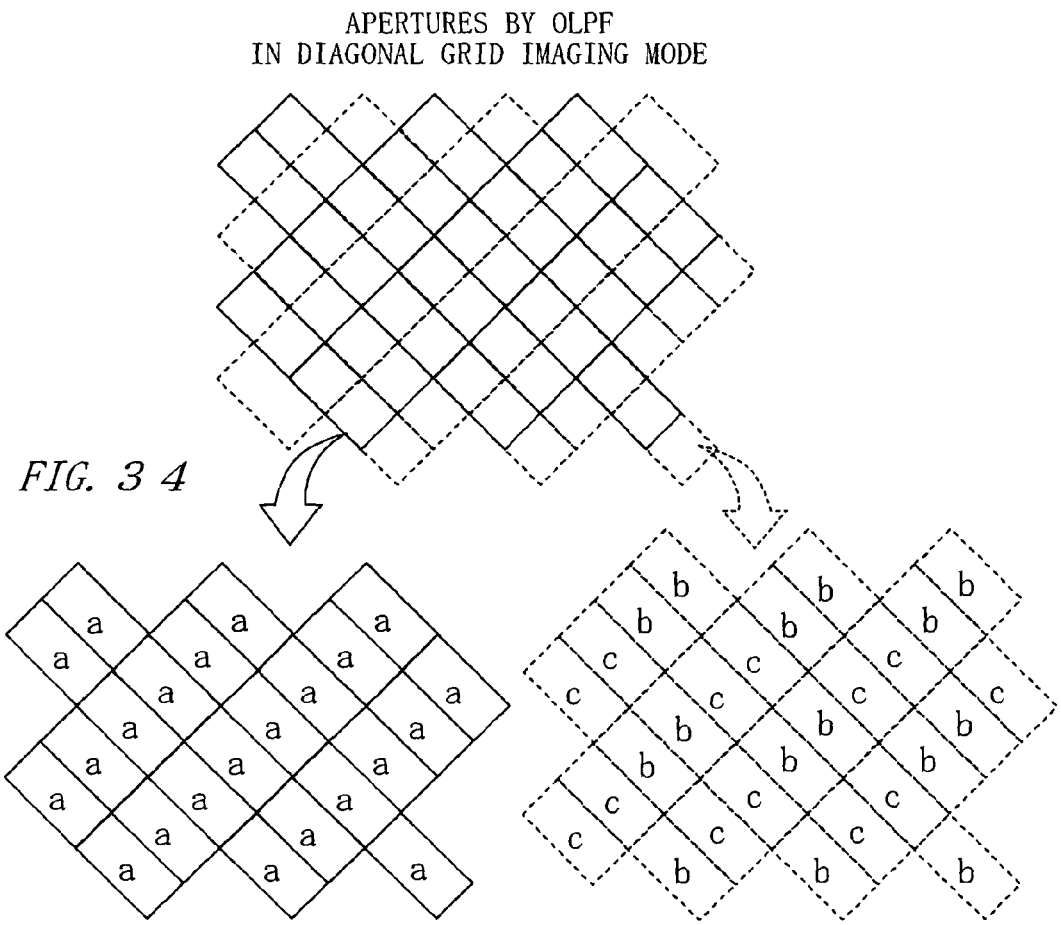
FIG. 34 is a view showing apertures in the diagonal grid imaging mode.

FIG. 34 is a view showing apertures in the diagonal grid imaging mode.

By the image blurring effect by the optical LPF, each of the apertures in the diagonal grid imaging mode has a shape corresponding to two apertures of the on-chip microlenses connected in a diagonal direction.

As a result the apertures with components in color a cover the light-receiving surface, leaving almost no space uncovered. Meanwhile, the apertures in color b and color c also cover the light-receiving surface. Since the apertures thus cover the light-receiving surface efficiently, it is possible to sufficiently reduce pseudo signals (such as pseudo colors) only with the optical LPF in a single direction.

Further, in this embodiment, the photo signals in the even number arrays and those in the odd number arrays are read out separately in parallel. As a result, effects such as reduction in the image readout time can be obtained in the diagonal grid imaging mode.

Next, yet another embodiment will be explained.

Eighth Embodiment

An eighth embodiment is an embodiment relating to a monochrome electronic camera. The hardware configuration of this electronic camera is the same as that of the seventh embodiment except that the color filter array and the optical LPF in the seventh embodiment are omitted. Therefore, the same reference numerals and symbols are used to designate the same constituent elements as those in the seventh embodiment, and repeated explanation of the configuration will be omitted.

[Explanation on Grid Imaging Mode]

Hereinafter, a grid imaging mode will be explained.

Figure 35:
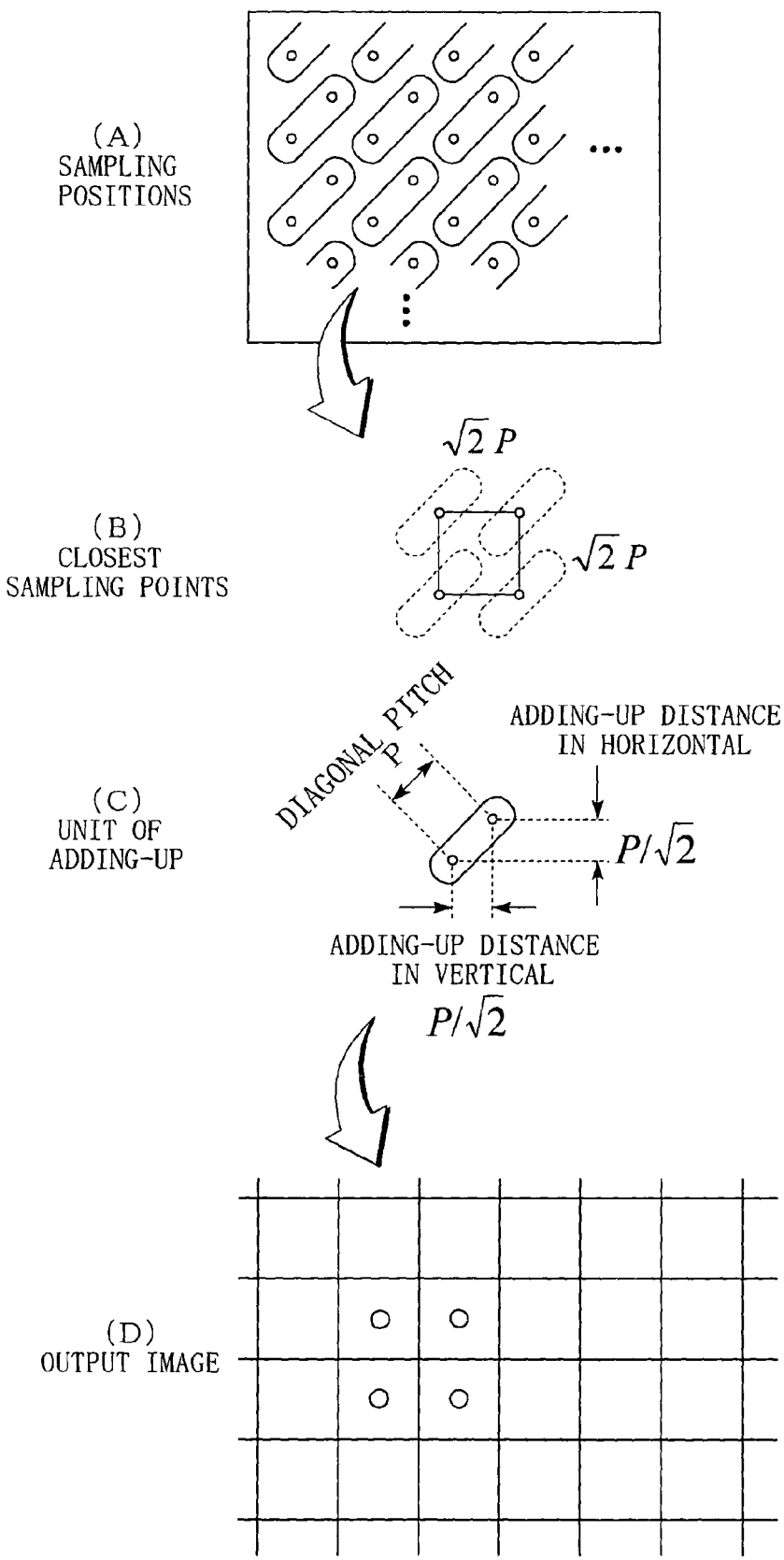
FIG. 35A, FIG. 35B, FIG. 35C, and FIG. 35D are views explaining the operation of a grid imaging mode in an eighth embodiment.

In the grid imaging mode, photo signals are added on a light-receiving surface in each area of a grid pattern shown in FIG. 35A. Draft images generated by this adding-up in even number arrays and those in odd number arrays are separately transported in a progressive manner from an image sensor 313.

FIG. 35B shows closest sampling points of the draft images. Assuming that the diagonal pitch of photosensors 351 is P, the horizontal distance and the vertical distance between the closest sampling points equal to $\sqrt{2} \cdot P$.

FIG. 35C shows a unit of adding-up of the draft images.

FIG. 35D shows a pixel pattern of the draft images.

In this case, the draft images are arranged in a square pattern. When high-definition images are processed by an external processing unit (such as a personal computer) having a high power and the draft images are processed by an ASIC (IC for specific use) in the camera, the square pattern of the draft images is advantageous in that the ASCI processing is not complicated.

[Explanation on Diagonal Grid Imaging Mode]

Next, a diagonal grid imaging mode will be explained.

In the diagonal grid imaging mode, monochrome image signals having pixels arranged in a diagonal grid pattern are read out through two interlace transport operations.

Figure 36:
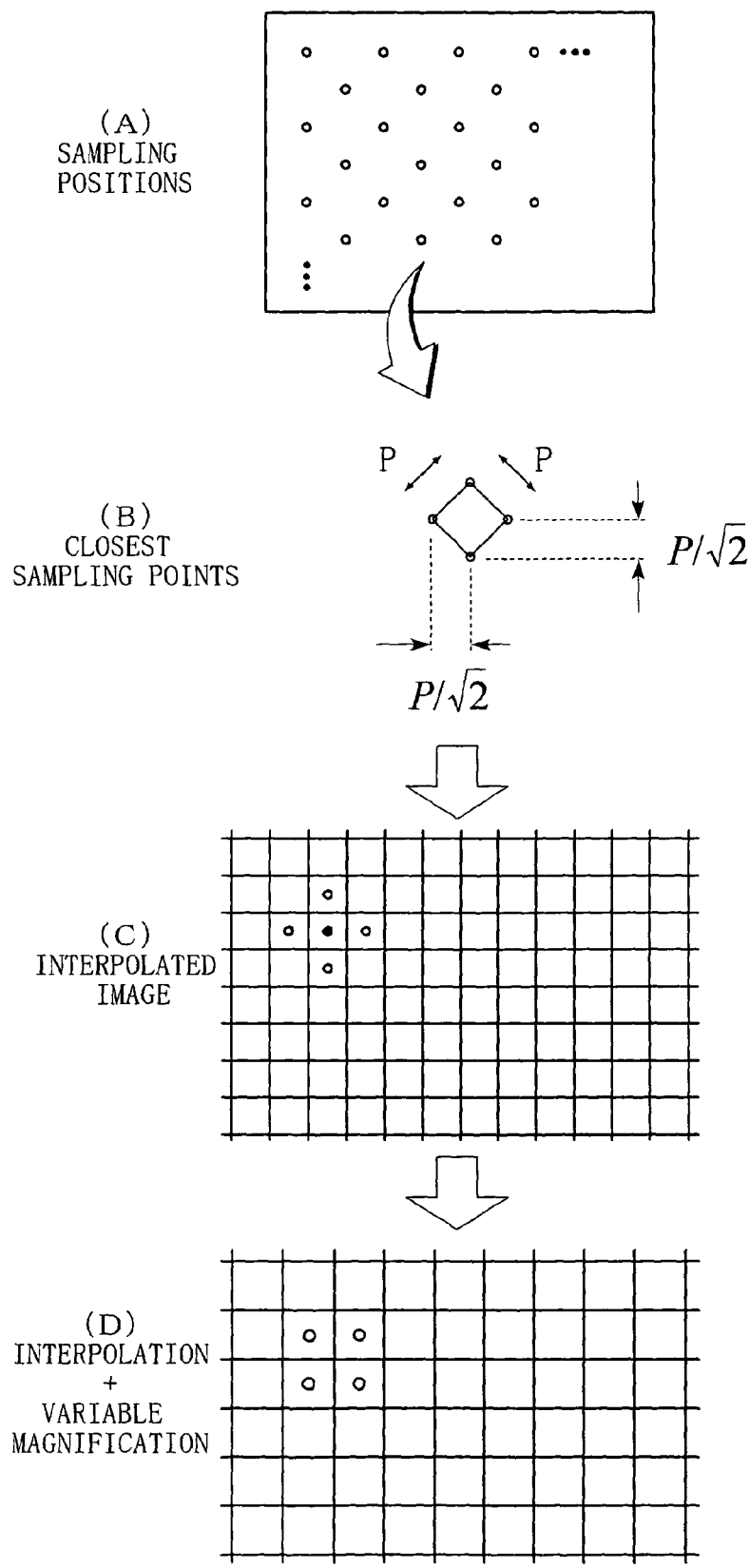
FIG. 36A, FIG. 36B, FIG. 36C, and FIG. 36D are views explaining the operation of a diagonal grid imaging mode in the eighth embodiment.
Figure 38:
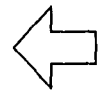
FIG. 38A and FIG. 38B are views showing another examples of the four-color pattern.
Figure 38:
Figure 38:
Figure 39:
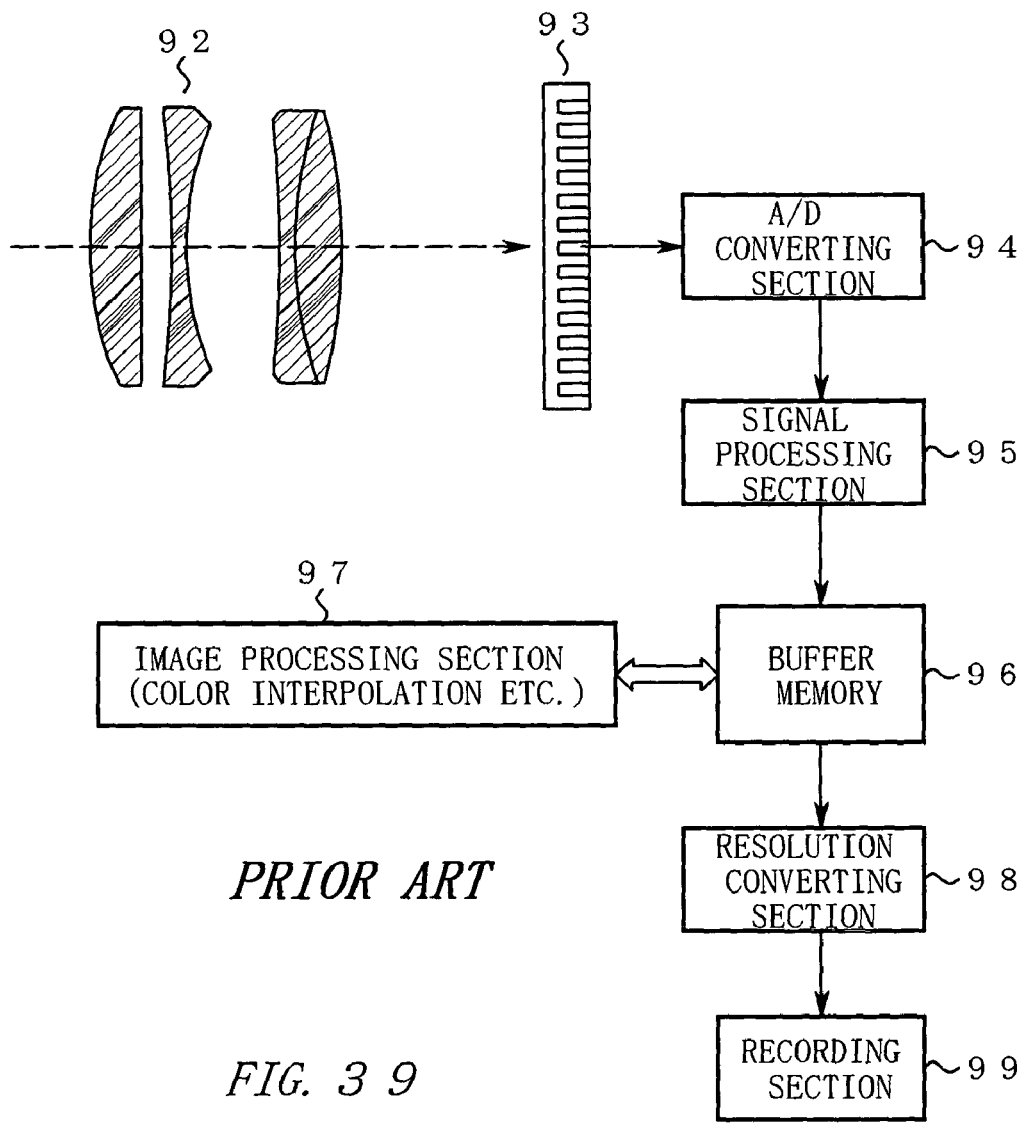
FIG. 39 is a view showing a conventional example.

FIG. 36A is a view showing sampling positions of the monochrome image signals.

FIG. 36B shows closest sampling points of the monochrome image data.

Assuming that the diagonal pitch of photosensors 351 is P, the diagonal distance between the closest sampling points is P. The horizontal distance and the vertical distance between the closest sampling points are as short as about $P/\approx\sqrt{2}$. Therefore, an information amount in the vertical and horizontal directions is large compared with that in a grid pattern having the same number of pixels, so that image data excellent in sharpness in the vertical and horizontal directions can be obtained.

An image processing section 19 interpolates pixels positioned at the centers of the crosspoints of the diagonal grid pattern to the monochrome image data with the diagonal grid pattern.

FIG. 36C is a view showing a pixel pattern after such interpolation. As an interpolation method in this case, an interpolation method of leveling off upper, lower, left, and right pixels may be adopted. Alternatively, an interpolation method of judging local similarity of images and increasing weighting in a similarity direction to take weighted average may be adopted.

Since the number of pixels in the interpolated image shown in FIG. 36C is simply twice as large as the original number of pixels, it is large in image size (the number of vertical and horizontal pixels) unproportionally to the original information amount, though superior in sharpness. Therefore, the image processing section 19 preferably has a mode in which this interpolated image is variably magnified (for example, ¾ multiple vertically and horizontally) to have the number of pixels appropriate for the information amount (for example, the number of pixels approximately equal to the number of sampled pixels) to reduce the image.

FIG. 36D is a view showing a pixel pattern after such a variable magnification process. As such a variable magnification process, it is preferable to use a process in FIG. 36D in which pixel values at the crosspoints are generated through the use of a bi-cubic method, a bi-linear method, a nearest neighbor method, or other interpolation methods. Incidentally, the pixel values at the crosspoints in FIG. 36D may be directly generated by applying any of these interpolation methods to the diagonal grid pattern shown in FIG. 36A.

The monochrome image data having been thus subjected to the variable magnification process are compressedly stored on a memory card 21 by a recording section 20.

Additional Matters of Fifth to Eighth Embodiments

The above embodiments describe the case of using the color filter array in three colors. However, the present invention is not limited to such a color filter array. For instance, a color filter array in which four colors are arranged, examples of which are shown in FIG. 37A and FIG. 37B or FIG. 38A and FIG. 38B, may be used.

The above embodiments describe the same color arranged in the same adding-up unit of the photo signals. However, the present invention is not limited to this arrangement. For example, similarly to color patterns shown in parentheses in FIG. 21 and FIG. 29, different colors (such as a1 and a2) may be allotted to the same adding-up unit of the photo signals. In this case, in a high-definition imaging mode, a larger amount of color information can be obtained, so that delicate color difference can be reproduced in a captured image. The above embodiments describe two photo signals added up to generate a synthesized signal. Therefore, the adding-up in the image sensor is simple, so that the transport sequence of the draft images can be simplified. However, the present invention is not limited to this structure. For example, three photo signals or more may be added to generate a synthesized signal.

The above embodiments describe the photo signals added up on the vertical CCDs 333, 353. However, the present invention is not limited thereto. For example, it may also be configured that the photo signals are added up on the horizontal transport parts.

The above embodiments describe the control circuits 335, 355 incorporated in the image sensors 313, 350. However, the present invention is not limited to this structure. For example, the control circuits 335, 355 may be provided separately from the image sensors 313, 350. In this case, it is also possible for the microprocessor 22 or the like in the electronic camera 11 to take on all or a part of the functions of the control circuits 335, 355.

The above embodiments describe the image sensor of a CCD type. However, the present invention is not limited to this type. For example, the present invention may be applied to an image sensor of an XY address type (such as a CMOS type).

In the embodiments described above (FIG. 21, FIG. 29), the wirings connecting two transport electrodes on the vertical CCD and those on the adjacent vertical CCD actually intersect each other. However, the present invention is not limited to such a wiring pattern in a narrow sense. The "crosswise connection" in the present invention is a term specifying an electrical state of the transport electrodes. Therefore, as long as the electrical state of the transport electrodes satisfies the requirement of the "crosswise connection" recited in claims 8, 9, such a structure is within the range of the present invention, even if the wirings do not apparently intersect each other since the wirings are designed in a roundabout manner or in a winding manner.

Note that in the aforesaid draft images the pixel adding-up causes a low-pass effect. Therefore, pseudo colors and moiré can be effectively suppressed by using the optical LPF only in a single direction having insufficient low pass effect (for example, a direction substantially perpendicular to the pixel adding-up direction). Accordingly, the imaging device of the present embodiment is able to reduce the thickness and the number of the optical LPFs compared with those of conventional products requiring an optical LPF that blurs an image in two directions, achieving reduction in cost of the optical LPF.

Moreover, in the embodiments described above, the directions in which pseudo colors and moiré can be effectively suppressed are substantially the same in the high-definition images and in the draft images. Therefore, this embodiment has an excellent feature that pseudo colors and moiré can be well suppressed in both modes by using a common optical LPF for the draft images and the high-definition images Supplementary Notes Hereinafter, the fifth to eighth embodiments described above will be explained in more general expression.

[1] In a conventional draft mode, thinning-out is performed on pixels in a grid pattern to obtain draft images with the same grid pattern. Consequently, an information amount of the images is simply reduced in vertical and horizontal directions, which results in draft images lacking in sharpness.

The imaging devices in the present embodiments, on the other hand, selectively have the grid imaging mode in which the photo signals generated on the light-receiving surface are sampled in a grid pattern for readout, and the diagonal grid imaging mode in which the photo signals are sampled in a diagonal grid pattern for readout.

Therefore, it is able to select from the two imaging modes one in which the readout image with a smaller number of pixels are obtained, and use it as an imaging mode for the draft images. The number of pixels of the draft images in this case is reduced in the process of reading the images from the light-receiving surface, so that it is possible to read out the images from the light-receiving surface in a short time.

[2] In the conventional draft mode, thinning-out is performed for pixels in a grid pattern to obtain draft images with the same grid pattern. For example, when every other pixel is thinned out in a vertical direction in the conventional example, thinned-out images with the number of pixels being reduced to half can be obtained. In this case, the number of pixels only in a vertical direction is decreased, so that sharpness in the vertical direction and the horizontal direction becomes uneven. Meanwhile, when every other pixel is thinned out in the horizontal direction, thinned-out images whose number of pixels is reduced to half are obtainable. Also in this case, the number of pixels only in the horizontal direction is decreased, so that sharpness in the vertical direction and the horizontal direction becomes uneven. When every other pixels is thinned out in the vertical and horizontal directions, uniform sharpness in the vertical and horizontal directions can be obtained, but the number of pixels is decreased to ¼, so that sharpness of the entire images is deteriorated compared with the thinned-out images whose pixel number is decreased to half.

In the imaging device in these embodiments, on the other hand, the grid pattern is used in one of the imaging modes and the diagonal grid pattern is used in the other imaging mode. Therefore, even when the number of pixels in one mode is, for example, a half of the number of pixels in the other mode, images isotopically superior in sharpness are obtained in both of the imaging modes.

Particularly, when the grid pattern is used in a large pixel number mode and the diagonal grid pattern is used in a small pixel number mode, superior sharpness can be obtained, if only in terms of the vertical direction and the horizontal direction, even in images in the small pixel number mode. This is because line space in the vertical direction or column space in the horizontal direction is narrow in the diagonal grid pattern. Considering a high frequency of vertical lines and horizontal lines in general photographing situations, high sharpness can be obtained in the small pixel number mode.

When the grid pattern is used in the small pixel number mode and the diagonal grid pattern is used in the large pixel number mode, sharpness in the vertical direction and the horizontal direction can be enhanced in the large pixel number mode to an extent higher than the ratio of the number of pixels to that of the small pixel number mode. Considering a high frequency of vertical lines and horizontal lines in general photographing situations, this structure has such an advantage that very high sharpness can be obtained in the large pixel number mode.

The invention is not limited to the above embodiments and various modifications may be made without departing from the spirit and scope of the invention. Any improvement may be made in part or all of the components.

What is claimed is:

1. An imaging device comprising:
a plurality of photosensors included in one image sensor and two-dimensionally arranged on a light-receiving surface, for generating photo signals in accordance with an amount of received light; and
a readout section reading out the generated photo signals, wherein:
the readout section includes a plurality of vertical CCDs provided between arrays of the plurality of photosensors in a vertical direction on the light-receiving surface, for vertically transporting photo signals output from the photosensors;
the plurality of vertical CCDs have two transport electrodes for each of the photosensors, and every two pairs of the transport electrodes for the photosensors have electrically crosswise connection to each other, the photosensors being adjacent to each other in a horizontal direction, and an order of the transport electrodes of each photosensor of the photosensors in an even number array is reverse to an order of the transport electrodes of each immediately horizontally adjacent photosensor of the photosensors in an odd number array;
said readout section selectively has a grid imaging mode in which the generated photo signals on the light-receiving surface are sampled in a grid pattern for readout, and a diagonal grid imaging mode in which the generated photo signals on the light-receiving surface are sampled in a diagonal grid pattern for readout; and
a direction of a grid pattern of sampling points in the grid imaging mode and a direction of a grid pattern of sampling points in the diagonal grid imaging mode are different from each other.

2. The imaging device according to claim 1, wherein:
said plurality of photosensors are arranged in a grid pattern on the light-receiving surface; and
in the diagonal grid imaging mode said readout section adds up the photo signals for readout in each area around a crosspoint of the diagonal grid pattern.

3. The imaging device according to claim 2, further comprising:
an optical low pass filter disposed on the light-receiving surface, for blurring an optical image in a direction substantially perpendicular to an adding-up direction of the photo signals.

4. The imaging device according to claim 2, further comprising:
a color filter array disposed on the light-receiving surface such that the photosensors in each unit of the adding-up substantially have a same color.

5. The imaging device according to claim 2, further comprising:
a color filter array disposed on the light-receiving surface such that the photosensors in each unit of the adding-up have different colors from each other.

6. The imaging device according to claim 1, wherein:
said plurality of photosensors are arranged in a diagonal grid pattern on the light-receiving surface; and
in the grid imaging mode said readout section adds up the photo signals in each area around a crosspoint of the grid pattern for readout.

7. The imaging device according to claim 6, further comprising:
an optical low pass filter disposed on the light-receiving surface, for blurring an optical image in a direction substantially perpendicular to an adding-up direction of the photo signals.

8. The imaging device according to claim 6, further comprising:
a color filter array disposed on the light-receiving surface such that the photosensors in each unit of the adding-up substantially have a same color.

9. The imaging device according to claim 6, further comprising:
a color filter array disposed on the light-receiving surface such that the photosensors in each unit of the adding-up have different colors from each other.

10. An imaging device comprising:
a plurality of photosensors two-dimensionally arranged on a light-receiving surface, for generating photo signals in accordance with an amount of received light;
a plurality of vertical CCDs provided between arrays of said plurality of photosensors in a vertical direction on the light-receiving surface, for vertically transporting the photo signals outputted from said photosensors;

first horizontal transport parts provided at one ends of said vertical CCDs, for horizontally transporting the photo signals outputted from the one ends; and second horizontal transport parts provided at the other ends of said vertical CCDs, for horizontally transporting the photo signals outputted from the other ends, wherein:

said plurality of vertical CCDs have two transport electrodes for each of said photosensors, and every two pairs of the two transport electrodes for the photosensors have electrically crosswise connection to each other, the photosensors being adjacent to each other in a horizontal direction, and an order of the transport electrodes of each photosensor of the photosensors in an even number array is reverse to an order of the transport electrodes of each immediately horizontally adjacent photosensor of the photosensors in an odd number array.

* * * * *